US008675271B2

(12) United States Patent
Jikutani et al.

(10) Patent No.: US 8,675,271 B2
(45) Date of Patent: Mar. 18, 2014

(54) SURFACE-EMITTING LASER ELEMENT, SURFACE-EMITTING LASER ARRAY, OPTICAL SCANNER DEVICE, AND IMAGE FORMING APPARATUS

(75) Inventors: Naoto Jikutani, Miyagi (JP); Kazuhiro Harasaka, Miyagi (JP); Satoru Sugawara, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 519 days.

(21) Appl. No.: 12/983,586

(22) Filed: Jan. 3, 2011

(65) Prior Publication Data
US 2011/0170155 A1 Jul. 14, 2011

(30) Foreign Application Priority Data

Jan. 8, 2010 (JP) ................................. 2010-002541
Jun. 7, 2010 (JP) ................................. 2010-129598

(51) Int. Cl.
*G02B 26/08* (2006.01)
*H01S 5/00* (2006.01)

(52) U.S. Cl.
USPC .................................. 359/204.1; 372/50.124

(58) Field of Classification Search
USPC .............. 359/204.2, 204.4; 372/45.01, 46.01, 372/46.011, 50.12, 50.124
See application file for complete search history.

(56) References Cited

U.S. PATENT DOCUMENTS

| 6,207,973 | B1 | 3/2001 | Sato et al. |
| 6,542,528 | B1 | 4/2003 | Sato et al. |
| 6,614,821 | B1 | 9/2003 | Jikutani et al. |
| 6,650,683 | B2 | 11/2003 | Ueki et al. |
| 6,657,233 | B2 | 12/2003 | Sato et al. |
| 6,674,785 | B2 | 1/2004 | Sato et al. |
| 6,765,232 | B2 | 7/2004 | Takahashi et al. |
| 6,829,271 | B2 | 12/2004 | Sato et al. |
| 6,959,025 | B2 | 10/2005 | Jikutani et al. |
| 6,974,974 | B2 | 12/2005 | Sato et al. |
| 6,975,663 | B2 | 12/2005 | Sekiya et al. |
| 6,983,004 | B2 | 1/2006 | Jikutani et al. |

(Continued)

FOREIGN PATENT DOCUMENTS

| CN | 1405938 A | 3/2003 |
| CN | 101604819 A | 12/2009 |

(Continued)

OTHER PUBLICATIONS

Choquette, K.D. et al (1994), "Low threshold voltage vertical-cavity lasers fabricated by selective oxidation", Electronics Letters, vol. 30, No. 24, pp. 2043-2044.

(Continued)

*Primary Examiner* — Frank Font
(74) *Attorney, Agent, or Firm* — Cooper & Dunham LLP

(57) ABSTRACT

A disclosed surface-emitting laser element includes an emission region configured to emit a laser beam and a high reflectance region including a first dielectric film having a first refractive index and a second dielectric film having a second refractive index differing from the first refractive index where the first dielectric film and the second dielectric film are stacked within the emission region to provide high reflectance. In the surface-emitting laser element, the high reflectance region is formed in a region including a central portion of the emission region and is configured to include shape anisotropy in two orthogonal directions in a plane in parallel with the emission region.

18 Claims, 48 Drawing Sheets

(56) References Cited

U.S. PATENT DOCUMENTS

| | | | |
|---|---|---|---|
| 7,022,539 B2 | 4/2006 | Sato et al. | |
| 7,067,846 B2 | 6/2006 | Takahashi et al. | |
| 7,139,297 B2 | 11/2006 | Jikutani et al. | |
| 7,180,100 B2 | 2/2007 | Takahashi et al. | |
| 7,218,432 B2 * | 5/2007 | Ichii et al. | 359/204.4 |
| 7,245,647 B2 | 7/2007 | Jikutani et al. | |
| 7,466,738 B2 | 12/2008 | Jikutani | |
| 7,526,008 B2 * | 4/2009 | Shiozaki | 372/43.01 |
| 7,542,499 B2 | 6/2009 | Jikutani | |
| 7,561,318 B2 * | 7/2009 | Nakajima | 359/204.1 |
| 7,684,458 B2 | 3/2010 | Sato et al. | |
| 7,693,204 B2 | 4/2010 | Sato et al. | |
| 7,720,125 B2 | 5/2010 | Jikutani et al. | |
| 7,746,912 B2 | 6/2010 | Motomura et al. | |
| 8,077,752 B2 * | 12/2011 | Maeda et al. | 372/45.01 |
| 8,385,381 B2 * | 2/2013 | Maeda et al. | 372/50.124 |
| 8,483,254 B2 * | 7/2013 | Harasaka et al. | 372/50.124 |
| 2002/0172247 A1 | 11/2002 | Sopra et al. | |
| 2003/0063642 A1 | 4/2003 | Aggerstam et al. | |
| 2005/0111507 A1 * | 5/2005 | Ueki et al. | 372/50 |
| 2005/0185688 A1 * | 8/2005 | Nakayama et al. | 372/46.013 |
| 2007/0014324 A1 | 1/2007 | Maeda et al. | |
| 2008/0233017 A1 | 9/2008 | Sato et al. | |
| 2009/0074437 A1 * | 3/2009 | Tanabe et al. | 399/51 |
| 2009/0129417 A1 | 5/2009 | Maeda et al. | |
| 2009/0180506 A1 | 7/2009 | Maeda et al. | |
| 2009/0285252 A1 | 11/2009 | Ishii et al. | |
| 2009/0285602 A1 | 11/2009 | Harasaka et al. | |
| 2009/0295900 A1 * | 12/2009 | Ichii | 347/129 |
| 2009/0310632 A1 | 12/2009 | Sugawara et al. | |
| 2010/0247100 A1 | 9/2010 | Lin et al. | |
| 2011/0115872 A1 | 5/2011 | Harasaka et al. | |
| 2011/0194579 A1 | 8/2011 | Maeda et al. | |

FOREIGN PATENT DOCUMENTS

| | | |
|---|---|---|
| EP | 2323231 A1 | 5/2011 |
| JP | 11-48520 | 2/1999 |
| JP | 2001-156395 | 6/2001 |
| JP | 2002-208755 | 7/2002 |
| JP | 2004-289033 | 10/2004 |
| JP | 2005-340779 | 12/2005 |
| JP | 3955925 | 5/2007 |
| JP | 2007-201398 | 8/2007 |
| JP | 2008-16824 | 1/2008 |
| JP | 2009-164466 | 7/2009 |
| JP | 2009-188382 | 8/2009 |
| JP | 2009-302512 | 12/2009 |
| JP | 2009-302513 | 12/2009 |
| JP | 2010-21522 | 1/2010 |
| JP | 2010-153768 | 7/2010 |
| WO | WO98/53537 | 11/1998 |

OTHER PUBLICATIONS

Choquette, K.D. et al (1995), "Cavity characteristics of selectively oxidized vertical-cavity lasers", Applied Physics Letters, vol. 66, No. 25, pp. 3413-3415.

Nakayama, Hideo et al. (2004), "780nm VCELs for Home Networks and Printers", Electronic Components and Technology Proceedings, 54$^{th}$, vol. 2, pp. 1371-1375.

Mar. 19, 2012 Chinese official action in connection with a counterpart Chinese patent application, CN 1405938 A.

* cited by examiner

FIG.4
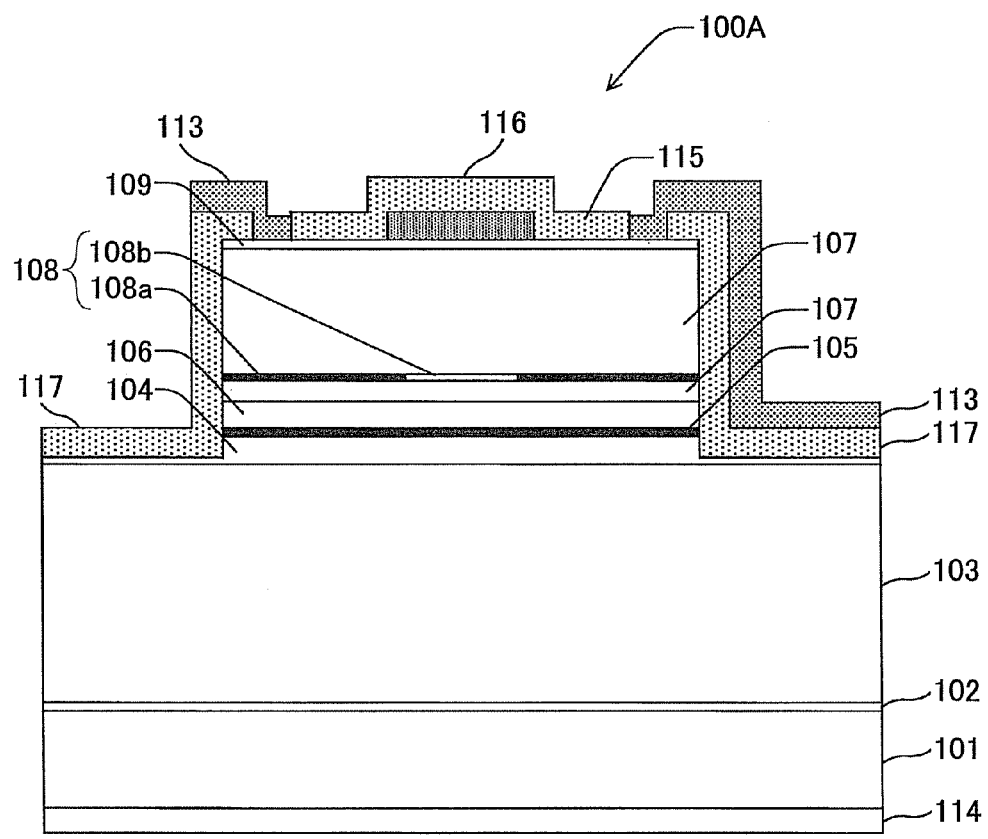
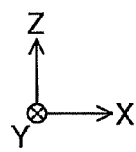

FIG.11
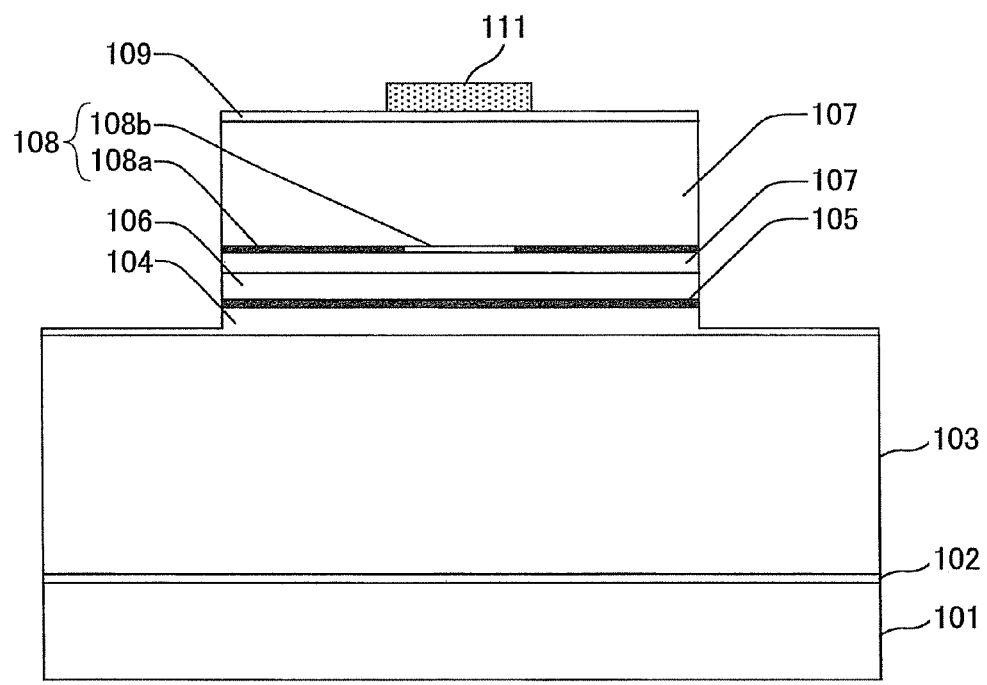
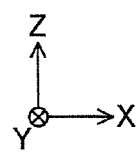

FIG.15
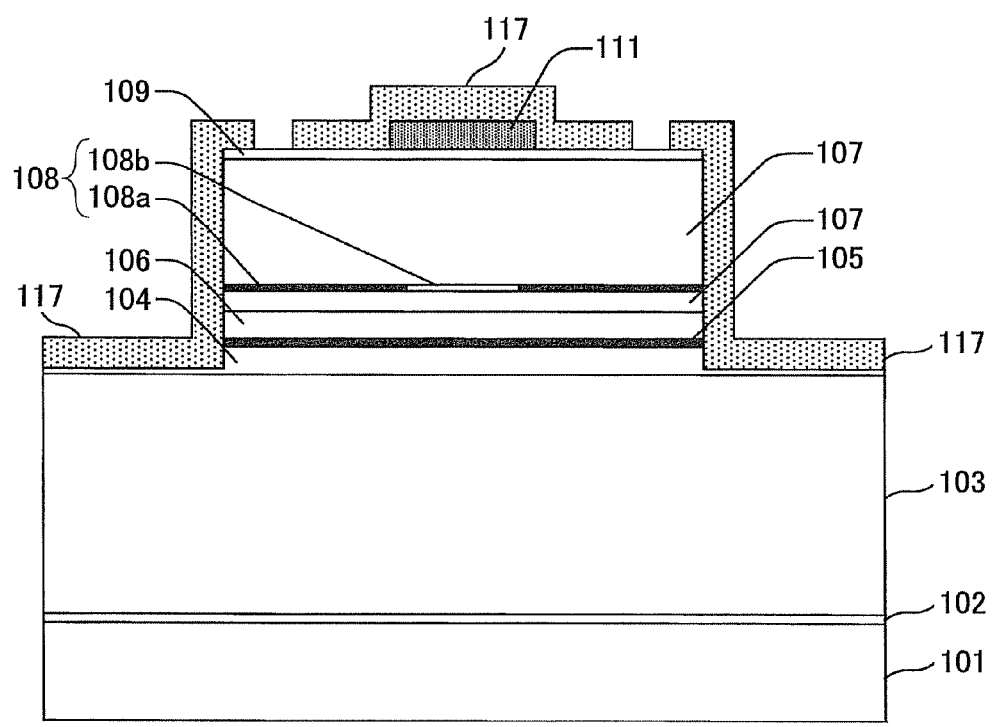
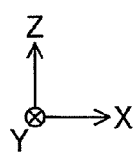

FIG.17
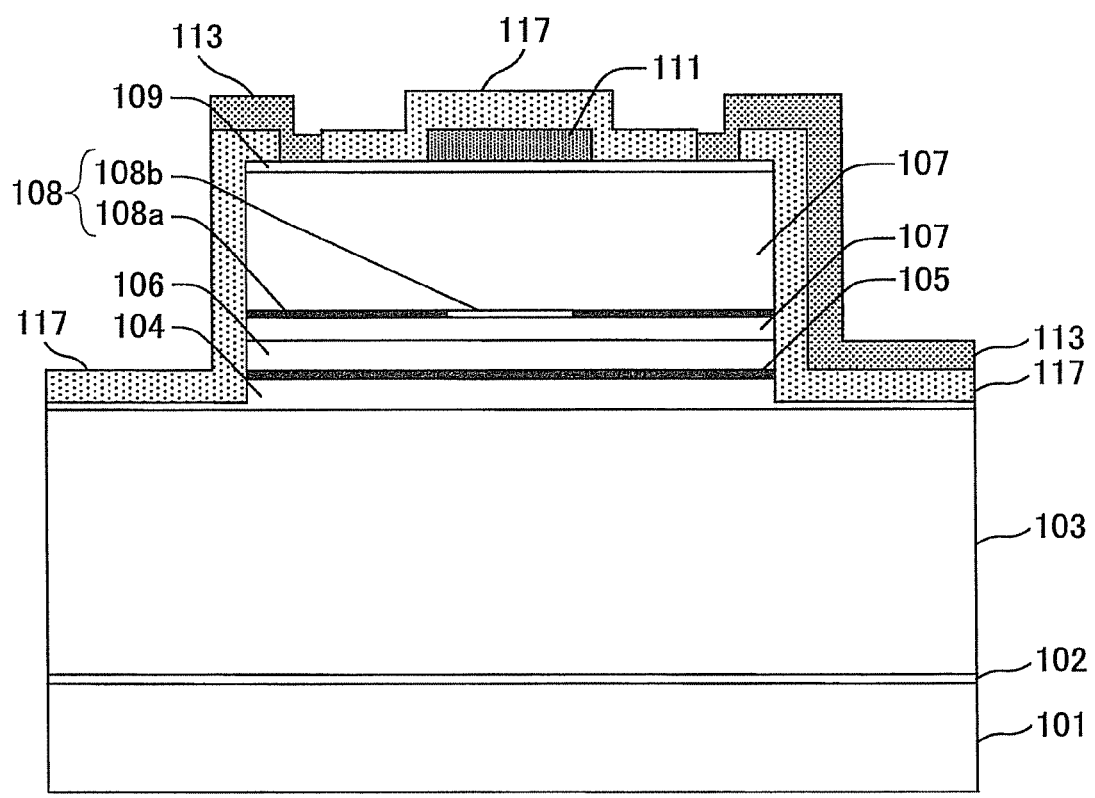
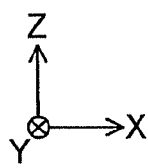

FIG.21
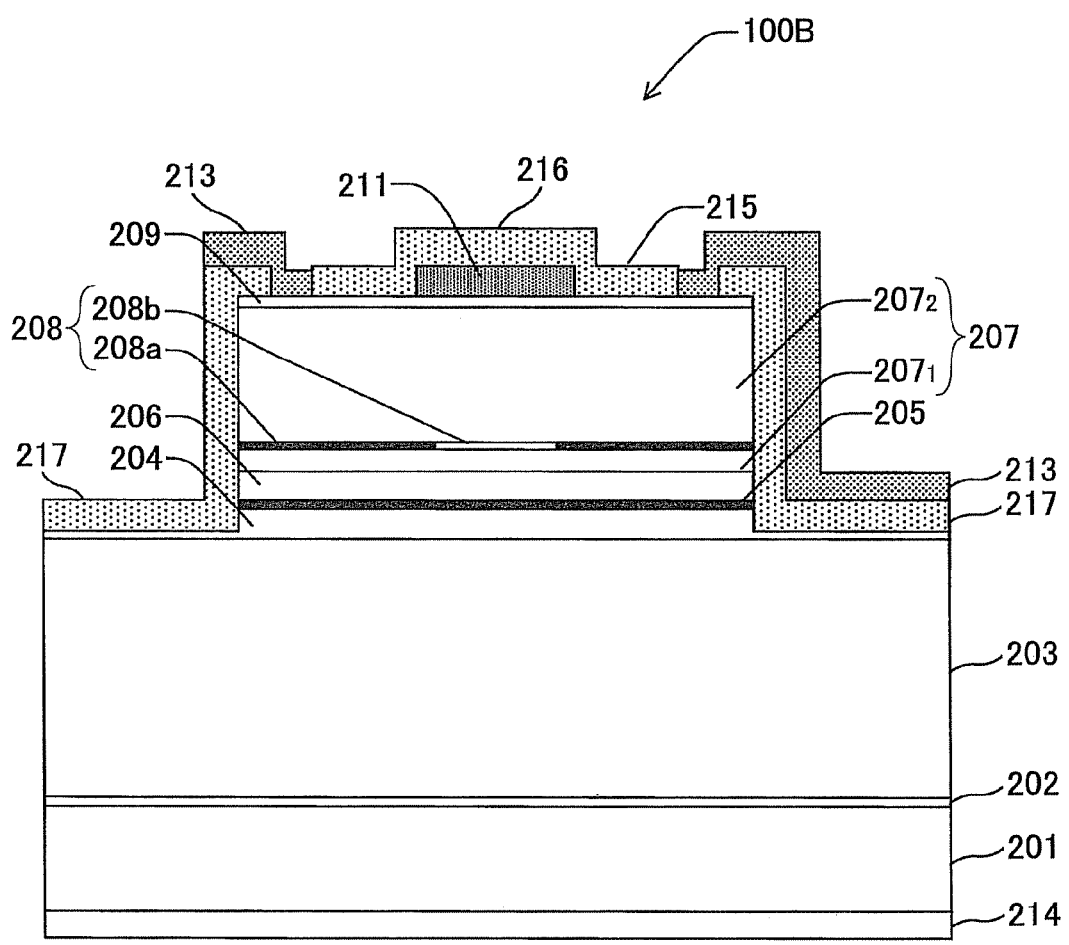
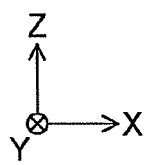

MESA — EMISSION REGION

SURFACE-EMITTING LASER ELEMENT, SURFACE-EMITTING LASER ARRAY, OPTICAL SCANNER DEVICE, AND IMAGE FORMING APPARATUS

BACKGROUND OF THE INVENTION

1. Field of the Invention

The invention generally relates to surface-emitting laser elements, surface-emitting laser arrays, optical scanner devices and image forming apparatuses, and more particularly to a surface-emitting laser element capable of emitting a laser beam in a direction perpendicular to a substrate, a surface-emitting laser array including therein plural of such surface-emitting laser elements, an optical scanner device having such a surface-emitting laser array, and an image forming apparatus having such an optical scanner device.

2. Description of the Related Art

Numerous studies have been carried out on a surface-emitting laser element (i.e., a surface-emitting semiconductor laser element) capable of causing laser oscillation in a direction perpendicular to a substrate. The surface-emitting laser element includes a low threshold current for oscillation to emit a laser beam having a high-quality circular outgoing beam shape compared to an edge emitting semiconductor element. In addition, since the surface-emitting laser element is capable of emitting a laser beam in a direction perpendicular to a substrate, it is easy to integrate laser beams two dimensionally with high density. Accordingly, applications of the surface-emitting laser elements to a light source for a parallel optical interconnection or a high-speed and high accuracy electrophotographic system have been examined.

The surface-emitting laser element generally includes a constricting structure to enhance current entry efficiency. Such a constricting structure is an Al (aluminum) selective oxide constricting structure (hereinafter also called an "oxide constricting structure" for convenience). Examples of the oxide constricting structure are disclosed in Applied Physics Letters, vol. 66, No. 25, pp. 3413-3415, 1995 (K. D. Choquette, K. L. Lear, R. P. Schneider, Jr., K. M. Geib, "Cavity characteristics of selectively oxidized vertical-cavity lasers", Applied Physics Letters, vol. 66, No. 25, pp. 3413-3415, 1995: also referred to as "Non-Patent Document 1"), and Electronics Letters, No. 24, Vol. 30, pp. 2043-2044, 1994 (K. D. Choquette, R. P. Schneider, Jr., K. L. Lear, K. M. Geib, "Low threshold voltage vertical-cavity lasers fabricated by selective oxidation", Electronics Letters, No. 24, Vol. 30, pp. 2043-2044, 1994: also referred to as "Non-patent Document 2").

Further, a laser printer introducing 780 nm VCSEL arrays (surface-emitting laser arrays) is disclosed in Electronic Components and Technology Conference Proceedings, Vol. 2, 2004, pp. 1371-1375 (H. Nakayama, T. Nakamura, M. Funada, Y. Ohashi, M. Kato, "780 nm VCSELs for Home Networks and Printers", Electronic Components and Technology Conference Proceedings, 54$^{th}$, Vol. 2, June, 2004, pp. 1371-1375: also referred to as "Non-Patent Document 3").

Japanese Patent Application Publication No. 11-48520 (hereinafter referred to as "Patent Document 1") discloses an image forming apparatus having a multi-beam light source.

In applying surface-emitting laser elements to image forming apparatuses such as printers, a small spot size of a beam is preferable to converge on a photoreceptor. Further, since the reflectance and the transmittance of an optical system are polarization-dependent, polarization of a beam may need to be aligned in a specific direction in order to prevent change in laser intensity on the photoreceptor. Moreover, high laser output power may be preferable in carrying out fast writing (recording). That is, in the application of the surface-emitting laser elements to the image forming apparatus, it may be necessary to acquire high output power in a single basic transverse mode (i.e., single mode) operation, and align the polarization direction of a beam in specific direction. Note that in other applications of the surface-emitting laser elements, it is preferable that high single mode output power be obtained and the polarization direction be aligned in a specific direction. Thus, extensive studies have been carried out on the enhancement of single mode output and stabilizing the polarization of a beam.

Japanese Patent Application Publication No. 2001-156395 (hereinafter referred to as "Patent Document 2") discloses a surface emission semiconductor laser element in which a layer structure of a semiconductor material is formed on a substrate. The layer structure of the semiconductor material includes upper and lower reflector layer structures and an emission layer sandwiched between the upper and lower reflector layer structures. An opening located above the upper reflector layer structure is coated with upper electrode layers having a circular plan view, that are transparent for the oscillation wavelength of laser light.

Japanese Patent No. 3955925 (hereinafter referred to as "Patent Document 3") discloses a vertical cavity surface emitting laser device having an opening portion and a semiconductor discontinuity portion formed within the body of the device at a position distant from an edge of the opening portion. The semiconductor discontinuity portion is formed of a slit that is filled with a material differing from the semiconductor material, and a side wall of the semiconductor discontinuity portion has an opening of the slit formed such that the side wall is extended in a desirable direction of polarization of laser light emitted from the laser device that is substantially aligned with a boundary of the discontinuity portion.

Further, Japanese Patent Application Publication No. 2007-201398 (hereinafter referred to as "Patent Document 4") discloses a surface-emitting semiconductor laser element that includes a substrate, a first multilayer reflection film on the substrate, an active layer having a light emitting central region formed on the first multilayer reflection film, a second multilayer reflection film formed on the active layer having the light emitting central region, and a laser transverse mode adjusting layer formed on the second multilayer reflection film. At least one of the first multilayer reflection film and the second multilayer reflection film includes a quadrilateral current injection region having its intersection of diagonal lines disposed at the light emitting central region of the active layer, and the second multilayer reflection film includes a light emitting window provided in a region corresponding to one of the diagonal lines of the current injection region, and a pair of grooves located at both sides of the light emitting window. The laser transverse mode adjusting layer is provided corresponding to the light emitting window and having a peripheral region excluding the central region of the light emitting window having a reflection factor lower than that of a region of the light emitting window corresponding to the light emitting central region of the active layer.

Japanese Patent Application Publication No. 2004-289033 (hereinafter referred to as "Patent Document 5") discloses a surface-emitting semiconductor laser element that includes a first multilayer reflection film, an active layer formed on the first multilayer reflection film, and a second multilayer reflection film formed on the active layer. At least one layer of the first multilayer reflection film and the second multilayer reflection film includes a first region disposed at least at the part of a region corresponding to a part of the active layer, and having a thickness of substantially λ/4n (λ: oscillation wavelength, n: refractive index) and a second region disposed on a region excluding the first region and having a thickness of substantially excepting λ/4n.

However, although the vertical cavity surface emitting laser device disclosed in Patent Document 3 is capable of regulating the polarization direction, it may be difficult to suppress the oscillation of the high-order transverse mode of a laser beam due to a change in a laser light confinement effect in a transverse direction based on depths of grooves.

Further, in the surface-emitting semiconductor laser element disclosed in Patent Document 4, if the gap between the grooves is made narrower than the current confined region for regulating the polarization direction, a current passage region may be substantially reduced (narrowed). This has increased electric resistance or electric current density, thereby reducing the life-span of the laser element.

Moreover, in the surface-emitting semiconductor laser element disclosed in Patent Document 5, the growth of the crystal is temporarily stopped after allowing the crystal to grow up to a layer adjacent to the active layer. The crystals are then allowed to grow again after patterning of the resist and etching of the film are carried out. In this case, when the crystal growth is initiated again, the etched surface of the film may affect the crystal growth, which has brought variability in the characteristics of the laser element or in the control characteristics of the transverse mode of a laser beam. Thus, the laser element may not be suitable for mass production.

Applicants of the present application have conducted various experiments to examine the control of a high-order oscillation transverse mode of a laser beam and the regulation of a polarization direction of a laser beam in a desirable direction, and have found that a polarization mode suppression ratio PMSR may be lowered, in comparison to a case where the reflectance within the emission region is uniform, if a circular low reflectance portion is provided within the emission region as disclosed in the surface-emitting semiconductor laser element disclosed in Patent Document 2. Note that the polarization mode suppression ratio PMSR is a ratio of light intensity of a desired polarization direction of laser light to light intensity of a direction perpendicular to the desired polarization direction of laser light.

Even if the surface-emitting laser element is capable of controlling the polarization direction in one direction based on the gain anisotropy of the active layer obtained by providing the slanted substrate, the polarization direction may become unstable by providing the circular low reflectance portion in the emission region.

SUMMARY OF THE INVENTION

It is a general object of at least one embodiment of the present invention to provide a surface-emitting laser element, a surface-emitting laser array, an optical scanner device and an image forming apparatus that substantially obviate one or more problems caused by the limitations and disadvantages of the related art.

In one embodiment, there is provided a surface-emitting laser element that includes an emission region configured to emit a laser beam; and a high reflectance region including a first dielectric film having a first refractive index and a second dielectric film having a second refractive index differing from the first refractive index, the first dielectric film and the second dielectric film being stacked within the emission region to provide a high reflectance. In the surface-emitting laser element, the high reflectance region is formed in a region including a central portion of the emission region and is configured to include shape anisotropy in two orthogonal directions in a plane in parallel with the emission region.

In another embodiment, there is provided a surface-emitting laser array that includes a plurality of surface-emitting laser elements integrated therein.

In another embodiment, there is provided an optical scanner device optically scanning a scanning surface with light. The optical scanner device includes a light source including a surface-emitting laser element; a deflector configured to deflect the light emitted from the light source; and a scanning optical system configured to converge the light deflected by the deflector onto the scanning surface.

In another embodiment, there is provided an optical scanner device optically scanning a scanning surface with light. The optical scanner device includes a light source including a surface-emitting laser array; a deflector configured to deflect the light emitted from the light source; and a scanning optical system configured to converge the light deflected by the deflector onto the scanning surface.

In another embodiment, there is provided an image forming apparatus that includes at least one image carrying member; and an optical scanner device configured to scan light modulated based on image information on the image carrying member.

BRIEF DESCRIPTION OF THE DRAWINGS

Other objects and further features of embodiments will be apparent from the following detailed description when read in conjunction with the accompanying drawings, in which:

FIG. 4 is a cross-sectional diagram of the surface-emitting laser element 100A illustrated in FIG. 3 cut along a line A-A;

FIG. 11 is a fifth example diagram illustrating the method for fabricating the surface-emitting laser element 100A;

FIG. 15 is a seventh example diagram illustrating the method for fabricating the surface-emitting laser element 100A;

FIG. 17 is an eighth example diagram illustrating the method for fabricating the surface-emitting laser element 100A;

FIG. 21 is a diagram illustrating a surface-emitting laser element 100B;

DESCRIPTION OF THE PREFERRED EMBODIMENTS

Figure 1:
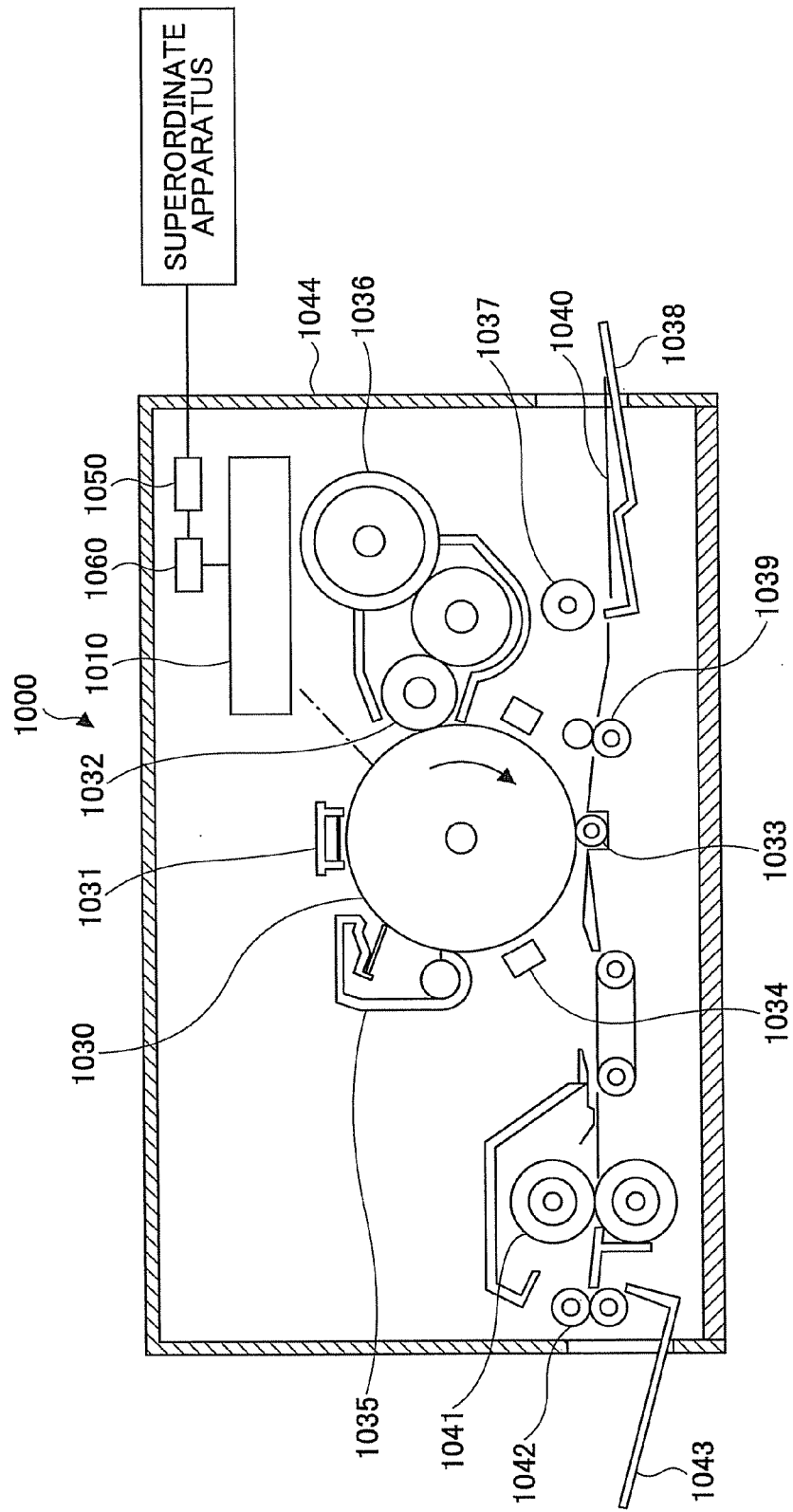
FIG. 1 is a schematic configuration diagram illustrating a laser printer according to an embodiment.

In the following, preferred embodiments will be described with reference to FIGS. 1 through 43. FIG. 1 is a schematic configuration diagram illustrating a laser printer 1000 according to an embodiment.

The laser printer 1000 includes an optical scanner device 1010, a photoreceptor drum 1030, an electrostatic charger 1031, a developing roller 1032, a transfer charger 1033, a static eliminator unit 1034, a cleaning unit 1035, a toner cartridge 1036, a paper feeding roller 1037, a paper feeding tray 1038, a resist roller pair 1039, a fixing roller 1041, a discharge roller 1042, a discharge tray 1043, a communication controller 1050, and a printer controller 1060 that overall controls these components of the laser printer 1000. Note that the above components are arranged in corresponding predetermined positions inside a printer case 1044.

The communications controller 1050 controls bidirectional communication with superordinate apparatuses such as personal computers via the network.

The photoreceptor drum 1030 is made of a cylindrical member having a photosensitive layer formed on its surface. That is, the surface of the photoreceptor drum 1030 is subject to scanning. The photoreceptor drum 1030 is configured to rotate in a direction indicated by an arrow in FIG. 1.

The electrostatic charger 1031, the developing roller 1032, the transfer charger 1033, the static eliminator unit 1034, and the cleaning unit 1035 are arranged near the surface of the photoreceptor drum 1030. More specifically, the electrostatic charger 1031, the developing roller 1032, the transfer charger 1033, the static eliminator unit 1034, and the cleaning unit 1035 are arranged in this order near the surface of the photoreceptor drum 1030 along a rotational direction of the photoreceptor drum 1030.

The electrostatic charger 1031 is configured to uniformly charge the surface of the photoreceptor drum 1030.

The optical scanner device 1010 scans the surface of the photoreceptor 1030 electrostatically charged by the electrostatic charger 1031 with luminous flux modulated based on image information acquired from the superordinate apparatuses to form a latent image corresponding to the acquired image information on the surface of the photoreceptor drum 1030. The latent image formed on the surface of the photoreceptor drum 1030 travels with the rotation of the photoreceptor drum 1030 in a direction toward the developing roller 1032. Note that a configuration of the optical scanner device 1010 is described later.

The toner cartridge 1036 contains toner, which is supplied to the developing roller 1032.

The developing roller 1032 applies the toner supplied from the toner cartridge 1036 to the latent image formed on the surface of the photoreceptor drum 1030 to make the latent image visible. Note that the latent image with the toner applied (hereinafter also called a "toner image" for convenience) travels with the rotation of the photoreceptor 1030 in a direction toward the transfer charger 1033.

The paper feeding tray 1038 contains sheets of recording paper 1040. The paper feeding roller 1037 is arranged near the paper feeding tray 1038 to pick one sheet of a recording paper 1040 from the paper feeding tray 1038 and then transfer the picked recording sheet 1040 to the resist roller pair 1039. The resist roller pair 1039 temporarily holds the recording sheet 1040 picked by the paper feeding roller 1037 and transfers it into a gap between the photoreceptor drum 1030 and the transfer charger 1033 with the rotation of the photoreceptor drum 1030.

The transfer charger 1033 has applied a voltage having a polarity opposite to the polarity of the toner such that the toner applied on the surface of the photoreceptor drum 1030 is electrically attracted by the recording sheet 1040. The toner image on the surface of the photoreceptor drum 1030 is thus transferred to the recording sheet 1040. The recording sheet 1040 having the transferred toner image is transferred to the fixing roller 1041.

The fixing roller 1041 applies heat and pressure to the recording sheet 1040 such that the toner image is fixed on the recording sheet 1040. The recording sheet 1040 having the fixed toner image is transferred to the paper receiving tray 1043 via the discharge roller 1042 and sequentially stacked on the paper receiving tray 1043.

The static eliminator unit 1034 is configured to neutralize (discharge) the surface of the photoreceptor drum 1030.

The cleaning unit 1035 is configured to remove remaining toner from the surface of the photoreceptor drum 1030. The position of the surface of the photoreceptor drum 1030 from which the remaining toner is removed returns to a position that faces the electrostatic charger 1031.

Next, the configuration of the optical scanner device 1010 is described.

Figure 2:
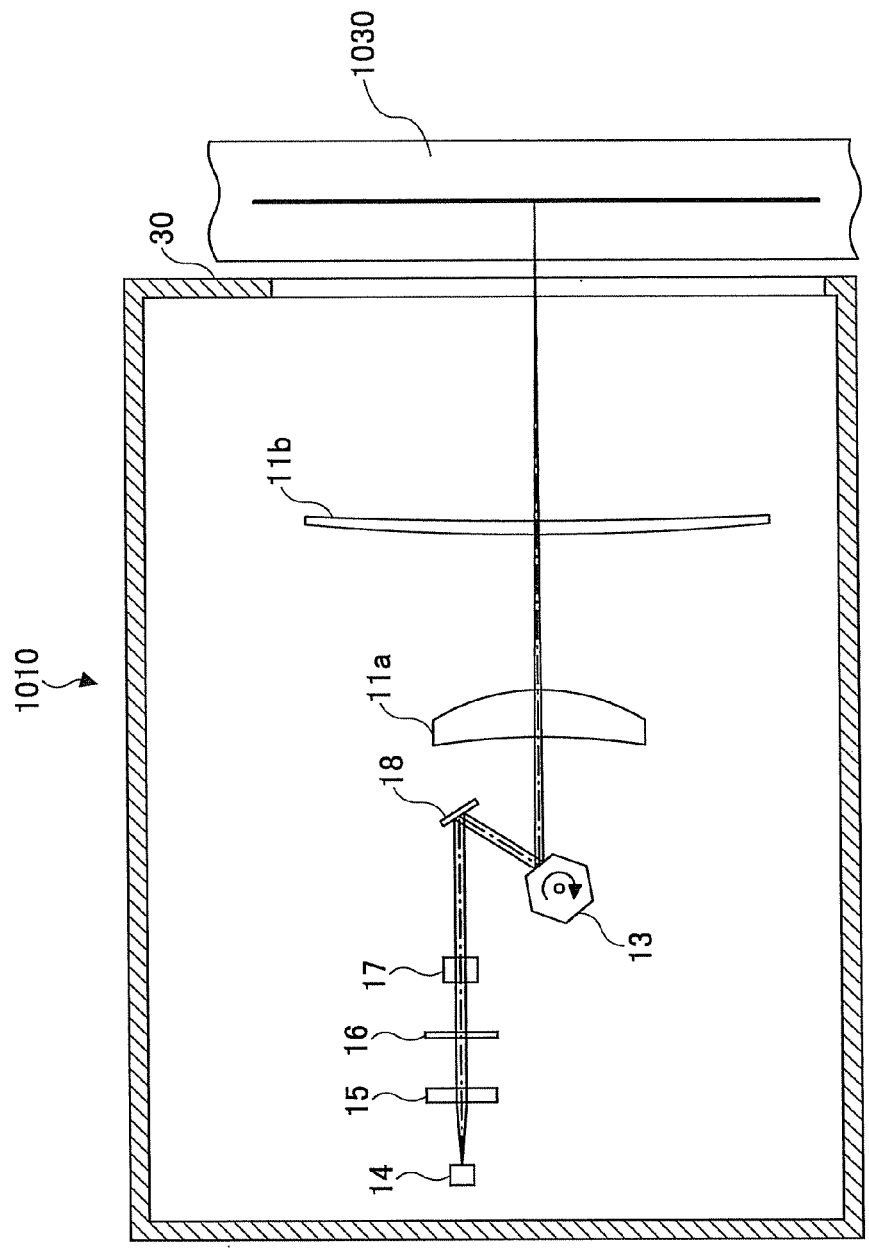
FIG. 2 is a schematic diagram illustrating an optical scanner device provided in the laser printer in FIG. 1.

As illustrated in FIG. 2, the optical scanner device 1010 includes a deflector-side scanning lens 11a, an image surface-side scanning lens 11b, a polygon mirror 13, a light source 14, a coupling lens 15, an aperture plate 16, a cylindrical lens 17, a reflecting mirror 18, and a scanning controller (not shown). These components of the optical scanner device 1010 are arranged in corresponding predetermined positions inside an optical housing 30.

Note that a direction corresponding to a main-scanning direction is hereinafter called a "corresponding main-scanning direction", and a direction corresponding to a sub-scanning direction is called a "corresponding sub-scanning direction" for convenience.

Further, the coupling lens 15 is provided to convert the luminous flux emitted from the light source 14 into approximately parallel light.

The aperture plate 16 having an aperture is provided to regulate a beam diameter of the luminous flux received via the coupling lens 15.

A cylindrical lens 17 is provided to form an image near a deflection reflecting surface in the corresponding sub-scanning direction with the luminous flux passing through the aperture of the aperture plate 16.

Further, an optical system provided in an optical path between the light source 14 and the polygon mirror 13 may also be called a deflector-side optical system. The deflector-side optical system according to the embodiment includes the coupling lens 15, the aperture plate 16, the cylindrical lens 17, and a reflecting mirror 18.

An example of the polygon mirror 13 has a hexahedral mirror having an inscribed circle with a radius of 18 mm, and respective portions of the hexahedral mirror function as the deflection reflecting surfaces. The polygon mirror 13 rotates at a constant velocity around a shaft arranged in parallel with the corresponding sub-scanning direction to deflect the luminous flux reflected from the reflecting mirror 18.

The deflector-side scanning lens 11a is arranged in an optical path of the luminous flux deflected by the polygon mirror 13.

The image surface-side scanning lens 11b is arranged in the optical path of the luminous flux via the deflector-side scanning lens 11a. The luminous flux via the image surface-side scanning lens 11b is applied on the surface of the photoreceptor drum 1030 to form an optical spot. The optical spot travels with the rotation of the polygon mirror 13 in a longitudinal direction of the photoreceptor drum 1030. That is, the optical spot scans the surface of the photoreceptor drum 1030. The scanning direction of the optical spot is a "main-scanning direction". Further, the rotational direction of the photoreceptor drum 1030 is a "sub-scanning direction".

An optical system provided in an optical path between the polygon mirror 13 and the photoreceptor drum 1030 may also be called a "scanning optical system". The scanning optical system in this embodiment includes the deflector-side scanning lens 11a and the image surface-side scanning lens 11b. Note that at least one folded mirror may be arranged in at least one of the optical path between the deflector-side scanning lens 11a and the image surface-side scanning lens 11b and the optical path between the image surface-side scanning lens 11b and the photoreceptor drum 1030.

The light source 14 may include a vertical-cavity surface-emitting laser (VCSEL) element capable of emitting a laser beam in a direction perpendicular to the substrate. Examples of such a surface-emitting laser element may include various configurations and structures; however, three embodiments, namely, a first embodiment, a second embodiment, a third embodiment are described in this specification.

In an XYZ three-dimensional orthogonal coordinate system, a Z-axis direction is defined as a laser oscillation direction, and X-axis and Y-axis directions are defined as two mutually orthogonal directions in a plane perpendicular to the Z-axis direction. Further, a refractive index of a dielectric is defined as a refractive index for light having an oscillation wavelength.

[Surface-Emitting Laser Element 100a According to First Embodiment]

Figure 3:
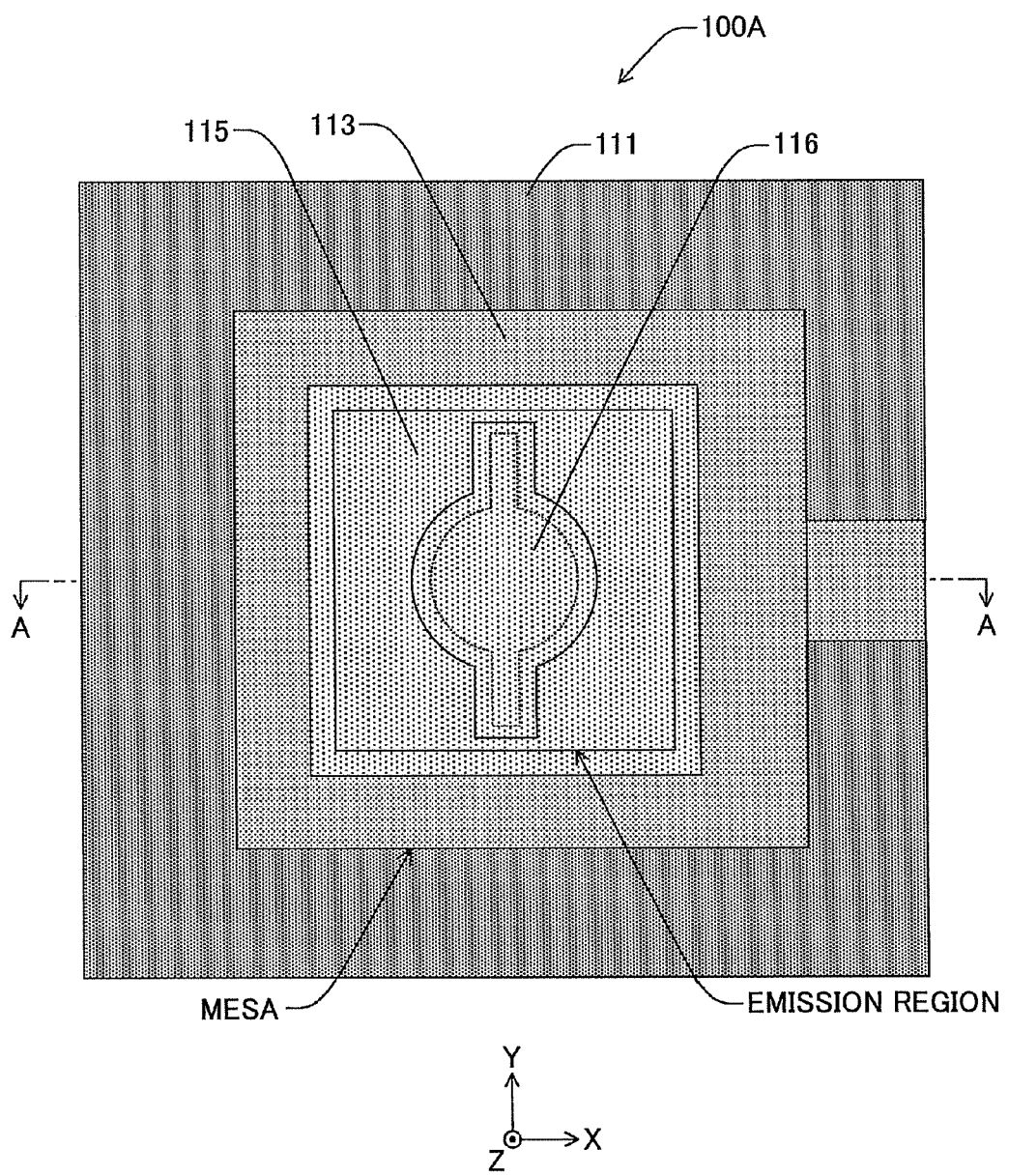
FIG. 3 is a diagram illustrating a surface-emitting laser element 100A.

A surface-emitting laser element 100A has an oscillation wavelength band of 780 nm. As illustrated in FIGS. 3 and 4, the surface-emitting laser element 100A is configured to include a substrate 101, a buffer layer 102, a lower semiconductor DBR 103, a lower spacer layer 104, an active layer 105, an upper spacer layer 106, an upper semiconductor DBR 107, a contact layer 109, and a p-side electrode 113, an n-side electrode 114, and a first mode filter 115 and a second mode filter 116. Note that FIG. 4 is a cross-sectional diagram of the surface-emitting laser element 100A illustrated in FIG. 3 cut along the line A-A.

The substrate 101 is a single crystal n-GaAs substrate.

As illustrated in FIG. 4, the buffer layer 102 is formed of an n-GaAs layer and stacked on a surface of the substrate 101 in a +Z direction.

The lower semiconductor DBR 103 is stacked on a surface of the buffer layer 102 in the +Z direction. The lower semiconductor DBR 103 has 40.5 pairs of refractive index layers each having a low refractive index layer made of an n-$Al_{0.9}Ga_{0.1}$As and a high refractive index layer made of an n-$Al_{0.3}Ga_{0.7}As$. A composition gradient layer having a thickness of 20 nm is provided between the low refractive index layer and the high refractive index layer for reducing electric resistance. The composition gradient layer has a gradual compositional change from one composition to the other. Each of the low refractive index layer and the high refractive index layer is arranged such that it includes half of the adjacent composition gradient layer and an optical thickness of $\lambda/4$ based on the oscillation wavelength of $\lambda$. Note that if the optical thickness is $\lambda/4$, the actual thickness D of the corresponding layer is $D=\lambda/4n$ where n represents a refractive index of a medium of that layer.

The lower spacer layer 104 is stacked on a surface of the lower semiconductor DBR 103 in the +Z direction. The lower spacer layer 104 is formed of a non-doped layer made of $Al_{0.6}Ga_{0.4}As$.

The active layer 105 is stacked on a surface of the lower spacer layer 104 in the +Z direction and has an $Al_{0.15}Ga_{0.85}As/Al_{0.3}Ga_{0.7}As$ triple quantum well structure.

The upper spacer layer 106 is stacked on a surface of the active layer 105 in the +Z direction. The upper spacer layer 106 is formed of a non-doped layer made of $(Al_{0.6}Ga_{0.4}As$.

A portion including the lower spacer layer 104, the active layer 105 and the upper spacer layer 106 is called a resonator structure and the resonator structure is configured to include an optical thickness of 1 wavelength. The active layer 105 is provided at a center of the resonator structure located corresponding to a position of a loop of a standing wave distribution of the electric field so as to obtain a high stimulated emission probability.

The upper semiconductor DBR 107 is stacked on a surface of the upper spacer layer 106 in the +Z direction. The upper semiconductor DBR 107 has 20 pairs of a low refractive index layer made of p-$Al_{0.9}Ga_{0.1}As$ and a high refractive index layer made of p-$Al_{0.3}Ga_{0.7}As$. A composition gradient layer is provided between the low refractive index layer and high refractive index layer for reducing electric resistance. The composition gradient layer has a gradual compositional change from one composition to the other. Each of the low refractive index layer and the high refractive index layer is arranged such that it includes half of the adjacent composition gradient layer and has an optical thickness of $\lambda/4$.

A selective oxidation layer 108 (108a, 108b) made of p-AlAs and having a thickness of 30 nm is inserted in one of the low refractive index layers of the upper semiconductor DBR 107.

The inserted position of the selective oxidation layer 108 is a third wave node from the active layer 105 in the standing wave distribution of the electric field.

The contact layer 109 is stacked on a surface of the upper semiconductor DBR 107 in the +Z direction and is made of p-GaAs.

In the upper semiconductor DBR 107, the layers arranged near the resonator structure composed of the upper spacer layer 106 and the active layer 105 are adjusted such that a doping concentration of a p-type dopant is relatively lower than the doping concentration of other regions.

Specifically, in the upper semiconductor DBR 107, 4 pairs of the low refractive index layer and the high refractive index layer in contact with the upper spacer layer 106 is defined as a low doping concentration region. The 4 pairs of the low refractive index layer and the high refractive index layer are configured to include the doping concentration relatively lower than doping concentration of the remaining 16 pairs of the low refractive index layer and the high refractive index layer.

In the lower semiconductor DBR 103, the layers arranged near the resonator structure composed of the upper spacer layer 106 and the active layer 105 are adjusted such that doping concentration of an n-type dopant relatively lower than the doping concentration of other regions.

Specifically, in the lower semiconductor DBR 103, 4 pairs of the low refractive index layer and the high refractive index layer in contact with the lower spacer layer 104 are defined as a low doping concentration region. The 4 pairs of the low refractive index layer and the high refractive index layer are configured to include the doping concentration relatively lower than doping concentration of the remaining 36.5 pairs of the low refractive index layer and the high refractive index layer.

That is, in each of the upper semiconductor DBR 107 and lower semiconductor DBR 103, a region adjacent to the resonator structure has doping concentration relatively lower than that of other regions.

In the upper semiconductor DBR 107 and lower semiconductor DBR 103, the standing wave light intensity in the fourth pair counted from the active layer is reduced by half. Free carrier absorption may be effectively lowered by setting low doping concentration in a region that includes high standing wave light intensity.

Thus, since oscillation threshold current is lowered and slope efficiency is improved by lowering the free carrier absorption loss (hereinafter simply called "absorption loss" for convenience), a drive current for driving the elements may be lowered.

Note that a product obtained by stacking plural semiconductor layers on the substrate 101 is simply called a "stacked product".

The first mode filter 115 is provided on a surface of the contact layer 109 in the +Z direction. The first mode filters 115 is made of a transparent dielectric layer and located in a peripheral portion within an emission region and outside a central portion of the emission region to make a reflectance of that region (i.e., the peripheral portion within the emission region) where the first mode filter 115 is provided lower than the central portion of the emission region.

The second mode filter 116 is provided on a surface of the contact layer 109 in the +Z direction. The second mode filter 116 is made of a transparent dielectric layer and provided in a region including the central portion within the emission region to make a reflectance of that region (i.e., the central portion within the emission region) where the second mode filter 116 is provided higher than the peripheral portion of the emission region.

Next, a method for fabricating the surface-emitting laser element 100A is briefly described.

Figure 5:
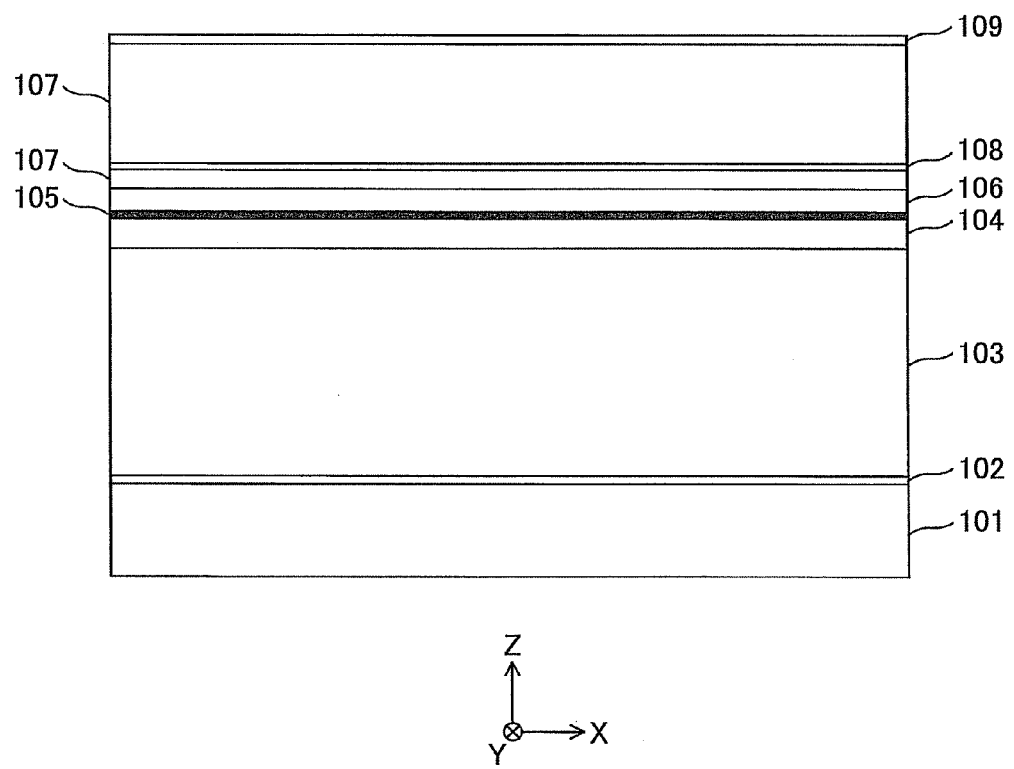
FIG. 5 is a first example diagram illustrating a method for fabricating the surface-emitting laser element 100A.

(Step S1) The above stacked product is obtained by crystal growth by metal organic chemical vapor deposition (MOCVD) or molecular beam epitaxy (MBE) as illustrated in FIG. 5.

In the crystal growth by the MOCVD, trimethylaluminum (TMA) and trimethylgallium (TMG) are used as raw materials for III-Group, and arsine ($AsH_3$) is used as a raw material for V-Group. In addition, carbon tetrabromide ($CBr_4$) is used as a p-type dopant material, and hydrogen selenide ($H_2Se$) is used as an n-type dopant material.

(Step S2) A square resist pattern having 25 μm on a side is formed on the surface of the stacked product.

(Step S3) A mesa structure (hereinafter simply called a "mesa" for convenience) having a quadrilateral pillar is formed using the above resist pattern as photo masks by an ECR etching using a Cl2 gas. In this process, a bottom surface of the etching is located in the lower spacer layer 104.

Figure 6:
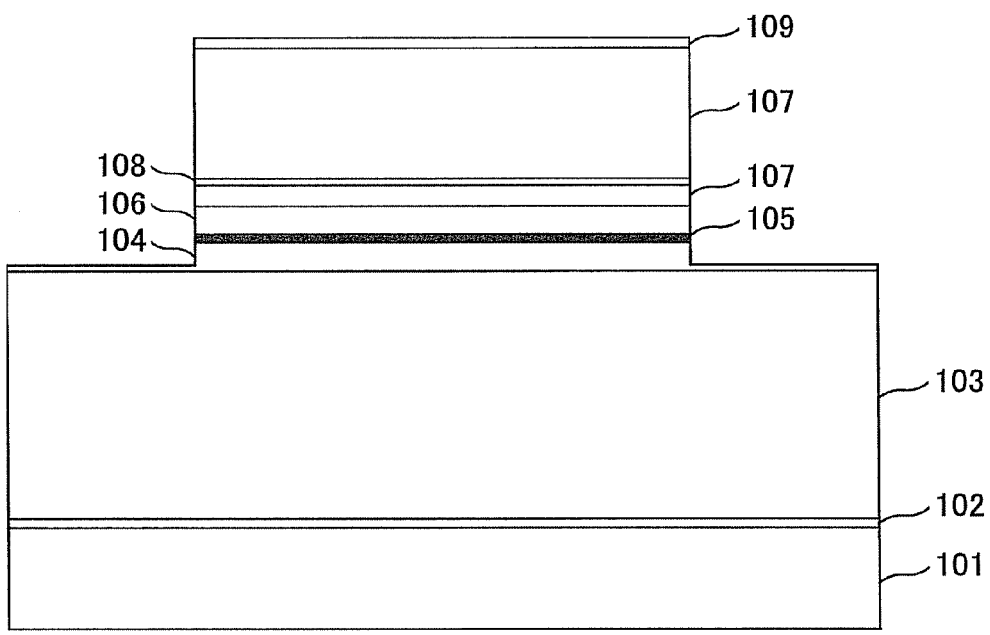
FIG. 6 is a second example diagram illustrating the method for fabricating the surface-emitting laser element 100A.

(Step S4) The photo mask is removed as illustrated in FIG. 6.

Figure 7:
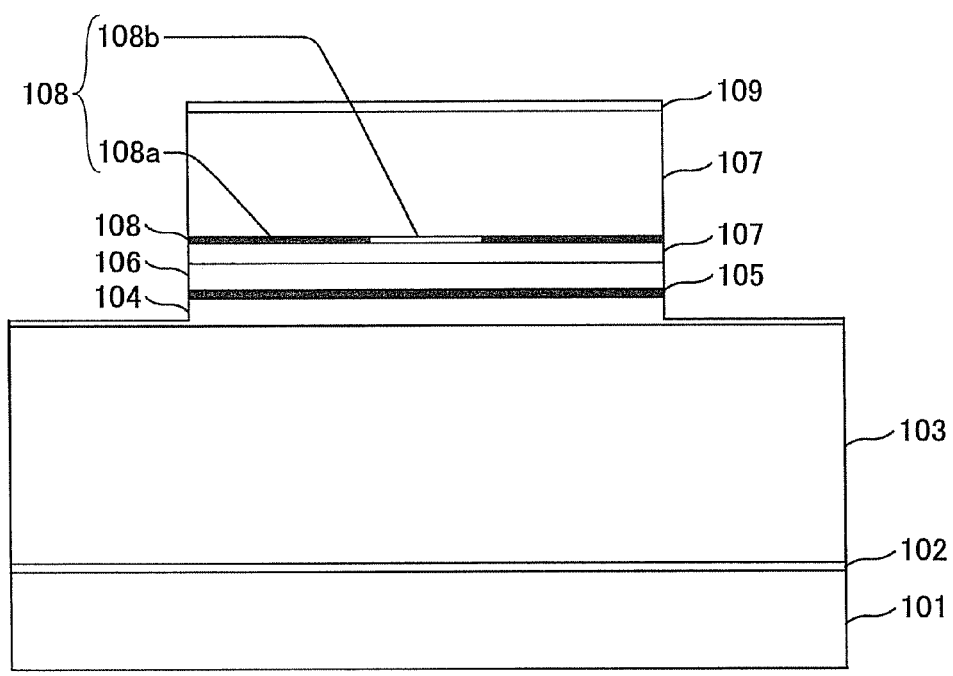
FIG. 7 is a third example diagram illustrating the method for fabricating the surface-emitting laser element 100A.

(Step S5) The resulting stacked product is heat treated under water evaporation. With the heat treatment under the water evaporation, aluminum (Al) of the selective oxidation layer 108 is selectively oxidized from its outer periphery of the mesa so that a non-oxidized region 108b encircled by an Al oxide layer 108a remains at the center of the mesa as illustrated in FIG. 7. That is, an oxide confined structure is formed to restrict a path for allowing the drive current for a light-emitting portion to pass through only at the central portion of the mesa. The non-oxidized region 108b is the current passage region (current injection region). An approximately square current passage region having a width of approximately 4 µm is thus formed.

Figure 8:
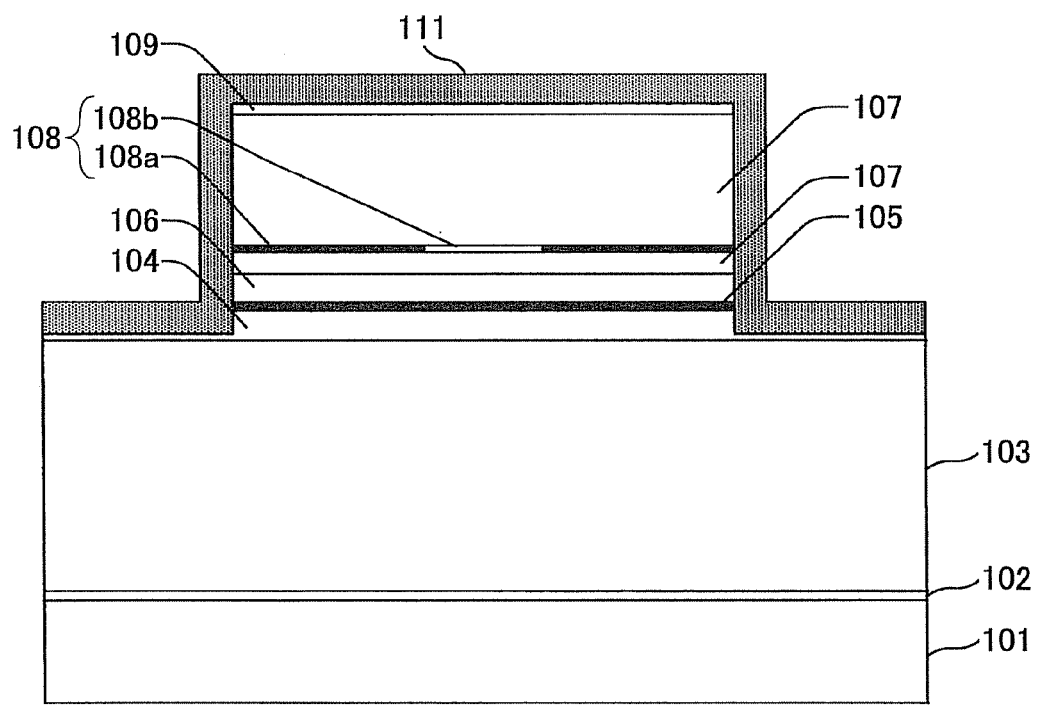
FIG. 8 is a fourth example diagram illustrating the method for fabricating the surface-emitting laser element 100A.

(Step S6) A dielectric layer 111 made of $SiO_2$ is formed over the entire surface of the stacked product by chemical vapor deposition (CVD) as illustrated in FIG. 8. In this example, a dielectric layer 111 is configured to have an optical thickness of $\lambda/4$. Specifically, since a refractive index n of $SiO_2$ is 1.45 and an oscillation wavelength $\lambda$ of $SiO_2$ is 780 nm, the actual film thickness ($=\lambda/4n$) of the dielectric layer 111 is determined as approximately 134 nm.

Figure 9:
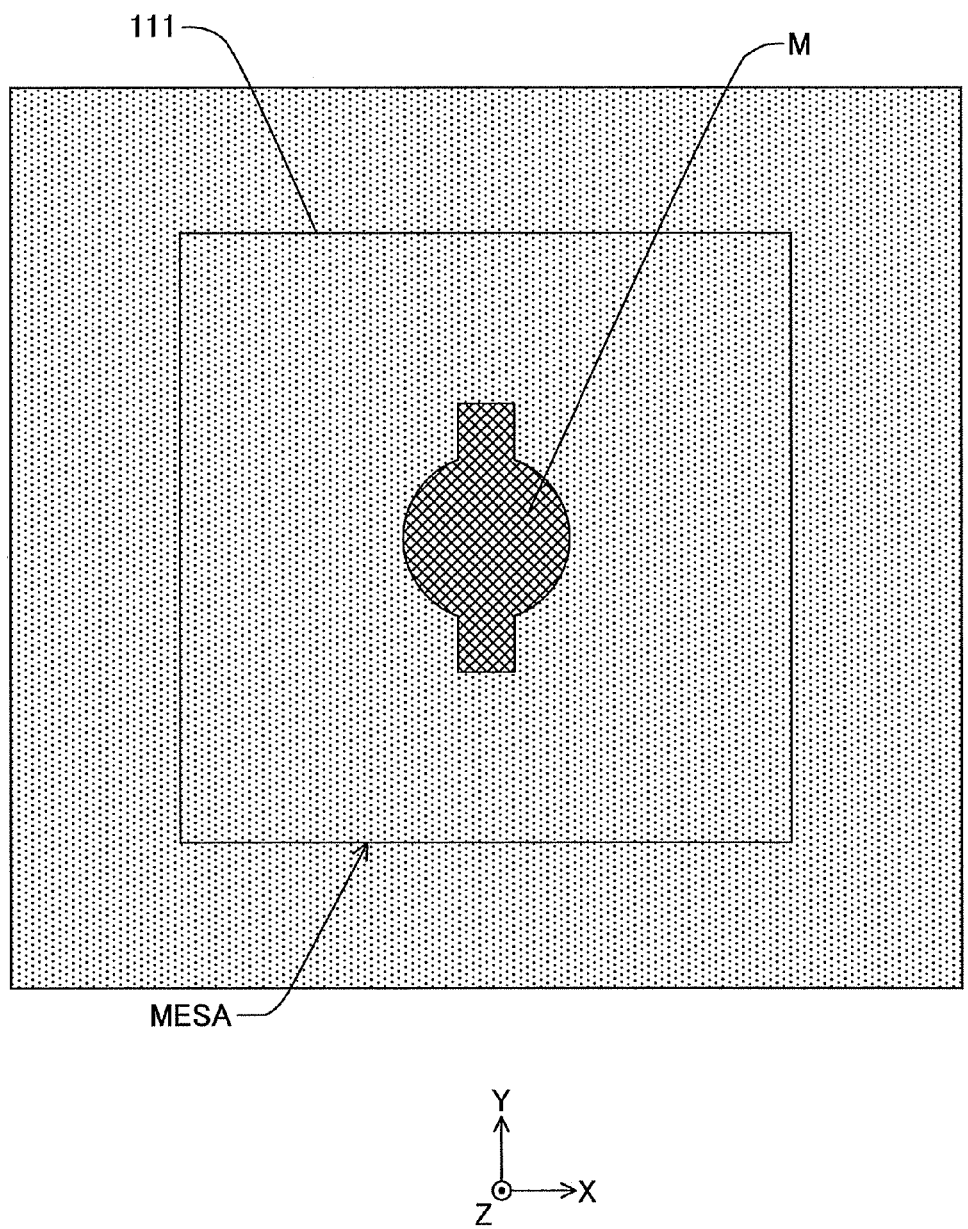
FIG. 9 is a diagram illustrating an example of a mask formed in a high reflectance region.

(Step 7) A mask M is formed to cover a region including the central portion of an upper surface of the mesa as illustrated in FIG. 9. The region covered with the mask M eventually becomes a high reflectance region.

Figure 10:
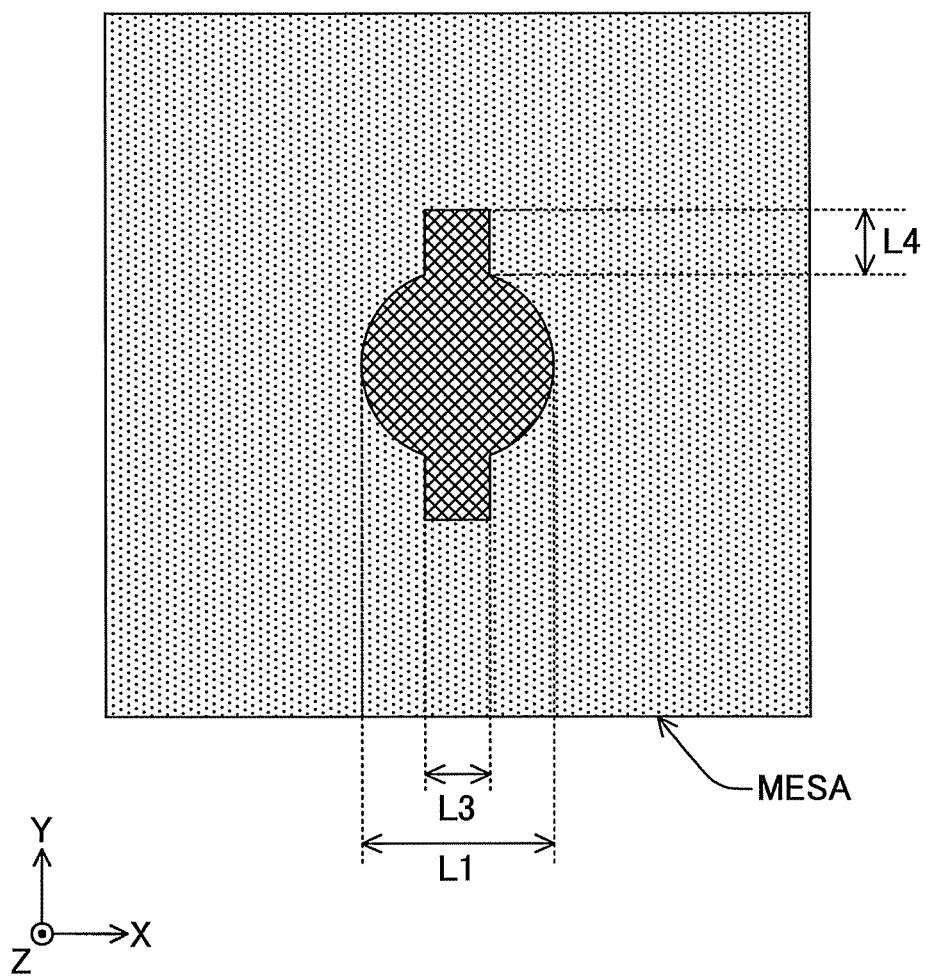
FIG. 10 is an enlarged view of a mesa portion illustrated in FIG. 9.

FIG. 10 is an enlarged view of the upper surface of the mesa portion illustrated in FIG. 9. In FIG. 10, L1 indicates 6.0 µm, L3 indicates 2.0 µm, and L4 indicates 2.0 µm. That is, the mask M applied to the region eventually becoming the high reflectance region has shape anisotropy in X-axis and Y-axis directions.

(Step 8) The dielectric layer 111 is etched in BHF (buffered HF).

Figure 12:
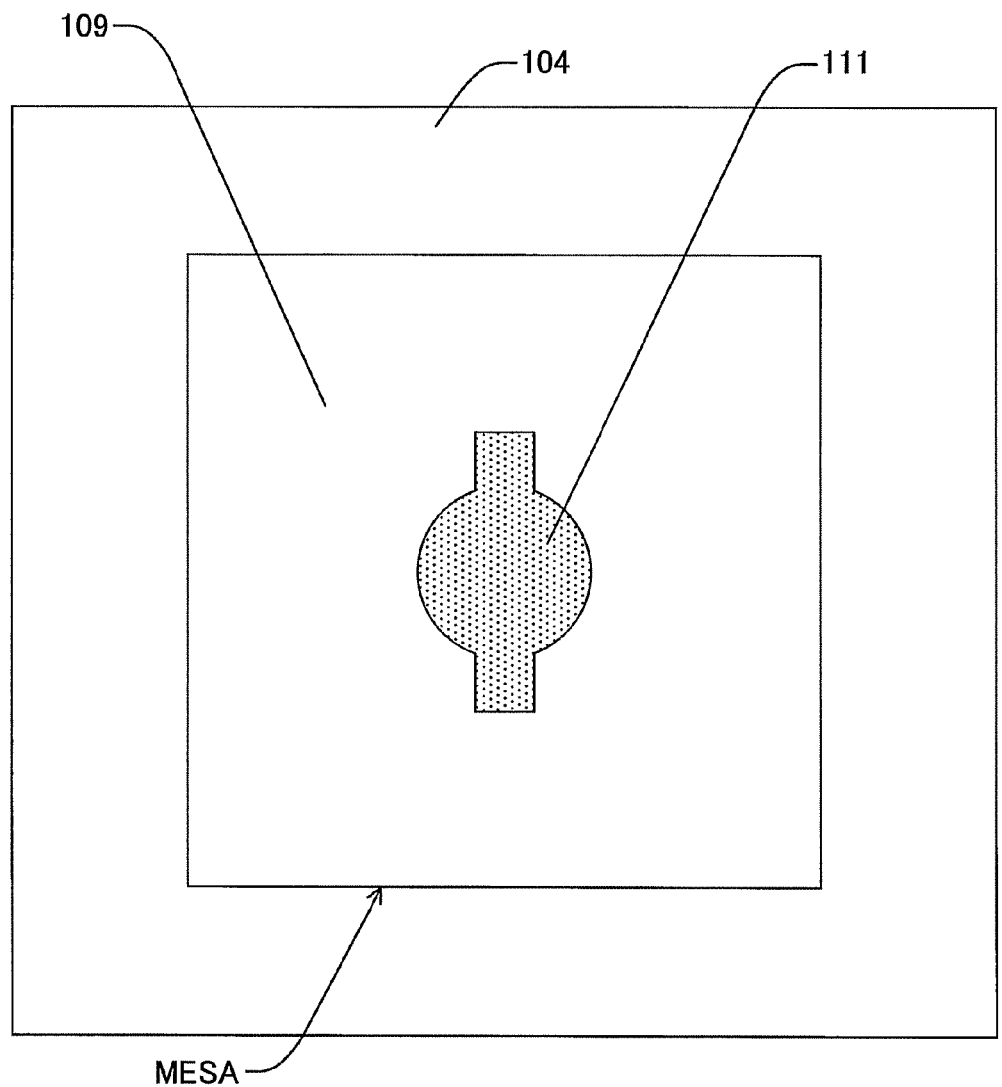
FIG. 12 is a plan diagram of FIG. 11.

(Step S9) The mask M is then removed as illustrated in FIGS. 11 and 12.

Figure 13:
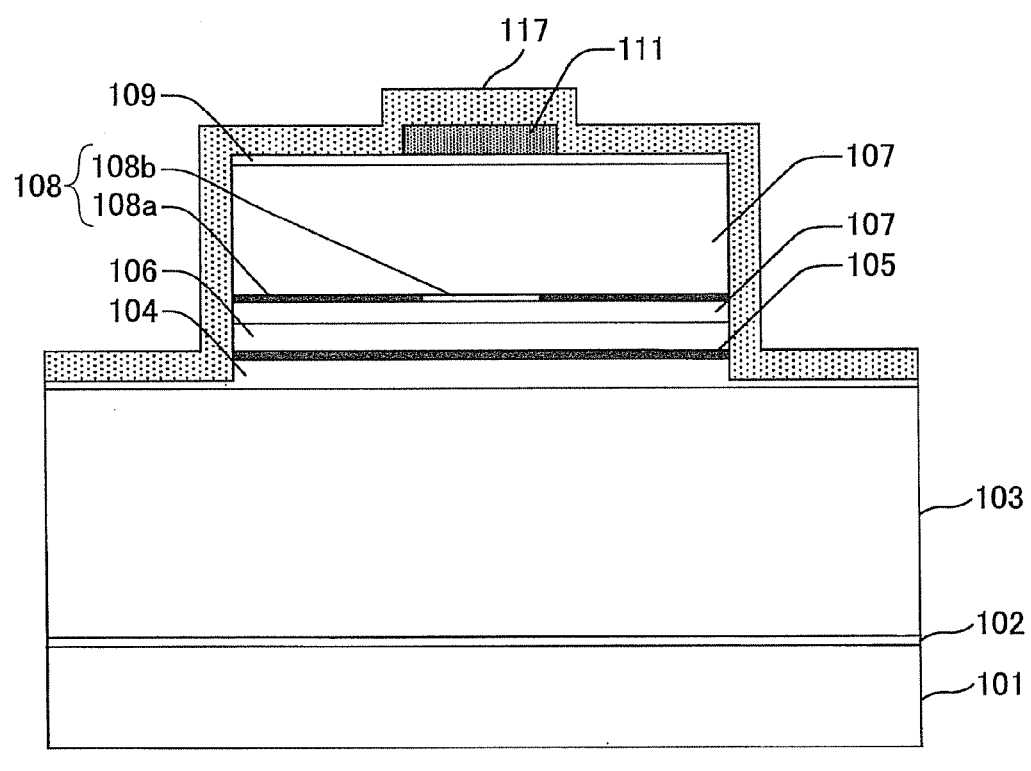
FIG. 13 is a sixth example diagram illustrating the method for fabricating the surface-emitting laser element 100A.

(Step S10) A dielectric layer 117 made of SiN is formed over the entire surface of the stacked product by chemical vapor deposition (CVD) as illustrated in FIG. 13. In this example, the dielectric layer 117 is configured to have an optical thickness of $\lambda/4$. Specifically, since a refractive index n of SiN is 1.87 and an oscillation wavelength $\lambda$ of SiN is 780 nm, the actual film thickness ($=\lambda/4n$) of the dielectric layer 111 is determined as approximately 104 nm.

Figure 14:
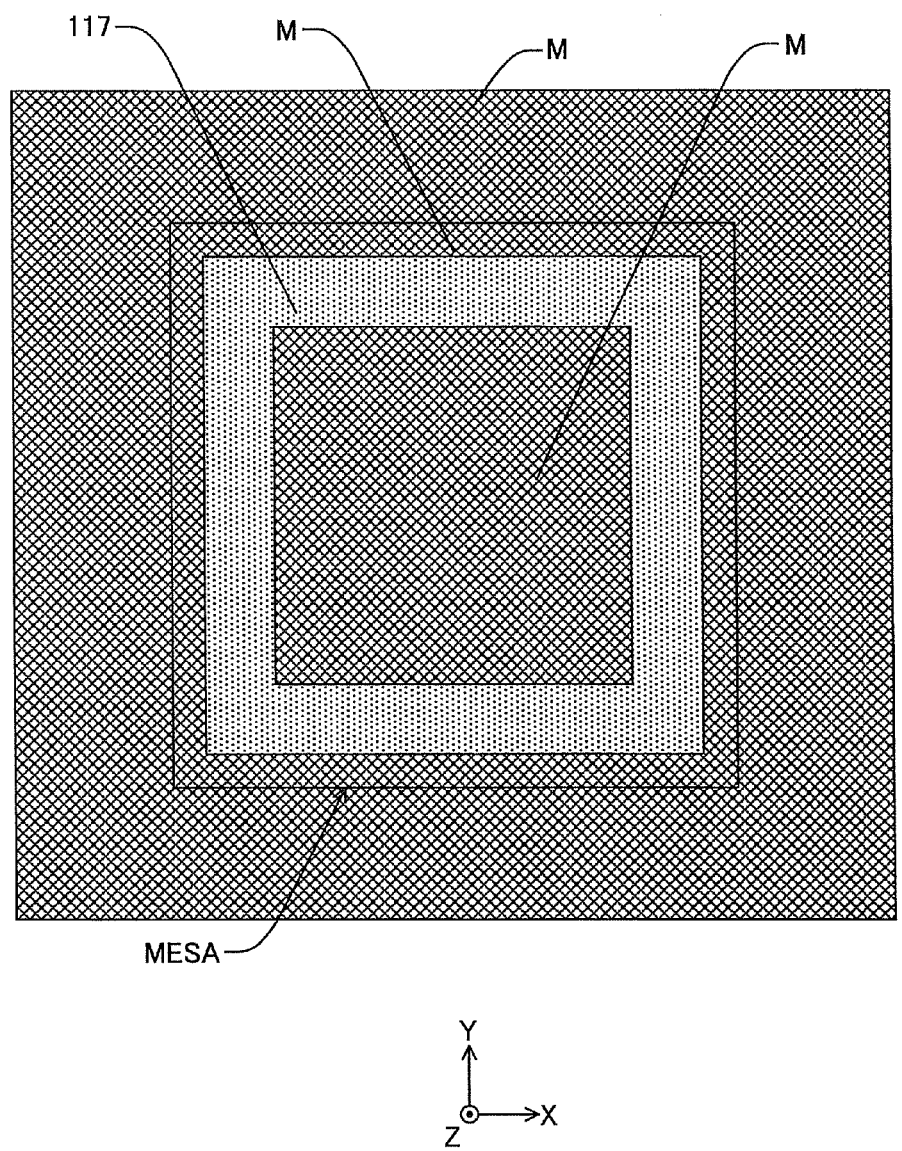
FIG. 14 is a plan diagram of FIG. 13.

(Step S11) Etching masks (i.e., masks M) for an opening for the p-side electrode contact are formed on the upper surface of the mesa that eventually becomes an emission surface of a laser beam. In this example, etching masks are formed in the periphery of the mesa, on the side surface of the mesa, the outer periphery of the upper surface of the mesa, and the emission region to be eventually formed in the upper surface of the mesa as illustrated in FIG. 14.

(Step S12) The dielectric layer 117 is etched in buffered Hydrofluoric Acid (BHF) such that the dielectric layer 117 has an opening for a p-side electrode contact.

Figure 16:
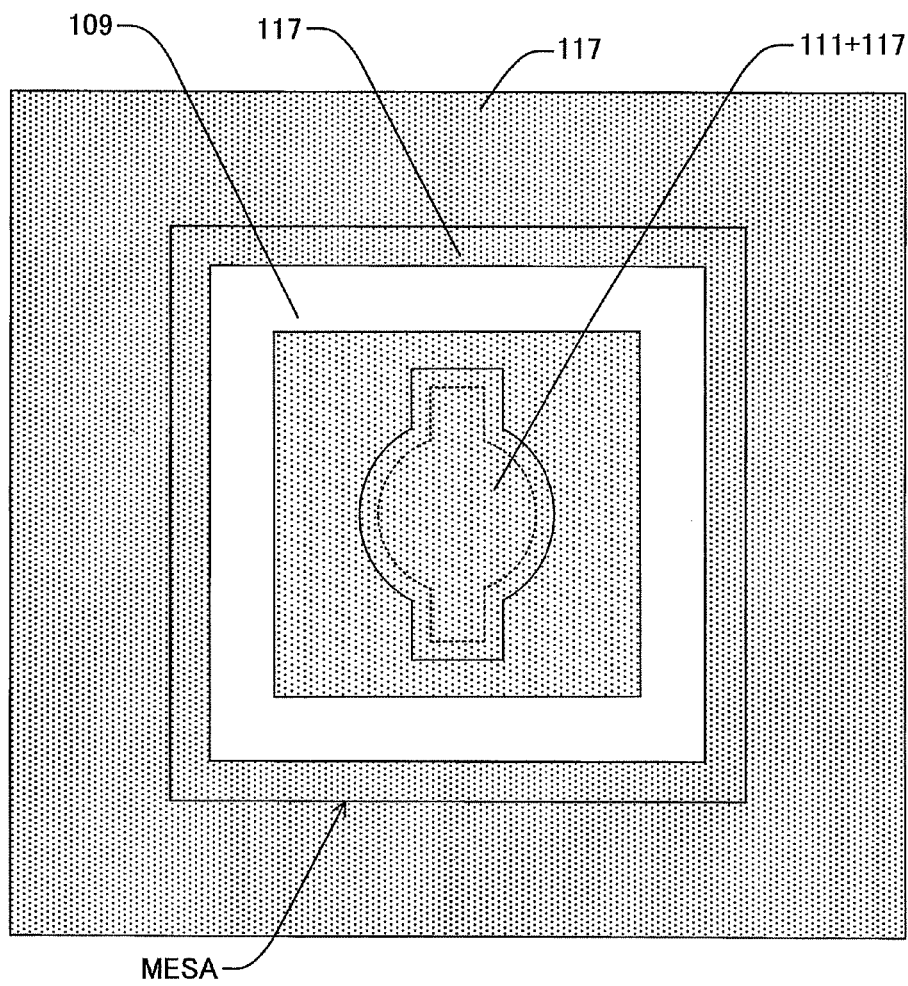
FIG. 16 is a plan diagram of FIG. 15.

(Step S13) The masks M are then removed as illustrated in FIGS. 15 and 16.

(Step S14) A square resist pattern having 14 µm on a side is formed in a region (emission region) corresponding to a light-emitting portion of the upper surface of the mesa to deposit a p-side electrode material. A multilayer film of Cr/AuZn/Au or a multilayer film of Ti/Pt/Au may be used as the p-side electrode material.

(Step S15) The electrode material deposited in the region (emission region) corresponding to the light-emitting portion is lifted off to form the p-side electrode 113 as illustrated in FIG. 17. The region enclosed by the p-side electrode 113 is the emission region.

Figure 18:
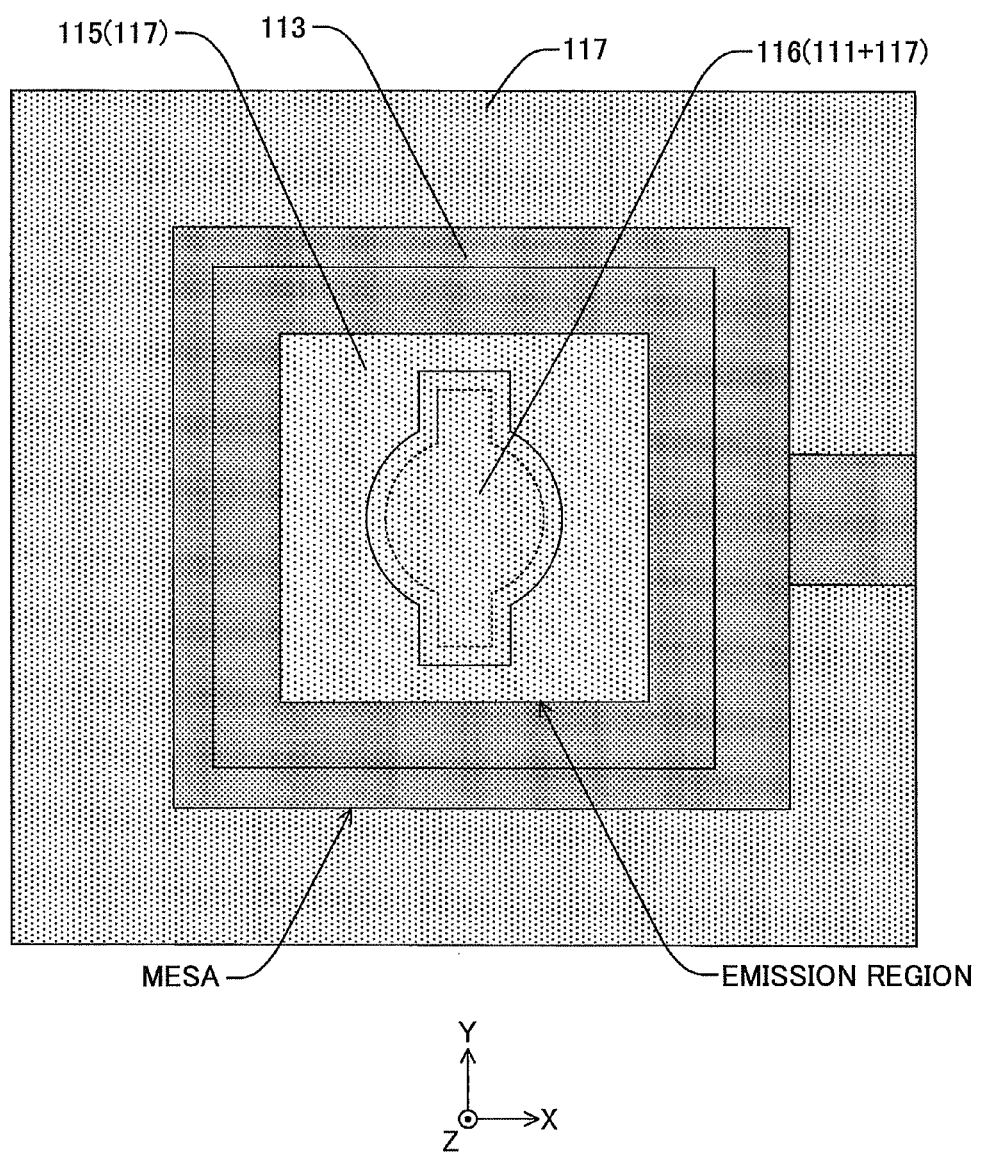
FIG. 18 is a plan diagram of FIG. 17.
Figure 19:
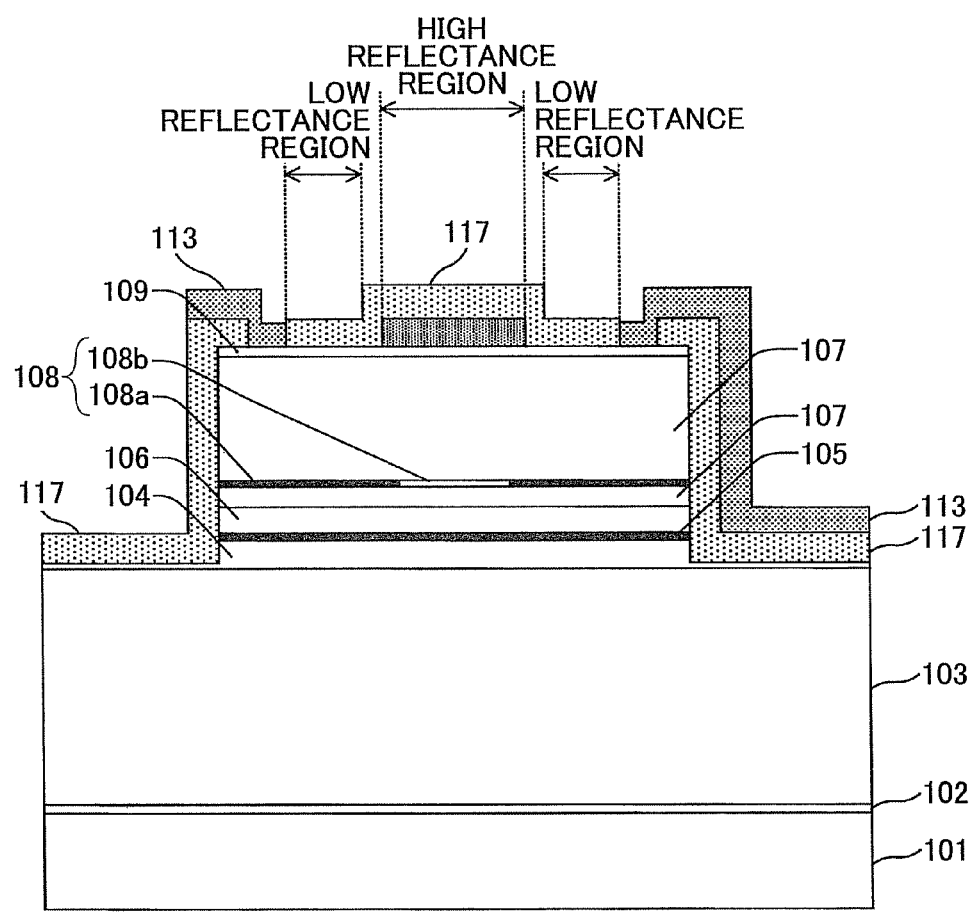
FIG. 19 is a diagram illustrating a high reflectance region and a low reflectance region of the surface-emitting laser element 100A.

In this example, the emission region includes a stacked portion where the dielectric layer 111 made of $SiO_2$ and having an optical thickness of $\lambda/4$ and the dielectric layer 117 made of SiN and having an optical thickness of $\lambda/4$ are mutually stacked and a portion where only the dielectric layer 117 made of SiN and having the optical thickness of $\lambda/4$ is formed as illustrated in FIG. 18.

The portion where only the dielectric layer 117 made of SiN and having the optical thickness of $\lambda/4$ is formed corresponds to the first mode filter 115 and the stacked portion where the dielectric layer 111 made of $SiO_2$ and having the optical thickness of $\lambda/4$ and the dielectric layer 117 made of SiN and having the optical thickness of $\lambda/4$ are mutually stacked corresponds to the second mode filter 116.

That is, the SiN layer having a refractive index n of 1.87 is stacked on the $SiO_2$ layer having a refractive index n of 1.45 in a region where the second mode filter 116 (i.e., combination of dielectric layers 111 and 117) is formed.

Since a semiconductor DBR formed of a $SiO_2$-SiN pair is formed in the region where the second mode filter 116 is formed, the region where the second mode filter 116 is formed exhibits a high reflectance. That is, the region where the second mode filter 116 is formed indicates the high reflectance region.

Meanwhile, the region where the first mode filter 115 is formed exhibits a low reflectance. That is, the region where the first mode filter 115 indicates the low reflectance region (see FIG. 19).

Figure 20:
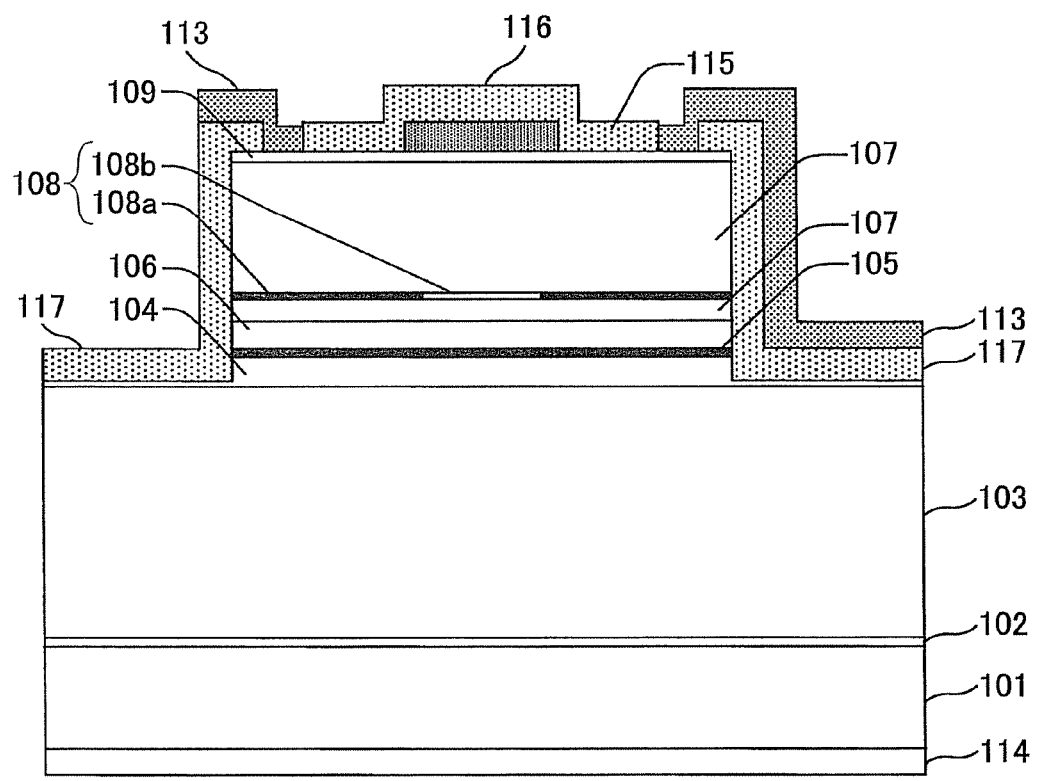
FIG. 20 is a ninth example diagram illustrating the method for fabricating the surface-emitting laser element 100A.

(Step S16) The backside of the substrate 101 is polished in a predetermined thickness (e.g., 200 µm), and the n-side electrode 114 is formed on a polished backside surface of the substrate 101 as illustrated in FIG. 20. In this example, the n-side electrode 114 is made of a multilayer film of AuGe/Ni/Au.

(Step S17) The ohmic conductivity of the p-side electrode 113 and the n-side electrode 114 is obtained by annealing. With this process, the mesa is formed as the light-emitting portion.

(Step S18) The obtained product having the plural light-emitting portions is then cut into chips, thereby fabricating surface-emitting laser elements.

The surface-emitting laser elements 100A according to a first embodiment are thus obtained.

The fabricated surface-emitting laser element 100A includes a polarization direction aligned in the X-axis direction, a single mode output power of 3 mW more, and a polarization mode suppression ratio (PMSR) of 20 dB or more.

Subsequently, a surface-emitting laser element according to a second embodiment is mainly described with a difference from the first embodiment, and descriptions of elements identical to or similar to those in the first embodiment are simplified or omitted.

[Surface-Emitting Laser Element 100B According to Second Embodiment]

A surface-emitting laser element 100B has an oscillation wavelength band of 780 nm. As illustrated in FIG. 21, the surface-emitting laser element 100B is configured to include a substrate 201, a buffer layer 202, a lower semiconductor DBR 203, a lower spacer layer 204, an active layer 205, an upper spacer layer 206, an upper semiconductor DBR 207, a contact layer 209, and a p-side electrode 213, an n-side electrode 214, and a first mode filter 215 and a second mode filter 216.

Figure 22A:
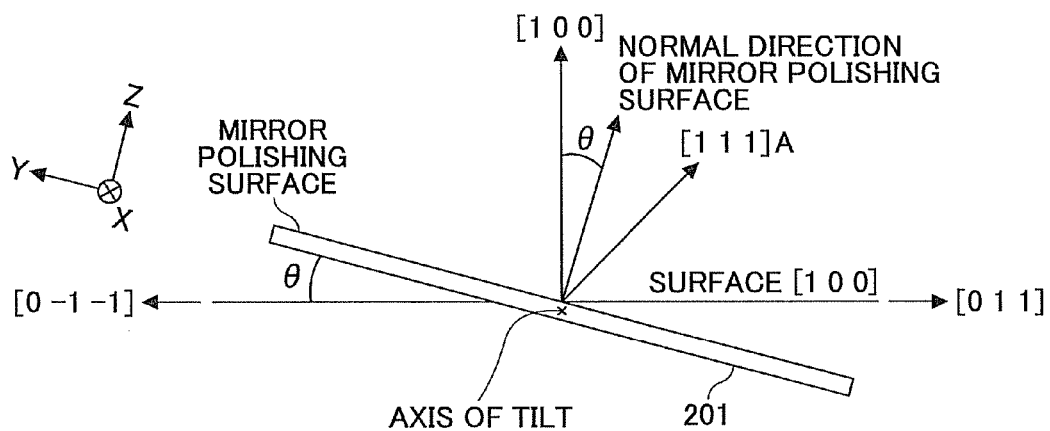
FIGS. 22A and 22B are diagrams illustrating a substrate of the surface-emitting laser element 100B.
Figure 22B:
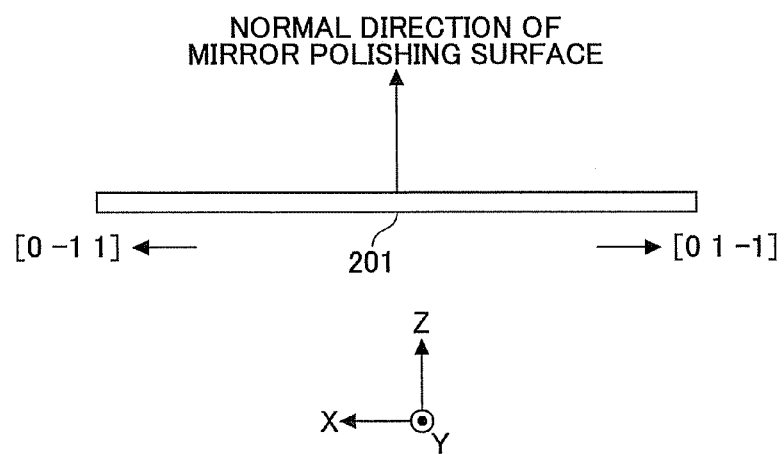

As illustrated in FIG. 22A, an upper surface of the substrate 201 has a mirror polishing surface. The substrate 201 is an n-GaAs mono-crystal substrate and its normal line direction is slanted at 15 degrees ($\theta=15$) toward a crystal orientation [1 1 1]A direction from a crystal orientation [1 0 0] direction. That is, the substrate 201 is a slanted substrate. As illustrated in FIG. 22B, the substrate 201 is arranged such that the crystal orientation [0 1 -1] direction of the substrate 201 is a -X direction and the crystal orientation [0 -1 1] direction of the substrate 101 is a +X direction.

As illustrated in FIG. 21, the buffer layer 202 is formed of an n-GaAs layer and stacked on a surface of the substrate 201 in a +Z direction.

The lower semiconductor DBR 203 is stacked on a surface of the buffer layer 202 in the +Z direction. The lower semiconductor DBR 203 has 40.5 pairs of refractive index layers each having a low refractive index layer made of an n-$Al_{0.9}Ga_{0.1}As$ and a high refractive index layer made of an n-$Al_{0.3}Ga_{0.7}As$. A composition gradient layer having a thickness of 20 nm is provided between the low refractive index layer and the high refractive index layer for reducing electric resistance. The composition gradient layer has a gradual compositional change from one composition to the other. Each of the low refractive index layer and the high refractive index layer is arranged such that it includes half of the adjacent composition gradient layer and an optical thickness of $\lambda/4$ based on the oscillation wavelength of $\lambda$.

The lower spacer layer 204 is stacked on a surface of the lower semiconductor DBR 203 in the +Z direction. The lower spacer layer 203 is formed of a non-doped layer made of $(Al_{0.1}Ga_{0.9})_{0.5}In_{0.5}P$.

The active layer 205 is stacked on a surface of the lower spacer layer 204 in the +Z direction and has a GaInAsP/GaInP triple quantum well structure.

The active layer 205 having the triple quantum well structure (hereinafter simply called a "quantum well structure layer") is obtained by introducing As into a mixed crystal GaInP in order to acquire oscillation wavelength band of 780 nm. The quantum well structure layer includes a compressive strain of 0.7%.

A barrier layer includes a tensile strain of 0.6% to increase a band gap to improve confinement of carriers while compensating for the compressive strain of the quantum well structure layer.

The upper spacer layer 206 is stacked on a surface of the active layer 205 in the +Z direction. The upper spacer layer 205 is formed of a non-doped layer made of $(Al_{0.1}Ga_{0.9})_{0.5}In_{0.5}P$.

A portion including the lower spacer layer 204, the active layer 205 and the upper spacer layer 206 is called a resonator structure and the resonator structure is configured to include an optical thickness of 1 wavelength. The active layer 205 is provided at a center of the resonator structure located corresponding to a position of a loop of a standing wave distribution of the electric field so as to obtain a high stimulated emission probability.

The upper semiconductor DBR 207 includes a first upper semiconductor DBR 2071 and a second upper semiconductor DBR 2072.

The first upper semiconductor DBR 2071 is stacked on a surface of the upper spacer layer 206 in the +Z direction. The first upper semiconductor DBR 2071 has a pair of a low refractive index layer made of a p-$(Al_{0.7}Ga_{0.3})_{0.5}In_{0.5}P$ and a high refractive index layer made of a p-$(Al_{0.1}Ga_{0.9})_{0.5}In_{0.5}P$. A composition constant buffer layer is provided between the low refractive index layer and the high refractive index layer for reducing electric resistance. Each of the low refractive index layer and the high refractive index layer is arranged such that it includes half of the adjacent buffer layer and has an optical thickness of $\lambda/4$. Note that the buffer layer is formed of a layer made of $(Al_{0.5}Ga_{0.5})_{0.5}In_{0.5}P$.

The first upper semiconductor DBR 2071 includes band gap energy greater than that of the AlGaAs layer so that the first upper semiconductor DBR 2071 functions as an electronic block layer injected into an active region.

The second upper semiconductor DBR 2072 is stacked on a surface of the first upper semiconductor DBR 2071 in the +Z direction. The second upper semiconductor DBR 2071 has 22 pairs of a low refractive index layer made of a p-$Al_{0.9}Ga_{0.1}As$ and a high refractive index layer made of a p-$Al_{0.3}Ga_{0.7}As$. A composition gradient layer is provided between the low refractive index layer and high refractive index layer for reducing electric resistance. The composition gradient layer has a gradual compositional change from one composition to the other. Each of the low refractive index layer and the high refractive index layer is arranged such that it includes half of the adjacent composition gradient layer and has an optical thickness of $\lambda/4$.

A selective oxidation layer 208 made of p-AlAs and having a thickness of 30 nm is inserted in one of the low refractive index layers of the second upper semiconductor DBR 2072.

The inserted position of the selective oxidation layer 208 is a third wave node from the active layer 205 in the standing wave distribution of the electric field.

The contact layer 209 is stacked on a surface of the second upper semiconductor DBR 2072 in the +Z direction and is made of p-GaAs.

The first mode filter 215 corresponds to a portion where only a dielectric layer 217 made of SiN and having the optical thickness of $\lambda/4$ is formed and the second mode filter 216 corresponds to a stacked portion where a dielectric layer 211 made of $SiO_2$ and having the optical thickness of $\lambda/4$ and the dielectric layer 217 made of SiN and having the optical thickness of $\lambda/4$ are mutually stacked.

The surface-emitting laser element 100B may be fabricated in the same manner as the method for fabricating the surface-emitting laser element 100A. Note that a phosphine ($PH_3$) gas is used as a raw material for V-Group in the AlGaInAsP material. Note that dimethylzinc (DMZn) is used as a raw material for the p-type dopant in the AlGaInP material.

Further, since the slanted substrate is used for fabricating the surface-emitting laser element 100B, hillock formation of the AlGaInP material may be controlled. Accordingly, crystallinity may be improved, the formation of natural superlattice may be controlled, and the decrease of band gap energy may be prevented. Thus, the semiconductor DBR made of AlGaInP may be capable of maintaining high band gap energy to exhibit excellent functionality as the electronic block layer.

Further, since anisotropy is introduced in the gain of the active layer due to the slanted substrate and an inactive layer, it may be possible to align the polarization direction in a specific direction (i.e., X-axis direction in this example).

The fabricated surface-emitting laser element 100B includes a polarization direction aligned in the X-axis direction, a single mode output power of 3.0 mW more, and a polarization mode suppression ratio (PMSR) of 23 dB or more.

In FIG. 21, the selective oxidation layer 208 includes an Al oxide layer 208a that is formed by selective oxidation of Al contained in the selective oxidation layer 208, and a current passage region 208b.

Note that in the first and second embodiments, the mask M corresponding to a region eventually becoming the high reflectance region may be located such that a region eventually becoming the low reflectance region within the emission region may be divided into two regions by the mask M residing in the middle. In this example, the emission region has 10 μm on a side, where L1=4 μm, L3=2 μm, and L4=3 μm (see FIG. 23).

Figure 24:
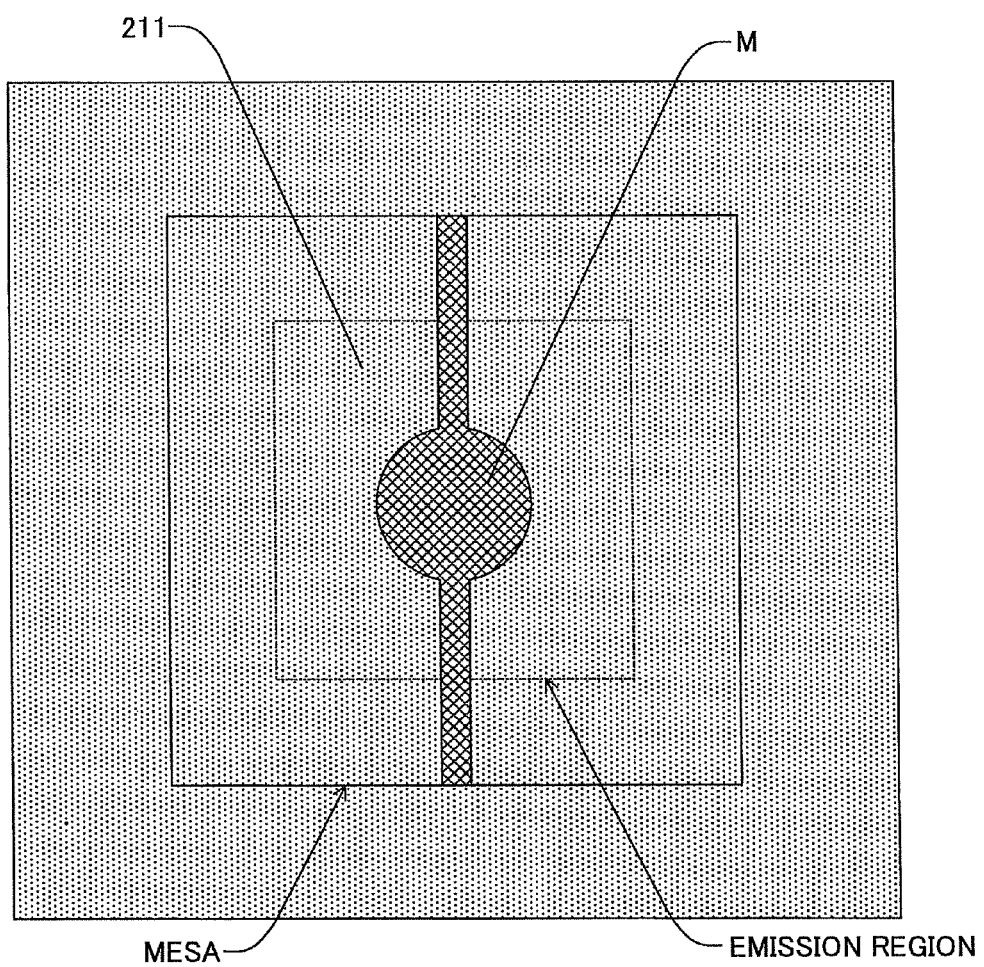
FIG. 24 is a diagram illustrating a second modification of the mask in the high reflectance region.
Figure 25:
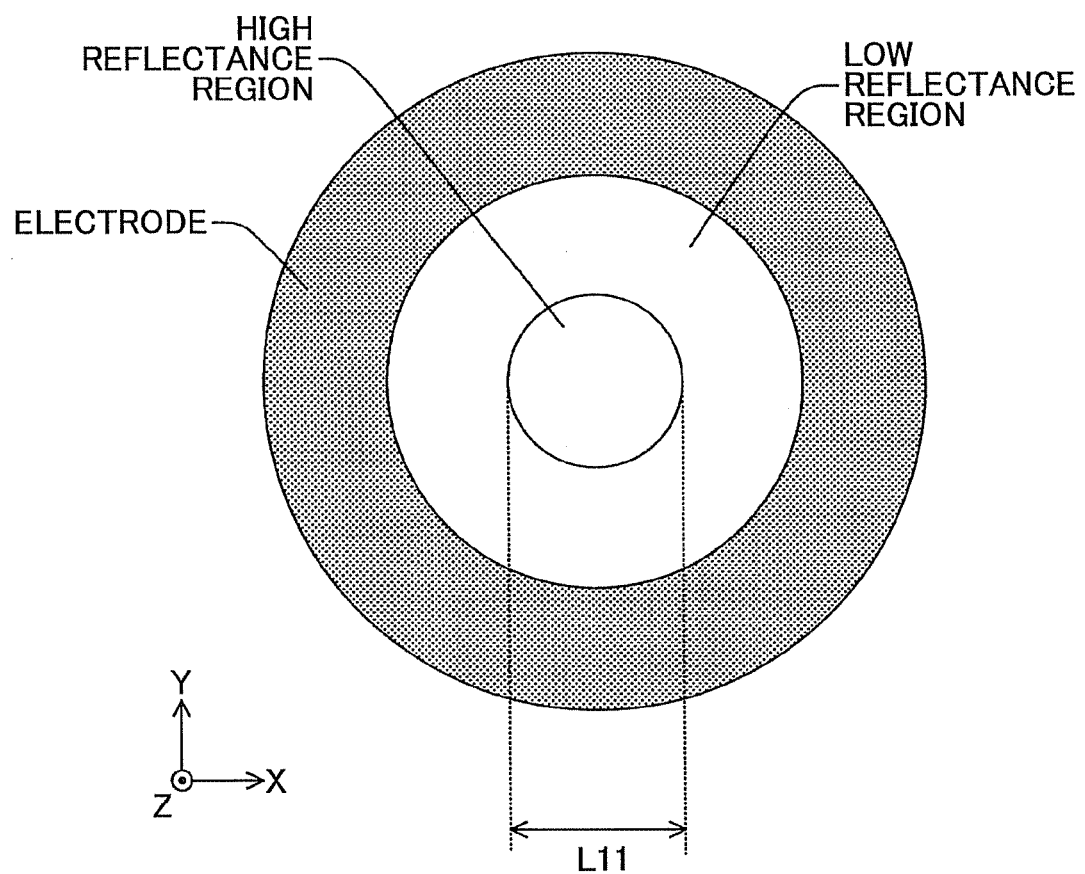
FIG. 25 is a diagram illustrating an example of the surface-emitting laser element used in computing oscillation distribution.

Note also that in the first and second embodiments, the mask M corresponding to the region eventually becoming the high reflectance region may be located such that the mask M is connected to an outer periphery of the upper surface of the mesa as illustrated in FIG. 24.

Here, the number of pairs of refractive index layers in the second upper semiconductor DBR 2072 is changed to 19 pairs. As illustrated in an example of FIG. 25, the surface-emitting laser element 100B includes a circular emission region, a circular high reflectance region is provided in the middle of the circular emission region, and the circular high reflectance region is enclosed by a circular low reflectance region. An oscillation distribution is computed on such a surface-emitting laser element B (i.e., computational model) by changing a diameter L11 of the high reflectance region. Note that an outer diameter of the mesa is determined as 25 μm and a diameter of the current passage region is determined as 4.5 μm.

Figure 26:
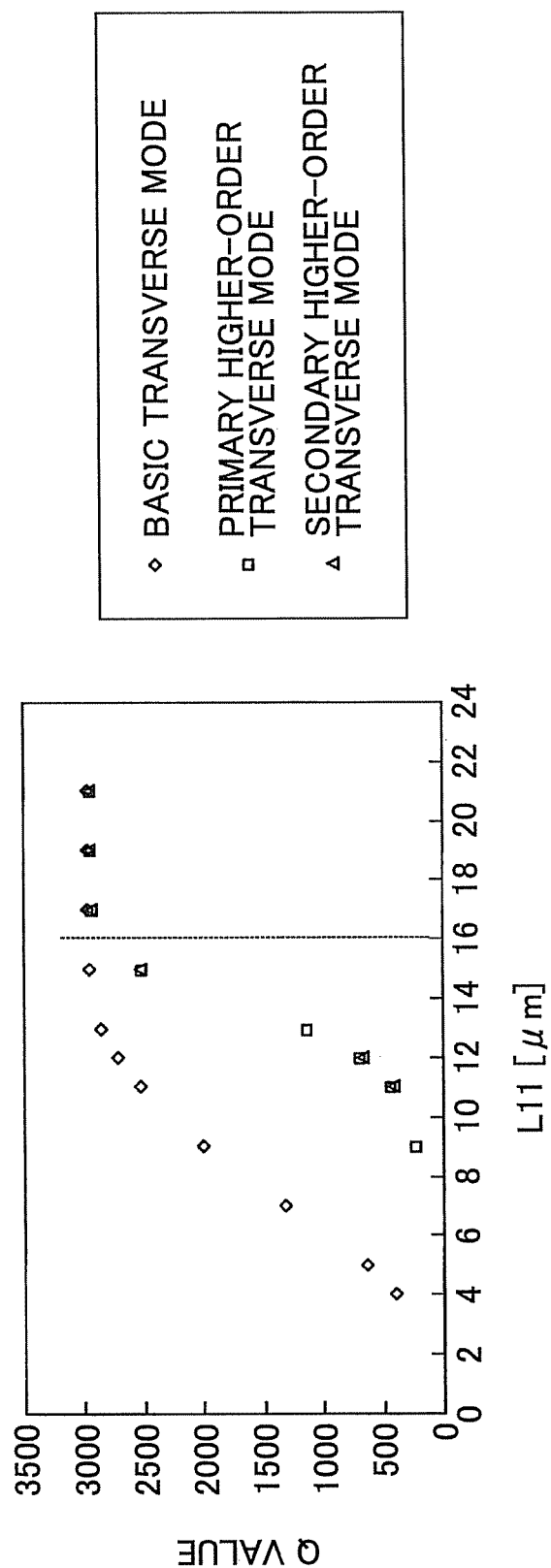
FIG. 26 is a graph illustrating a relationship between an inner diameter L11 and a Q value in a single mode, a primary high-order transverse mode, and a secondary high-order transverse mode of a laser beam.

FIG. 26 is a graph illustrating a relationship between the outer diameter L11 of the high reflectance region and Q values in a basic transverse mode (single mode), a primary high-order transverse mode, and a secondary high-order transverse mode of a laser beam, which is obtained by the above computational result. Note that the Q value is a non-dimensional parameter indicating performance of the resonator in each mode, and inversely proportional to the oscillation wavelength and a dissipation factor of the resonator. That is, if the oscillation wavelength is $\lambda$ [m] and the dissipation factor of the resonator is $\alpha$ [1/m], $Q \propto 1/\lambda\alpha$ is obtained. Note that since the oscillation wavelength $\lambda$ is constant, the Q value is determined based on the dissipation factor $\alpha$ of the resonator. Thus, the greater the Q value in each mode is, the smaller the dissipation factor $\alpha$ of the resonator will be, thereby easily oscillating the corresponding mode of a laser beam.

As illustrated in FIG. 26, if the outer diameter L11 of the high reflectance region is smaller than 16 μm, the Q values of the primary and secondary high-order transverse modes are drastically decreased relative to the Q value of the basic transverse mode. Thus, the oscillations of the high-order transverse modes are controlled by setting the outer diameter L11 of the high reflectance region smaller than 16 μm. That is, greater single mode output power may be obtained by setting the outer diameter L11 of the high reflectance region smaller than 16 μm.

Figure 27:
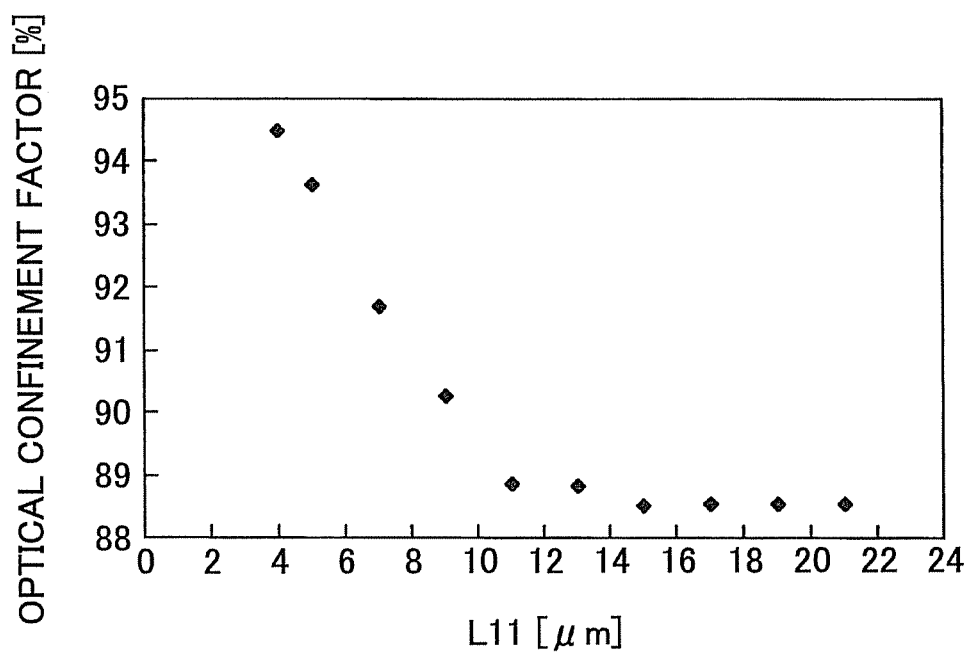
FIG. 27 is a graph illustrating a relationship between the inner diameter L11 and an optical confinement factor in a transverse direction of a basic transverse mode of a laser beam.

FIG. 27 is a graph illustrating a relationship between the outer diameter L11 of the high reflectance region and the optical confinement factor in the transverse direction of the basic transverse mode of a laser beam, which is obtained by the above computational result. As illustrated in FIG. 27, if L11 is gradually decreased from 16 μm, the optical confinement factor is gradually increased; however, when the outer diameter L11 of the high reflectance region exceeds 10 μm, the optical confinement factor is drastically increased. This result is associated with the above fact that the Q values are drastically decreased by setting the outer diameter L11 of the high reflectance region smaller than 16 μm. That is, the laser oscillation is suppressed in the low reflectance region by decreasing the size (L11) of the high reflectance region. Thus, a scanning mode spread of the basic transverse mode may be controlled based on the outer diameter L11 of the high reflectance region.

As described above, the optical confinement factor in the transverse direction of the basic transverse mode may vary with the outer diameter L11 of the high reflectance region. If the high reflectance region is configured to include anisotropy in two orthogonal directions in a plane perpendicular to the emission direction, the optical confinement factor in the transverse direction may provide two different values in corresponding two directions.

In this case, the greater the value of the optical confinement factor in the transverse direction is, the lower the oscillation threshold current becomes. Thus, the mode having polarization in a direction having a large optical confinement factor in the transverse direction may preferentially be oscillated. Accordingly, the polarization direction may be regulated in a specific direction.

In the first and second embodiments, since the optical confinement factor in the transverse direction increases in the X-axis direction, the laser is oscillated in the mode having polarization in X-axis direction. Further, since an inner periphery of the emission region has low reflectance, high single mode output power may be obtained.

Moreover, if carriers are injected in the active region in a heterogeneous manner, the active layer may obtain anisotropic optical gain. Thus, the polarization mode suppression ratio PMSR may be increased. Specifically, carriers are injected into the active layer in the heterogeneous manner by introducing anisotropy in the shape of the region where the p-side electrode 213 and the contact layer 209 are mutually in contact (i.e., the region is hereinafter called a "current injection region").

Figure 28:
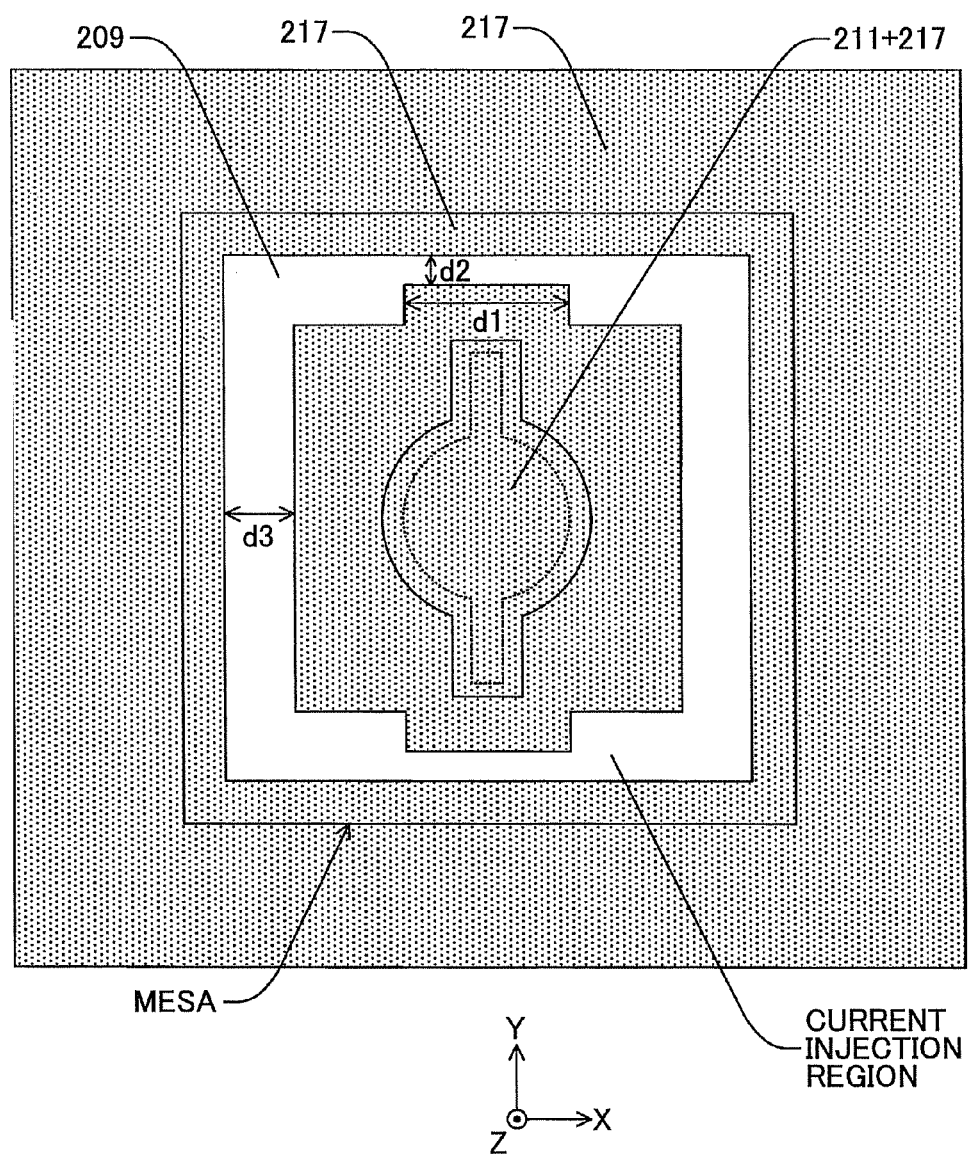
FIG. 28 is a diagram illustrating a first diagram illustrating a first example of a combined shape of a current injection region and a high reflectance region.
Figure 29:
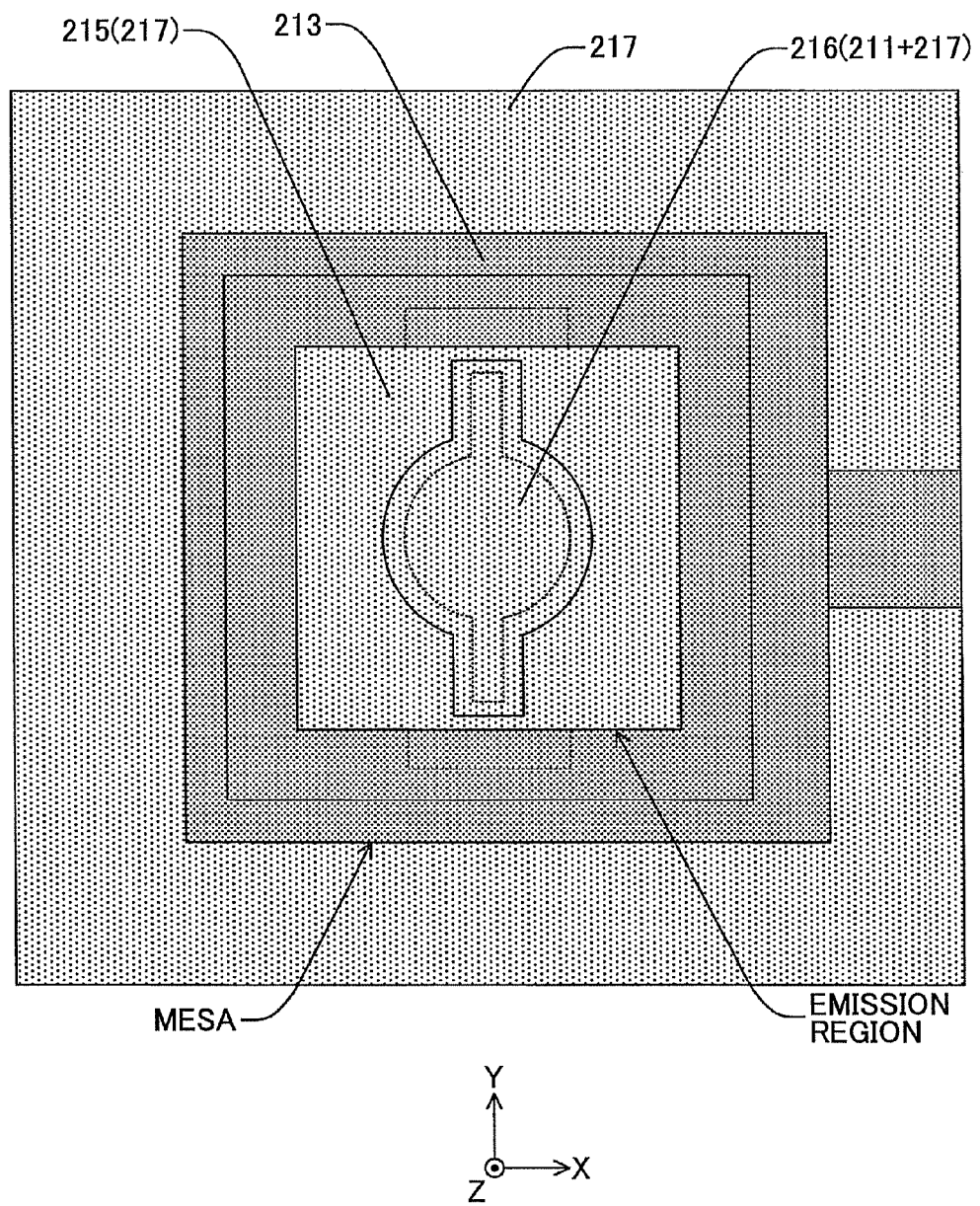
FIG. 29 is a second diagram illustrating the first example of the combined shape of the current injection region and the high reflectance region.

FIG. 28 illustrates a current injection region and a high reflectance region before the p-side electrode material is deposited. As illustrated in FIG. 28, a width d3 of the current injection region in an X-axis direction is larger than a width d2 of the current injection region in a Y-axis direction. In this example, respective widths are set as d1=4 μm, d2=1 μm, and d3=3.5 μm (see FIG. 28). FIG. 29 illustrates the current injection region and the high reflectance region after the p-side electrode 213 is formed.

In this example, the amount of carriers injected is decreased in regions having narrower widths. As a result, the optical gain in the mode polarized in the Y-axis direction may be decreased, which facilitates laser oscillation in the mode polarized in the X-axis direction. Further, an effect in aligning the polarization direction with the X-axis direction may be obtained due to the shape anisotropy in the second mode filter 216 (211+217). That is, a higher polarization mode suppression ratio PMSR may be obtained by aligning a direction in which the polarization is controlled by the second mode filter 216 (211+217) with a direction in which the polarization is controlled by narrowing the width of the current injection region.

Figure 30:
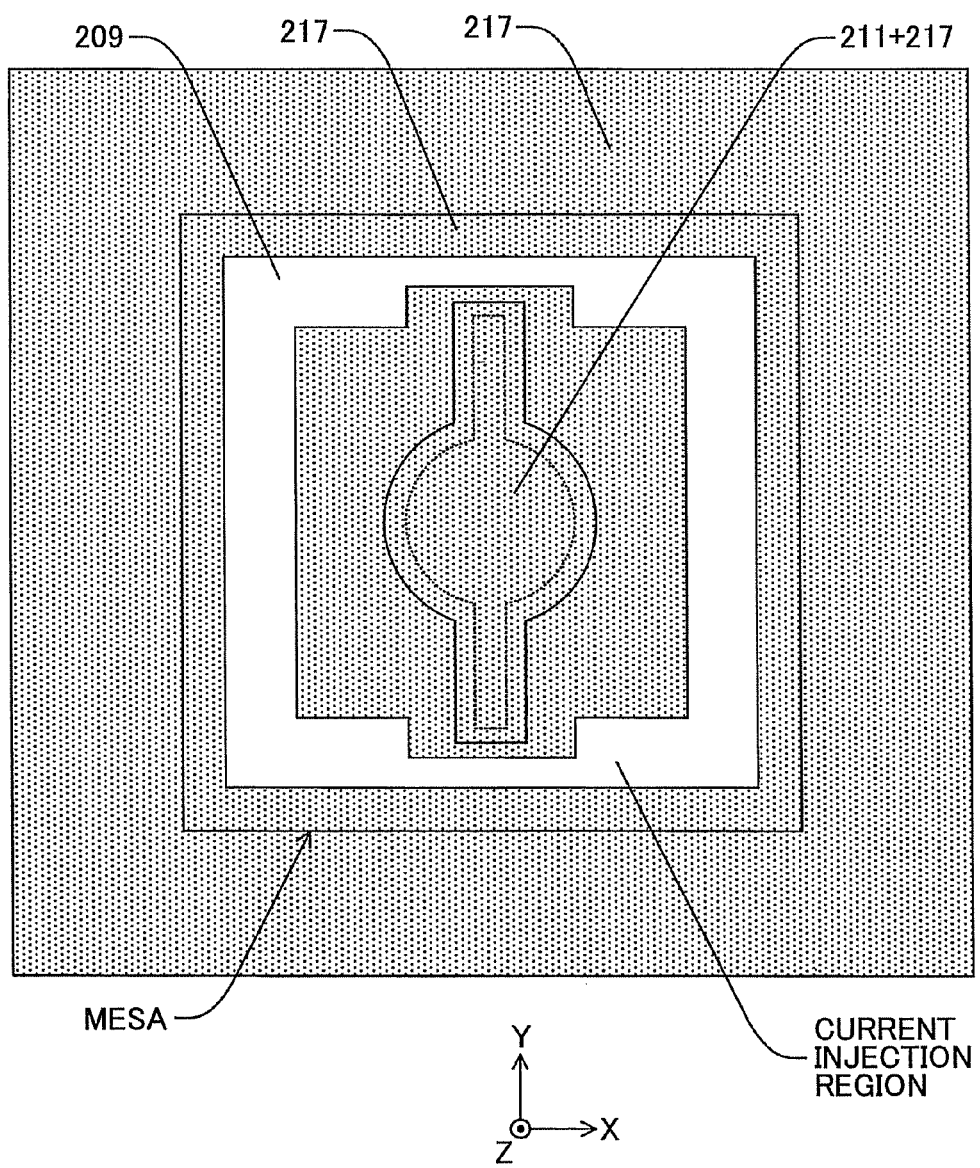
FIG. 30 is a first diagram illustrating a second example of the combined shape of the current injection region and the high reflectance region.
Figure 31:
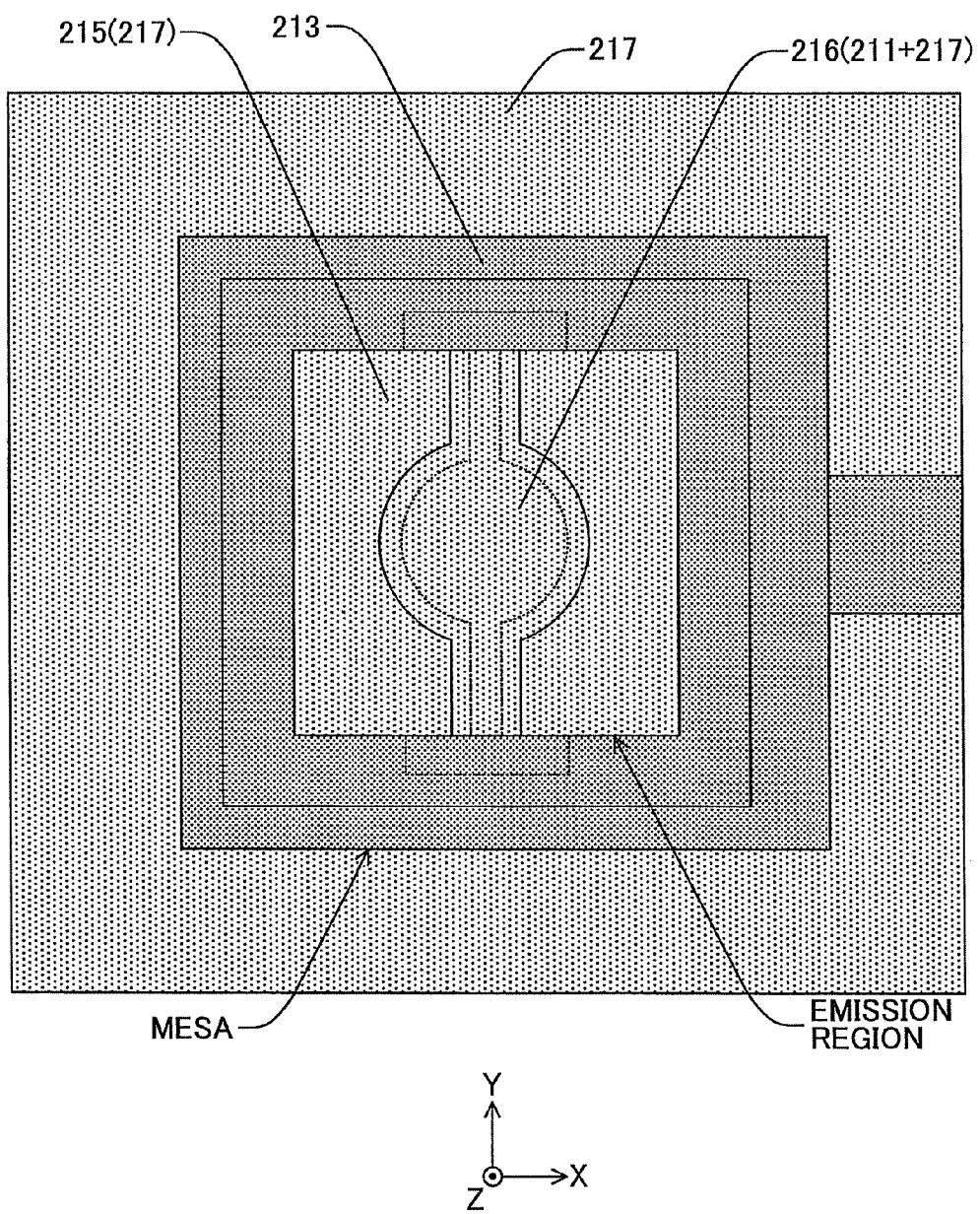
FIG. 31 is a second diagram illustrating the second example of the combined shape of the current injection region and the high reflectance region.

In this example, the first mode filter 215 (217) may be divided into two regions by the second mode filter 216 (211+217) residing in the middle as illustrated in FIGS. 30 and 31. FIG. 30 illustrates a current injection region and a high reflectance region before the p-side electrode material is deposited. FIG. 31 illustrates the current injection region and the high reflectance region after the p-side electrode 213 is formed. In this example, a high polarization mode suppression ratio PMSR may also be obtained.

Figure 32:
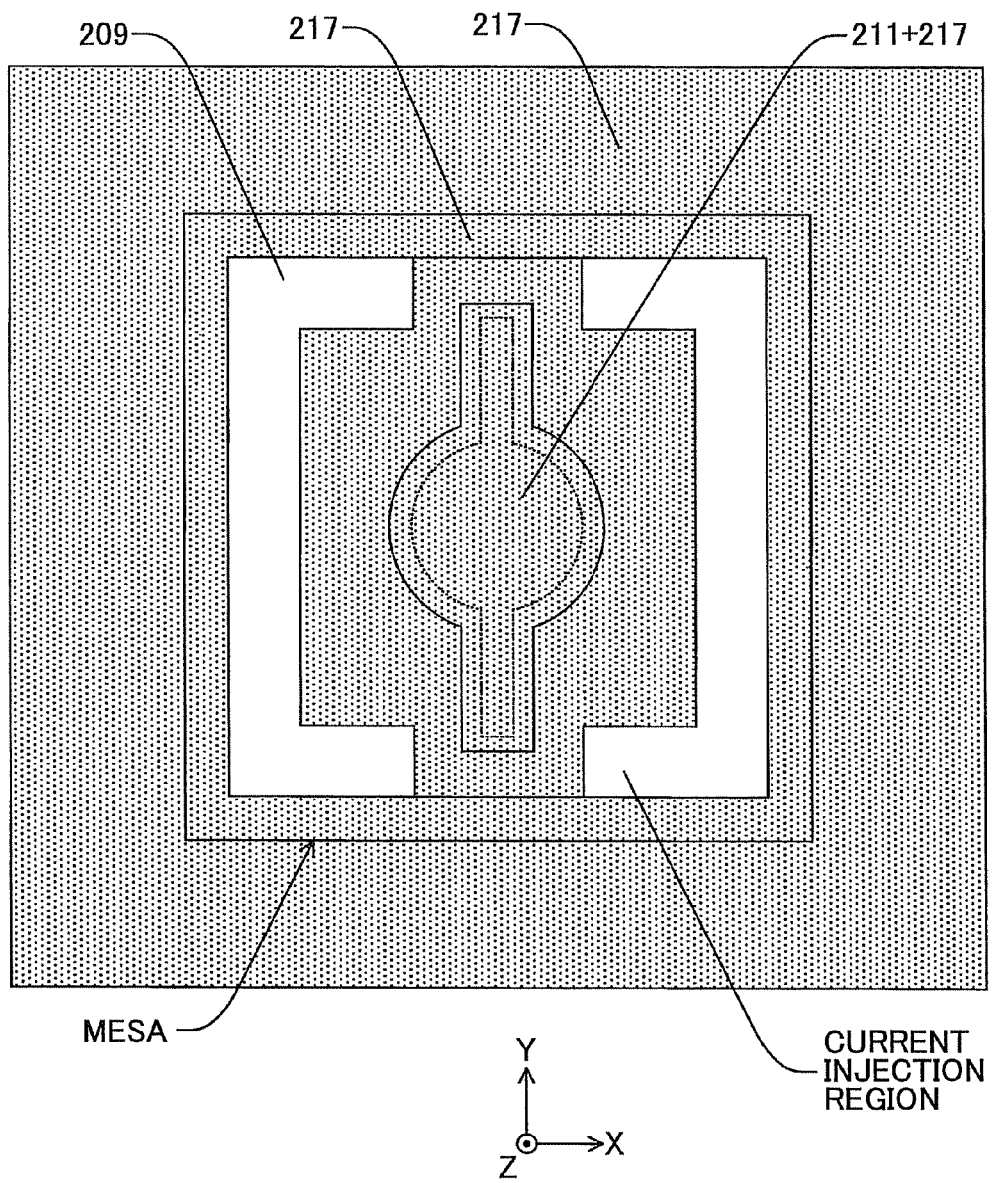
FIG. 32 is a first diagram illustrating a third example of the combined shape of the current injection region and the high reflectance region.
Figure 33:
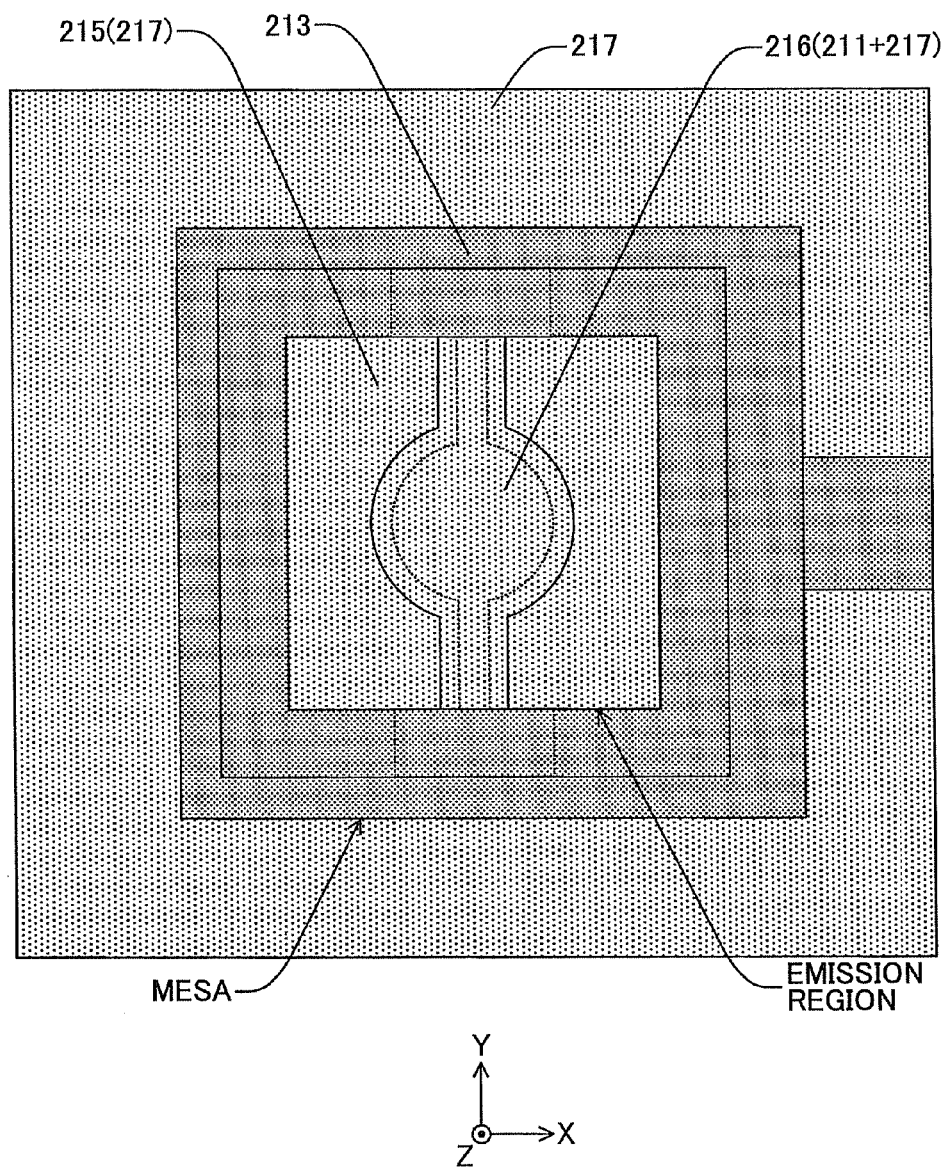
FIG. 33 is a second diagram illustrating the third example of the combined shape of the current injection region and the high reflectance region.

As illustrated in FIGS. 32 and 33, end portions of the current injection region in the Y-axis direction may be partially removed so that the remaining portions of the current injection region mutually face in the X-axis direction. FIG. 32 illustrates a current injection region and a high reflectance region before the p-side electrode material is deposited. FIG.

33 illustrates the current injection region and the high reflectance region after the p-side electrode 213 is formed. In this example, carriers injected in the Y-axis direction are drastically reduced, so that the carriers injected into the active layer may be extremely heterogeneous. Accordingly, anisotropic optical gain may become significantly large. That is, the optical gain in the mode polarized in the Y-axis direction may be drastically lowered. As a result, an effect in aligning the polarization direction in the X-axis direction may be obtained with a higher polarization mode suppression ratio PMSR together with the effect in the polarization control of the second mode filter 216 (211+217).

Figure 34:
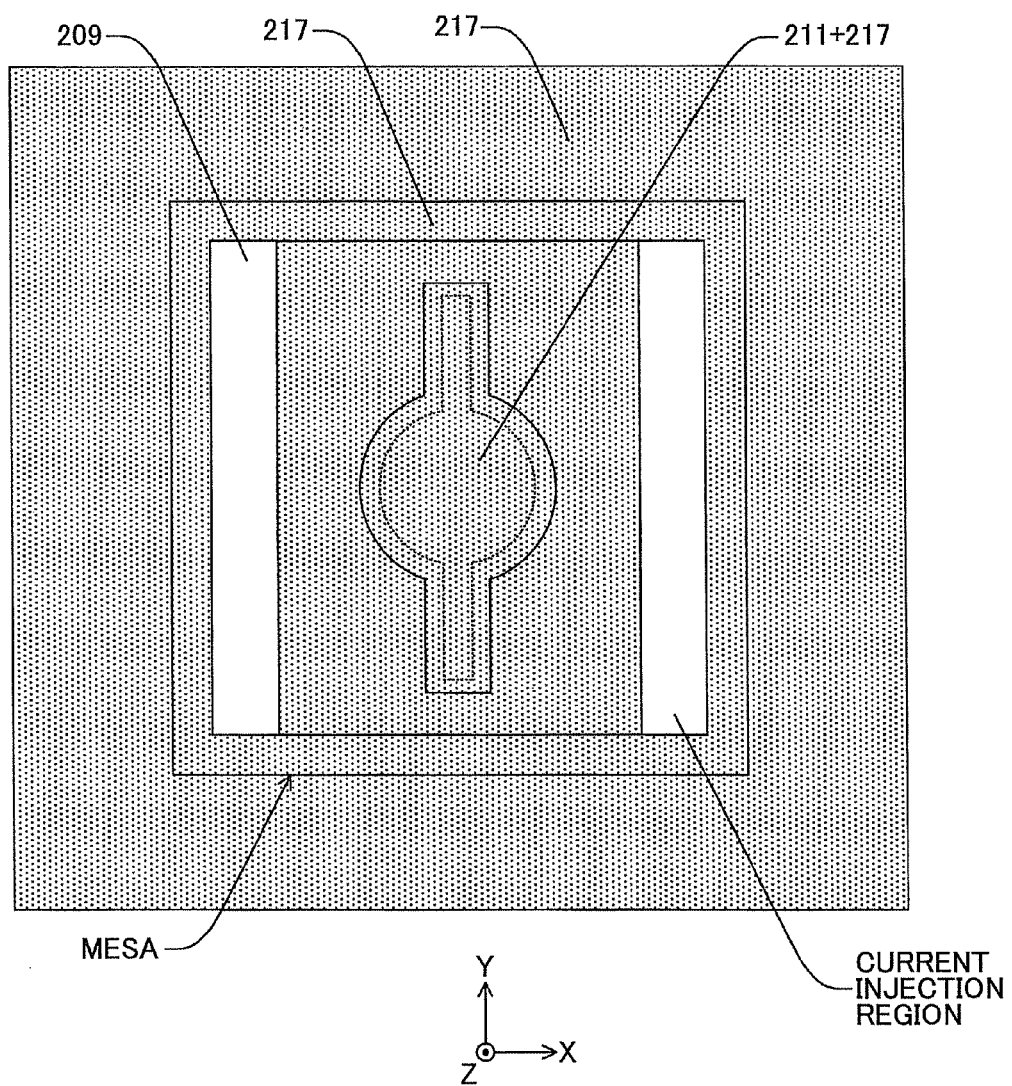
FIG. 34 is a first diagram illustrating a fourth example of the combined shape of the current injection region and the high reflectance region.
Figure 35:
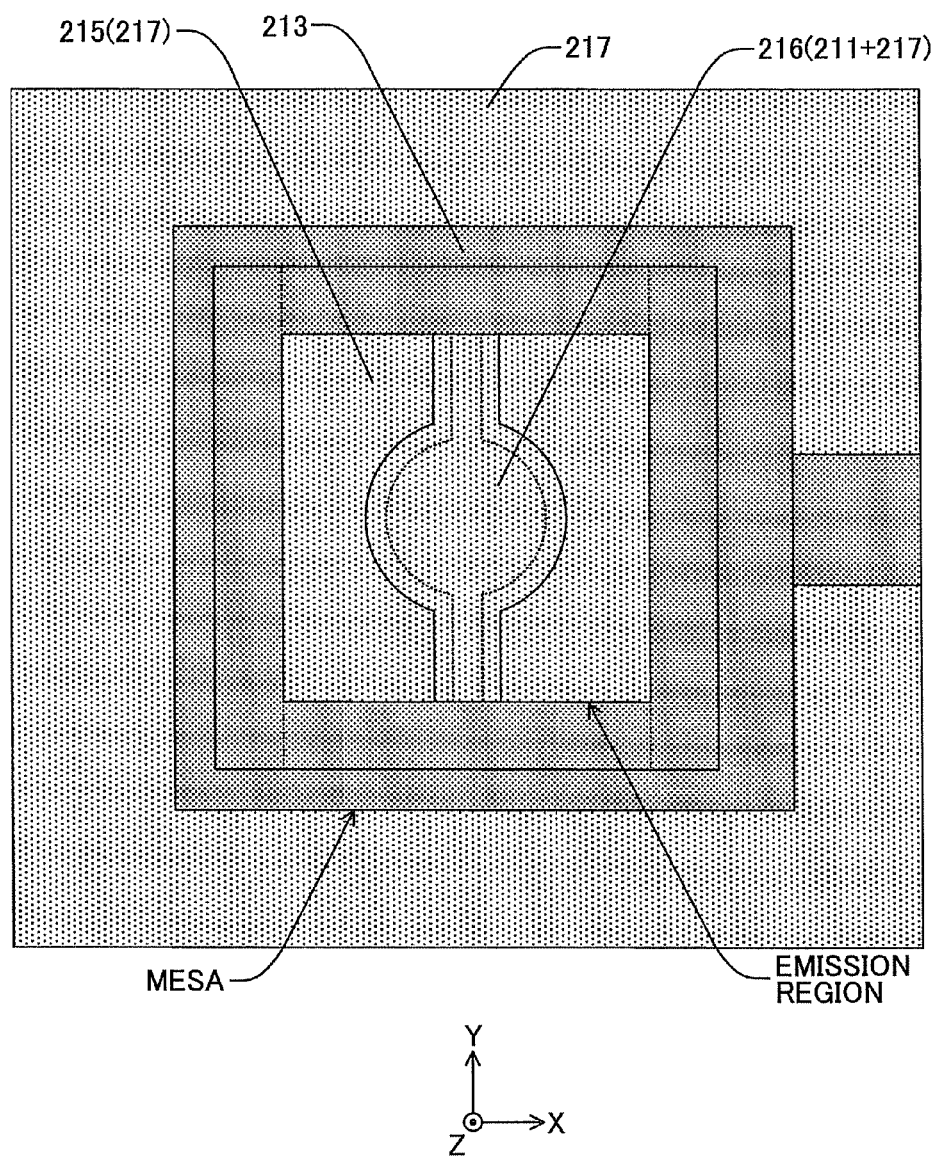
FIG. 35 is a second diagram illustrating the fourth example of the combined shape of a current injection region and the high reflectance region.

In this example, two large rectangular portions of the current injection region facing in the X-axis direction may be removed as illustrated in FIGS. 34 and 35. FIG. 34 illustrates the current injection region and the high reflectance region before the p-side electrode material is deposited. FIG. 35 illustrates the current injection region and the high reflectance region after the p-side electrode 213 is formed. In this example, almost no carriers are injected in the Y-axis direction, a higher polarization mode suppression ratio PMSR may be obtained.

Figure 36:
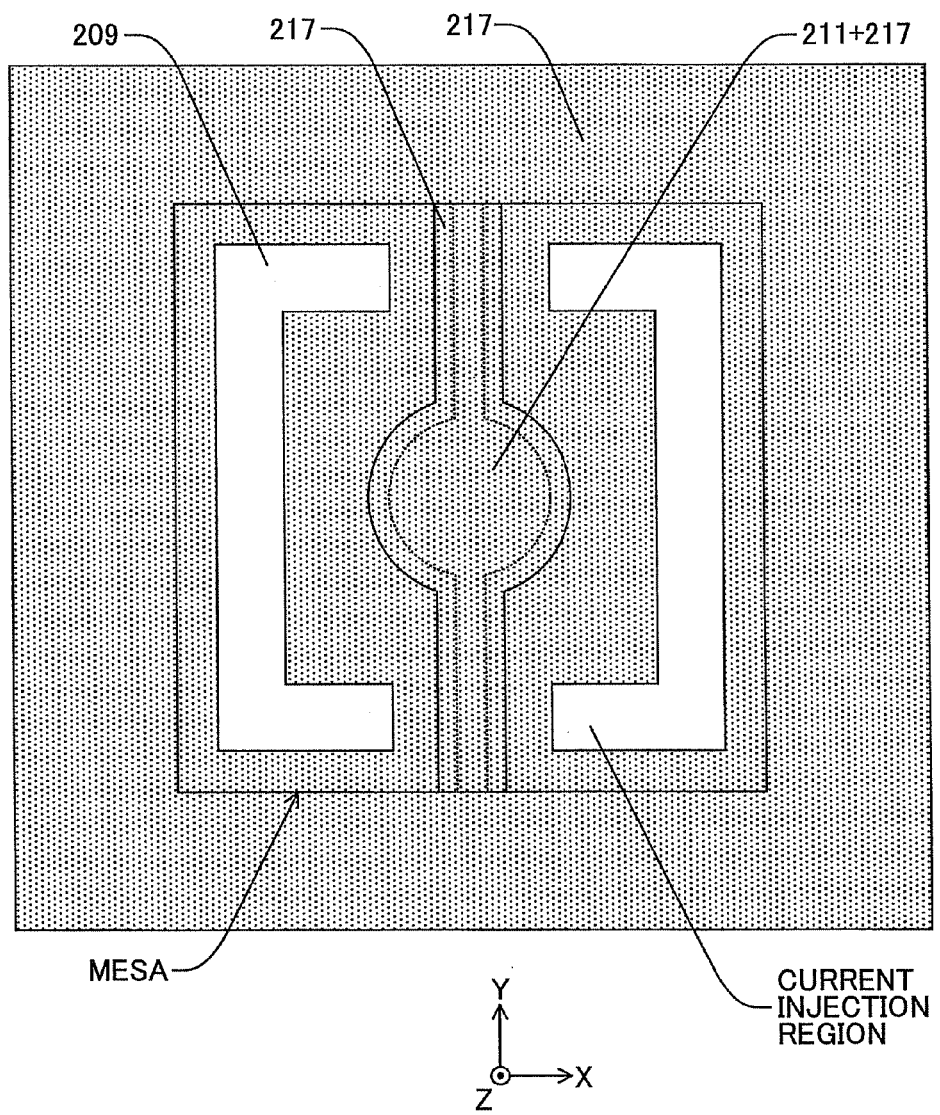
FIG. 36 is a first diagram illustrating a fifth example of the combined shape of the current injection region and the high reflectance region.
Figure 37:
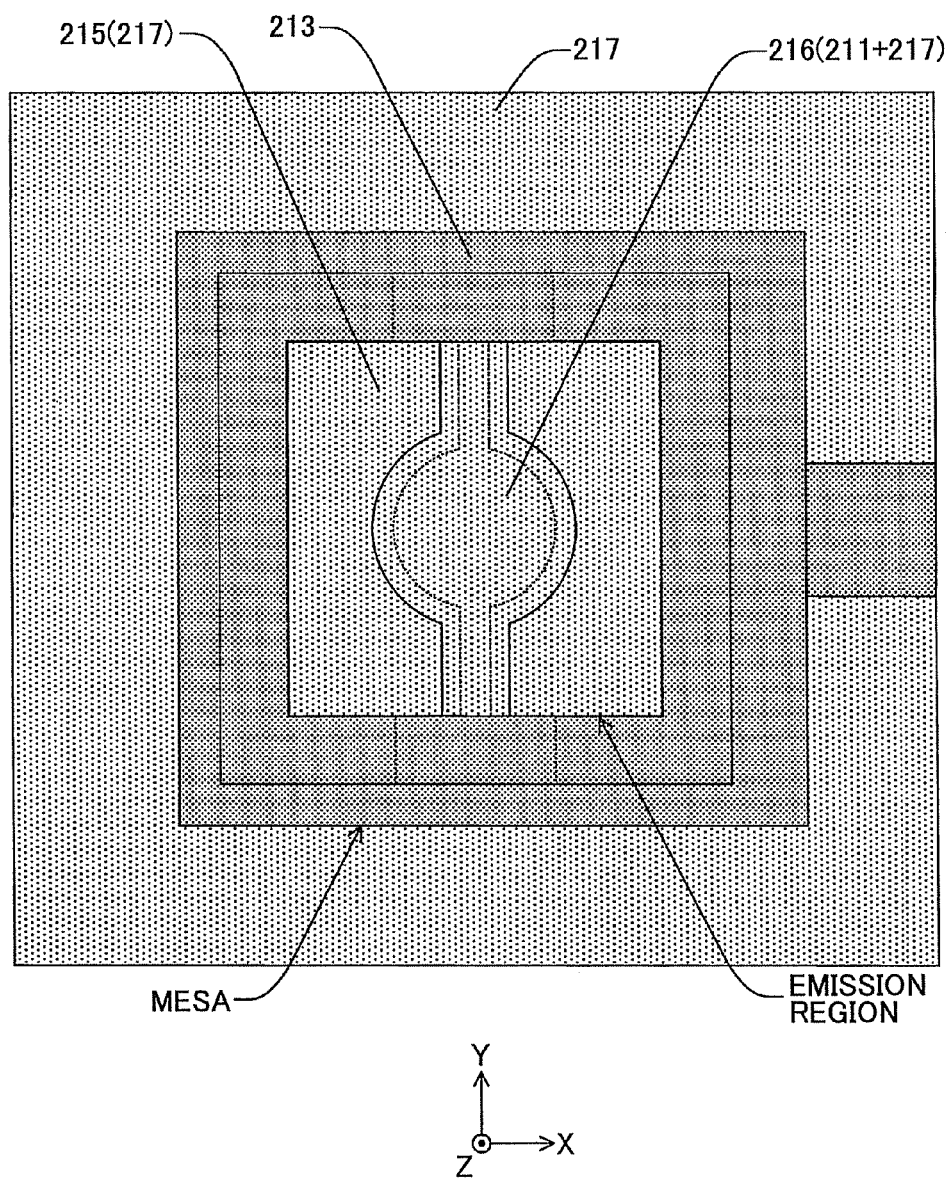
FIG. 37 is a second diagram illustrating the fifth example of the combined shape of a current injection region and the high reflectance region.

Further, as illustrated in FIGS. 36 and 37, the second mode filter 216 (211+217) residing in the middle of the emission region may be extended along the removed rectangular portions as illustrated in FIGS. 36 and 37. FIG. 36 illustrates the current injection region and the high reflectance region before the p-side electrode material is deposited. FIG. 37 illustrates the current injection region and the high reflectance region after the p-side electrode 213 is formed. In this example, since a large polarization control effect is obtained by the second mode filter 216 (211+217), and a higher polarization mode suppression ratio PMSR may be obtained.

Note that the shape of the second mode filter and the shape of the current injection region are not limited to the above described combined examples, and may be any combined shapes and corresponding dimensions insofar as the shapes and dimensions are aimed at controlling the polarization direction by anisotropy in the mode filters and heterogeneous carrier injection.

Subsequently, a surface-emitting laser element according to a third embodiment is mainly described with a difference from the first embodiment, and descriptions of elements identical to or similar to those in the first embodiment are simplified or omitted.

[Surface-Emitting Laser Element 100C According to Third Embodiment]

Figure 38:
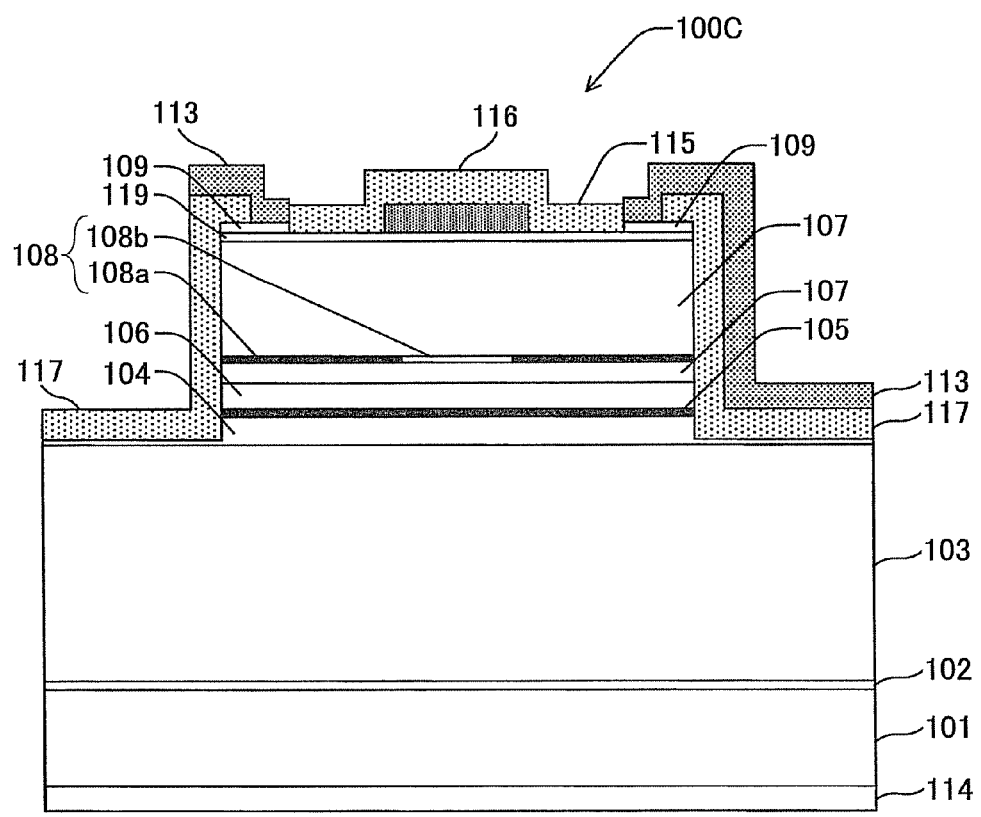
FIG. 38 is a diagram illustrating a surface-emitting laser element 100C.

A surface-emitting laser element 100C has an oscillation wavelength band of 780 nm. As illustrated in FIG. 38, portions of the contact layer 109 beneath the first and second mode filters 115 and 116 are removed in the surface-emitting laser element 100C.

Figure 39:
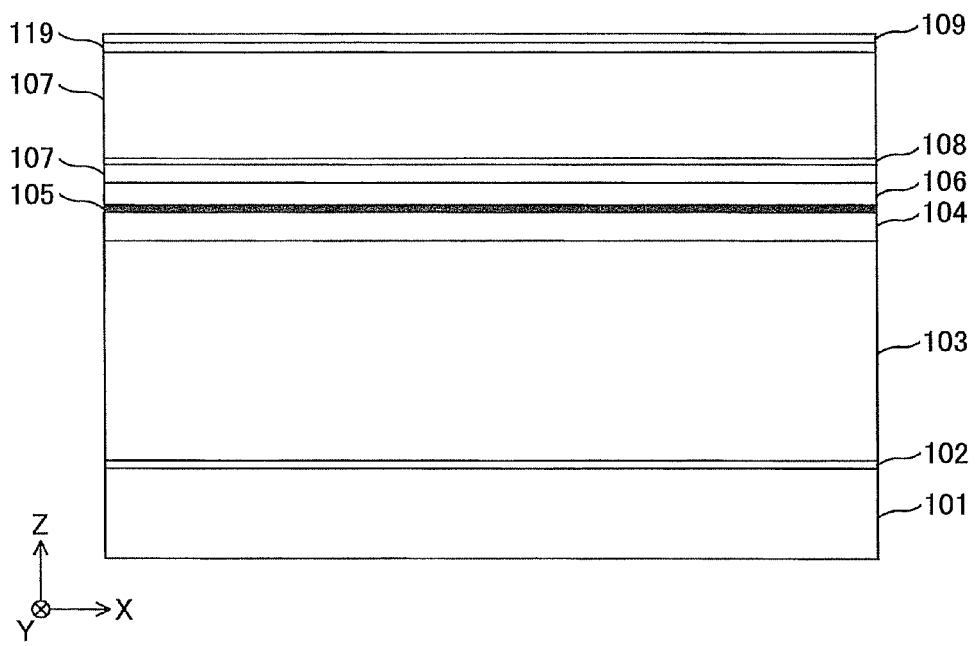
FIG. 39 is a diagram illustrating an example of an etching termination layer.

As illustrated in FIG. 39, an etching termination layer 119 made of p-GaInP having a composition lattice matched to GaAs is provided beneath the contact layer 109 (in −Z direction) when forming a stacked product in this example.

In this example, a thickness of the etching termination layer 119 may be 20 nm, and a thickness of the contact layer 109 may be 25 nm. Doping concentration in the etching termination layer 119 is adjusted to the same level as other semiconductor layers that form the upper semiconductor DBR 107, and doping concentration in the contact layer 109 is set higher that that of the etching termination layer 119. For example, the doping concentration in the etching termination layer 119 may be approximately $1*10^{18}$ cm$^{-3}$, and the doping concentration in the contact layer 109 may be approximately $1*10^{19}$ cm$^{-3}$.

Further, a thickness of a high refractive index layer in an outermost surface of the upper semiconductor DBR 107 including the etching termination layer 119 may be adjusted so as to satisfy Bragg's condition of reflection. That is, the outermost surface of the upper semiconductor DBR 107 including the etching termination layer 119 may be adjusted such that Bragg's condition of reflection is satisfied after the portions of the contact layer 109 are etched.

In the obtained stacked product, the selective oxidation layer is selectively oxidized and the mesa is formed in the same manner as the first embodiment. Then, the contact layer 109 excluding the portions contact conductive with the p-side electrode 113 is removed by photochemical engraving and wet etching.

Figure 40:
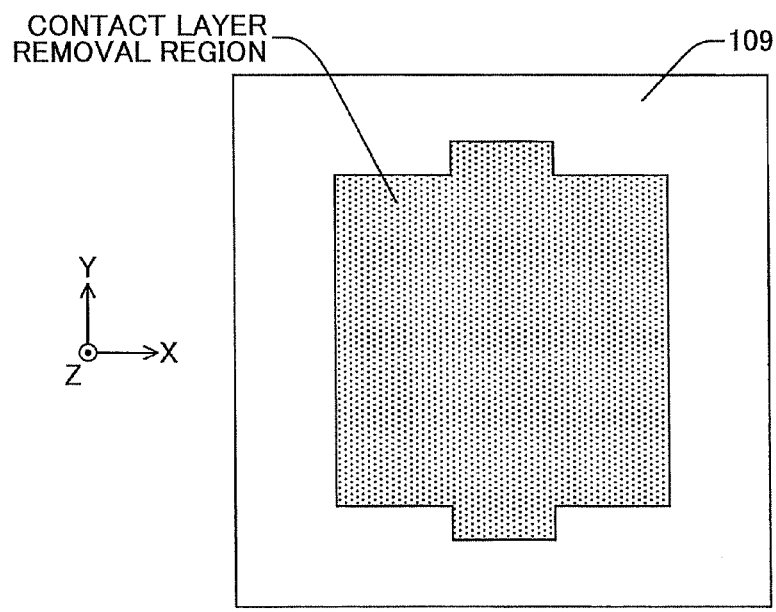
FIG. 40 is a diagram illustrating an example of a shape of a contact layer removal region.

The remaining contact layer 109 (unremoved portions of the contact layer 109 in the contact region, current injection region) includes heterogeneous widths partially having narrower portions in the Y-axis direction as illustrated in FIG. 40.

An (Al)GaAs layer may be selectively etched from GaInP layer using etchant produced by mixing sulfuric acid and a hydrogen peroxide solution.

Thereafter, the first and second mode filters are formed and corresponding electrodes are formed in the similar manner as the embodiment 1.

Figure 41:
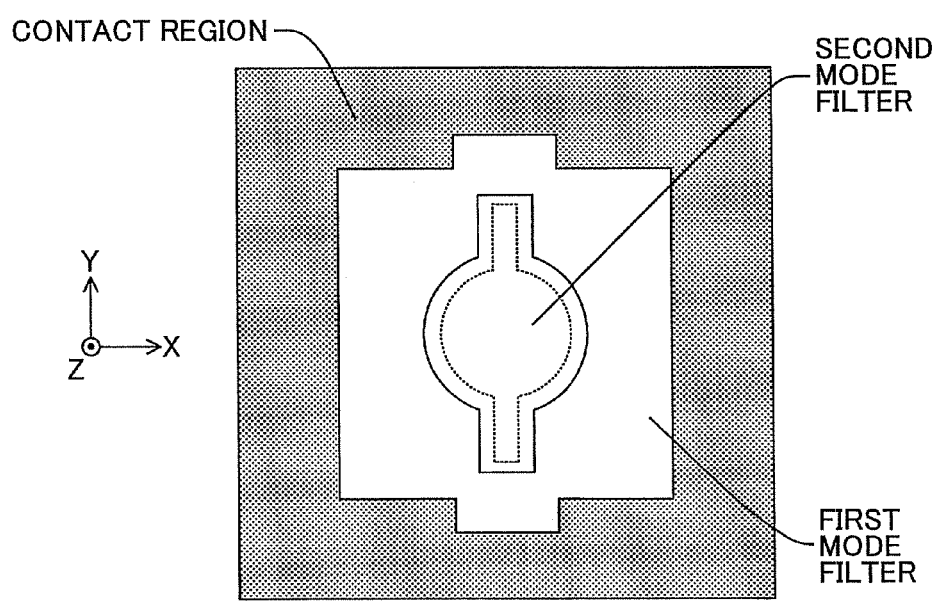
FIG. 41 is a diagram illustrating a relationship between a contact region and first and second mode filters.

FIG. 41 is a diagram illustrating a relationship between the contact region (i.e., current injection region) and the first and second mode filters.

In the surface-emitting laser element 100C according to the third embodiment, a large anisotropic carrier injection may be made in the active layer to improve the polarization mode suppression ratio PMSR.

In general, a contact layer has excellent ohmic conductivity with a p-side electrode, so that the contact layer needs to be doped with a high concentration dopant. With this process, contact resistance between a metallic material and a semiconductor material may be reduced to a level practically providing no interference. However, carriers may spread in the transverse direction due to a decrease in the resistance of the contact layer. This effect may be greater if the resistance of a layer provided beneath the contact layer is high. As a result, carriers may be injected into the upper semiconductor DBR from the portions of the contact layer that are not in contact with the p-side electrode.

Thus, in the surface-emitting laser element 100C according to the third embodiment, the widths of the contact layer 109 are made different in two orthogonal directions (i.e., X-axis and Y-axis directions) so that shape anisotropy is provided in the current injection region, and portions of the contact layer 109 excluding portions corresponding to the current injection region are removed. If the corresponding portions of the contact layer 109 are removed in the above manner, carriers may not spread in the transverse direction. Thus, carriers may not be injected from regions other than the current injection region.

Accordingly, the amounts of carriers to be injected into the active layer may differ in the two directions. As a result, a large anisotropic optical gain may be obtained, thereby significantly improving the polarization mode suppression ratio PMSR in an effective manner.

Figure 42:
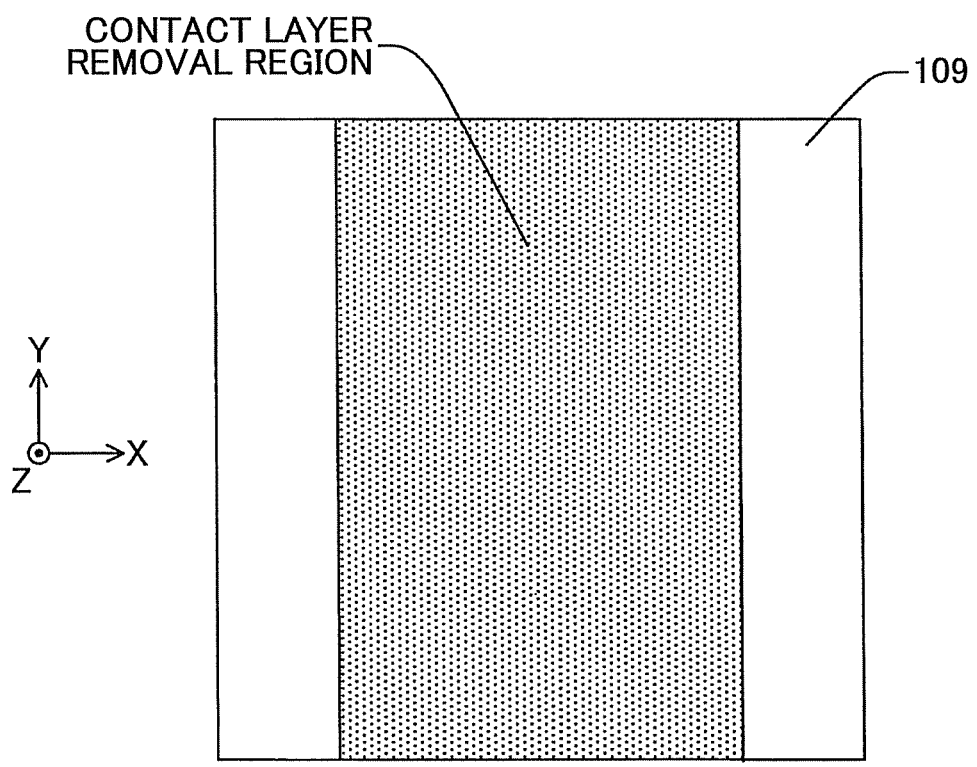
FIG. 42 is a diagram illustrating a modification of the shape of the contact layer removal region.
Figure 43:
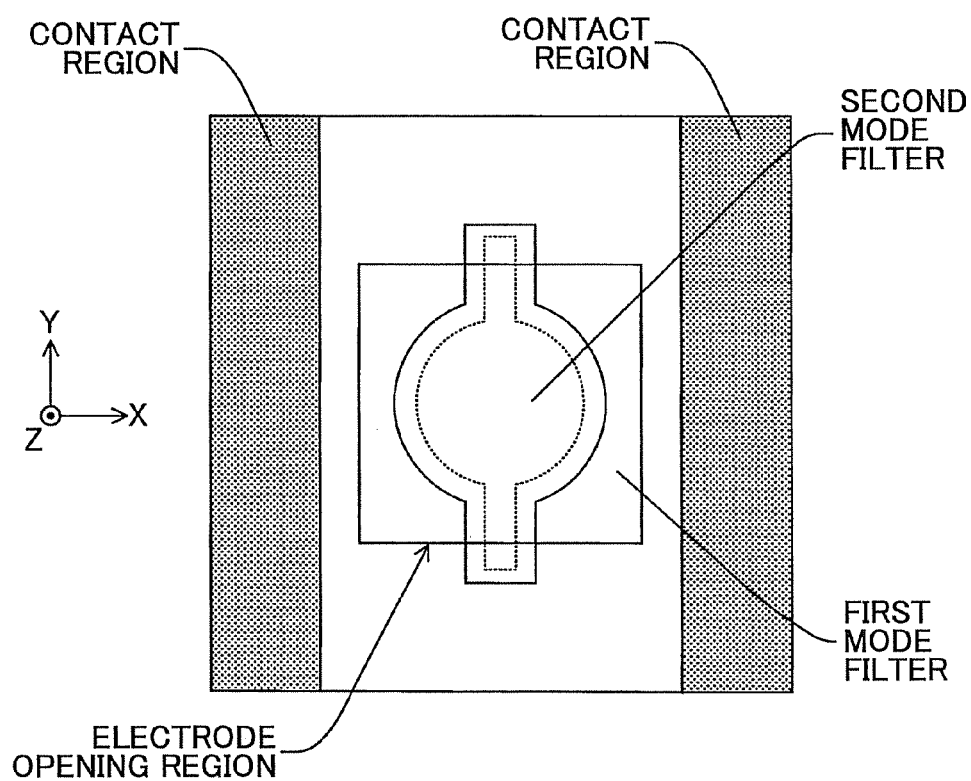
FIG. 43 is a diagram illustrating a relationship between a contact region and first and second mode filters corresponding to FIG. 42.

Note that a shape of a removal region of the contact layer 109 (i.e., contact layer removal region) is not limited to the above described shape. For example, the remaining contact layer 109 (unremoved portions of the contact layer 109 in the contact region, current injection region) may include a removal region in one of the two orthogonal directions as illustrated in FIG. 42. FIG. 43 is a diagram illustrating a relationship between contact regions (i.e., current injection regions) and the first and second mode filters. That is, the contact region (current injection region) may have any shape insofar as the amounts of injecting carriers are made different in the two orthogonal directions.

Figure 23:
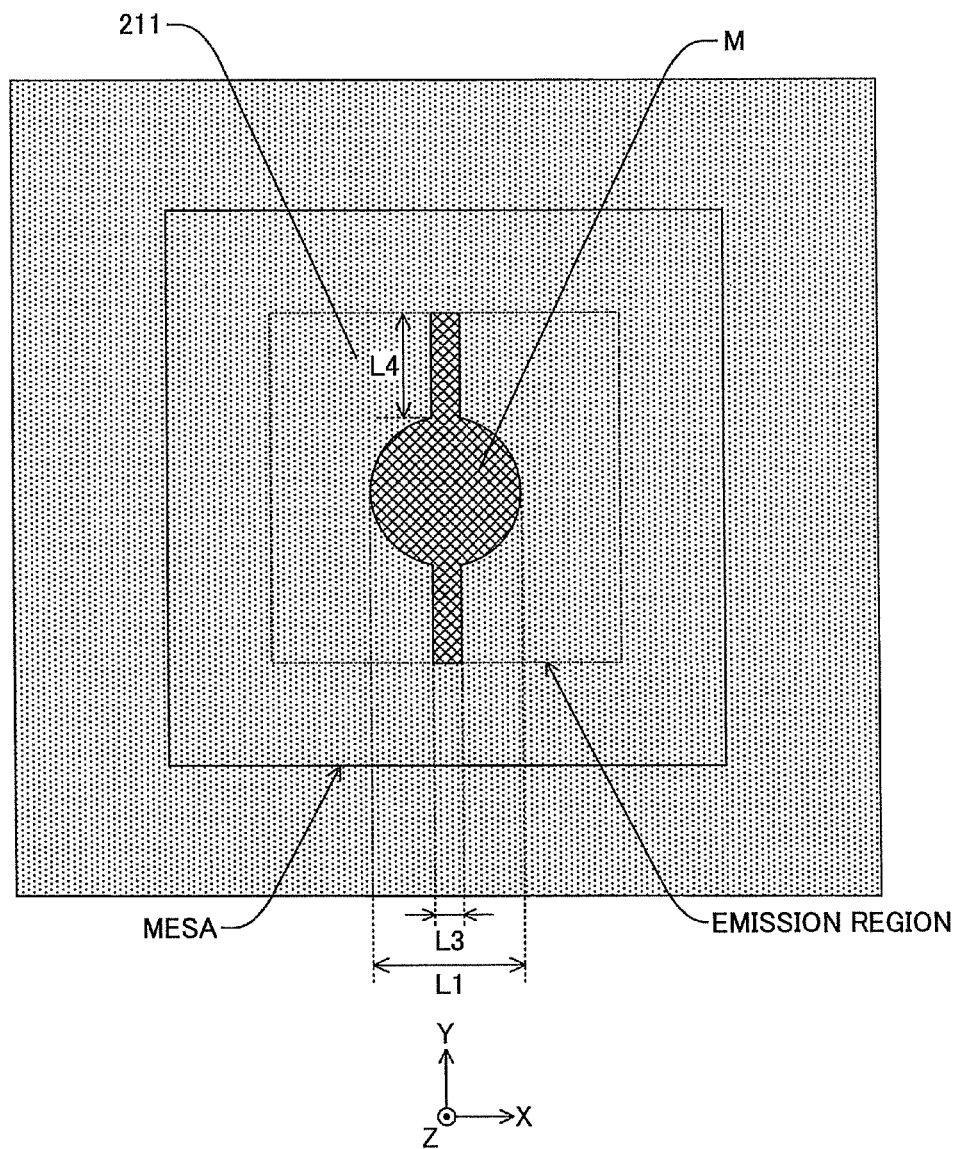
FIG. 23 is a diagram illustrating a first modification of the mask in the high reflectance region.

In the first and second embodiments, the surface-emitting laser elements having different values of L4 are fabricated and the corresponding polarization mode suppression ratios are measured. The results show that the polarization mode suppression ratio is increased with the increase in the value of L4. The highest polarization mode suppression ratio is obtained in the example where the low reflectance region is divided into two regions by the high reflectance region residing in the middle of the regions as illustrated in FIGS. 23 and 24. Note that it is preferable that the two divided low reflectance regions be symmetrical in this example.

As described above, the surface-emitting laser elements 100A, 100B, and 100C according to the first to third embodiments each include the emission region in which the dielectric layer made of SiN and having a refractive index of 1.87 and the optical thickness of $\lambda/4$ is stacked on the dielectric layer made of $SiO_2$ and having a refractive index of 1.85 and the optical thickness of $\lambda/4$ so that the high reflective region 116 (216) is configured to increase the reflectance. In the surface-emitting laser elements 100A, 100B, and 100C according to the first to third embodiments, the high reflectance region 116 (216) is formed in a region including the central portion of the emission region and includes the shape anisotropy in the two orthogonal directions in a plane in parallel with the emission region.

Further, in the surface-emitting laser elements 100A, 100B, and 100C according to the first to third embodiments, the low reflectance region 115 (215) configured to lower the reflectance is formed in the peripheral portion of the emission region. The low reflectance region 115 (215) is formed of the dielectric layer made of SiN and having the refractive index of 1.87. The low reflectance region 115 (215) is formed with the optical thickness of $\lambda/4$ such that the high reflectance region 116 (216) is enclosed by the low reflectance region 115 (215).

With this configuration, the polarization direction is stabilized while carrying out operations in the high power single transverse mode.

The optical scanner device 1010 according to an embodiment includes the light source 14 having one of the surface-emitting laser elements 100A, 100B, and 100C. Accordingly, microscopic round laser spots may be easily and stably formed on the surface of the photoreceptor drum 1030. Thus, the optical scanning may be carried out with high accuracy.

Since the laser printer 1000 according to the embodiment includes the optical scanner device 1010, the laser printer 1000 may be capable of forming images with high quality.

Further, in the above embodiments, the high reflectance region that includes a lower layer made of $SiO_2$ and an upper layer made of SiN stacked on the lower layer is described; however, the high reflectance region is not limited to the described example. For example, the high reflectance region may be formed in any combinations of $SiO_2$ (refractive index: 1.45), AlOx (refractive index: 1.62), SiN (refractive index: 1.87), and TiOx (refractive index: 1.45). Further, since fluoride materials such as MgF and CaF include refractive index increases in this order, these fluoride materials may also be used in forming the high reflectance region in addition to the above materials. That is, various materials may be used in forming the high reflectance region insofar as the lower transparent dielectric layer has the refractive index lower than the upper transparent dielectric layer.

Accordingly, the high reflectance region may includes a lower layer made of $SiO_2$ and an upper layer made of TiOx stacked on the lower layer. In this case, the difference in the refractive index between the lower and upper layers is larger than the refractive index difference obtained in the above embodiments. The greater the difference in the refractive index is, the higher the reflectance in the high reflectance region becomes. Thus, the difference in the reflectance between the high reflectance region and low reflectance region is increased, thereby effectively controlling the laser oscillation in the high-order transverse mode. As a result, higher single mode output power may be obtained.

Further, in the above embodiments, the p-side electrode is formed after the two dielectric layers are formed; however, the formation of the p-side electrode is not limited to the described example.

For example, in a case where an upper layer TiOx is stacked on a lower layer made of $SiO_2$ to form the high reflectance region, the p-side electrode may be formed after the lower layer made of $SiO_2$ is formed, and the upper layer made of TiOx may be formed thereafter. In this manner, the dielectric layer of a high refractive index layer may cover the entire element, and the fabrication of the surface-emitting laser element having an upper layer made of a material difficult to be etched (e.g., TiOx) may be facilitated.

Since etching is not required after the formation of the upper layer, the fabrication of the surface-emitting laser element may be facilitated while reducing variability of the characteristics. Accordingly, cost of the fabrication may be reduced.

Note that if the upper layer is made of TiOx, electric conductivity is obtained by removing a large pad portion formed of a TiOx film with dry etching. Thus, photolithography process or etching process may be facilitated.

Figure 44:
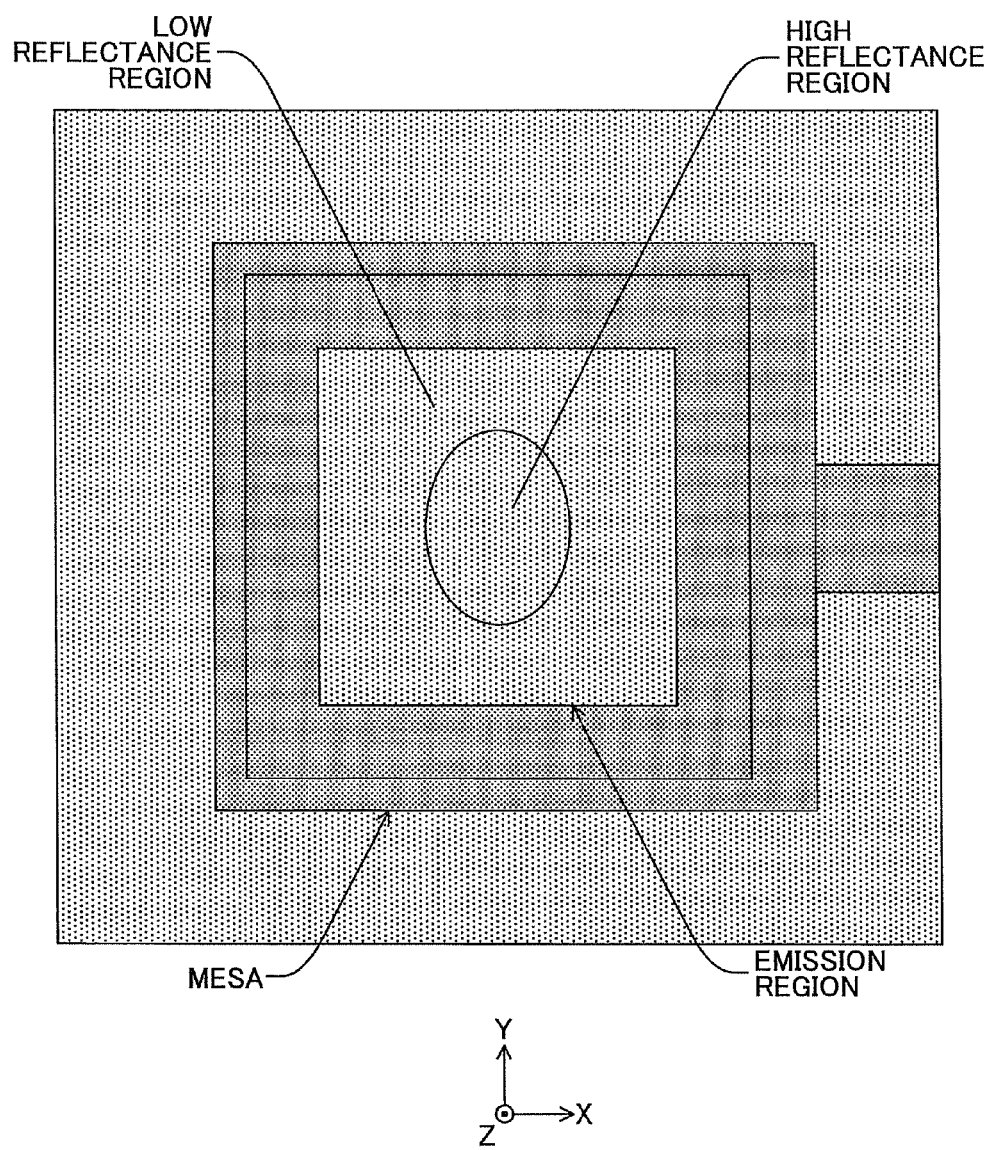
FIG. 44 is a diagram illustrating a first modification of a shape of the high reflectance region.
Figure 45:
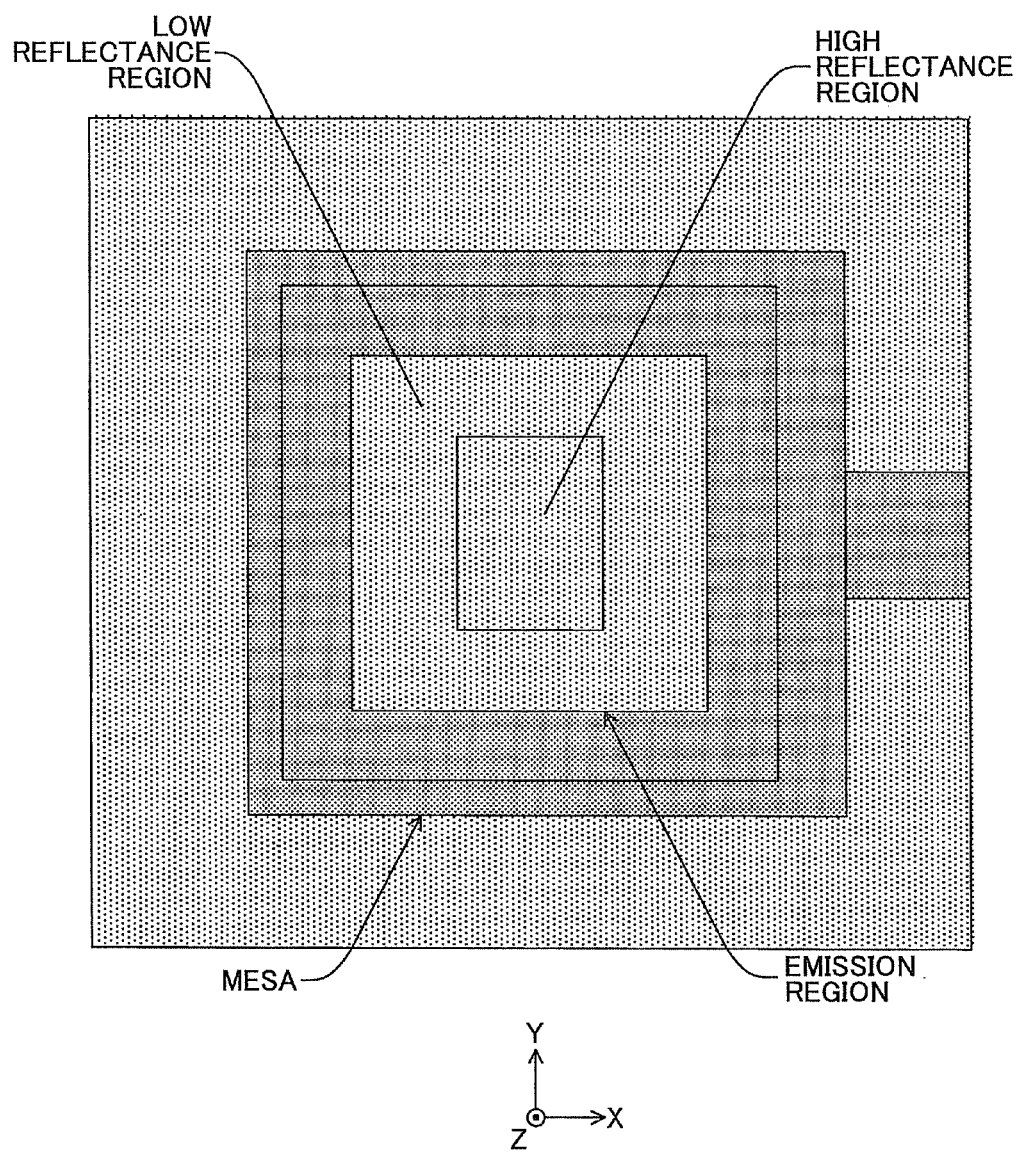
FIG. 45 is a diagram illustrating a second modification of the shape of the high reflectance region.

Note that the shape of the high reflectance region is not limited to the examples described in the embodiments. For example, the shape of the high reflectance region may be an oval shape as illustrated in FIG. 44. Alternatively, the shape of the high reflectance region may be a rectangular shape as illustrated in FIG. 45.

Figure 46A:
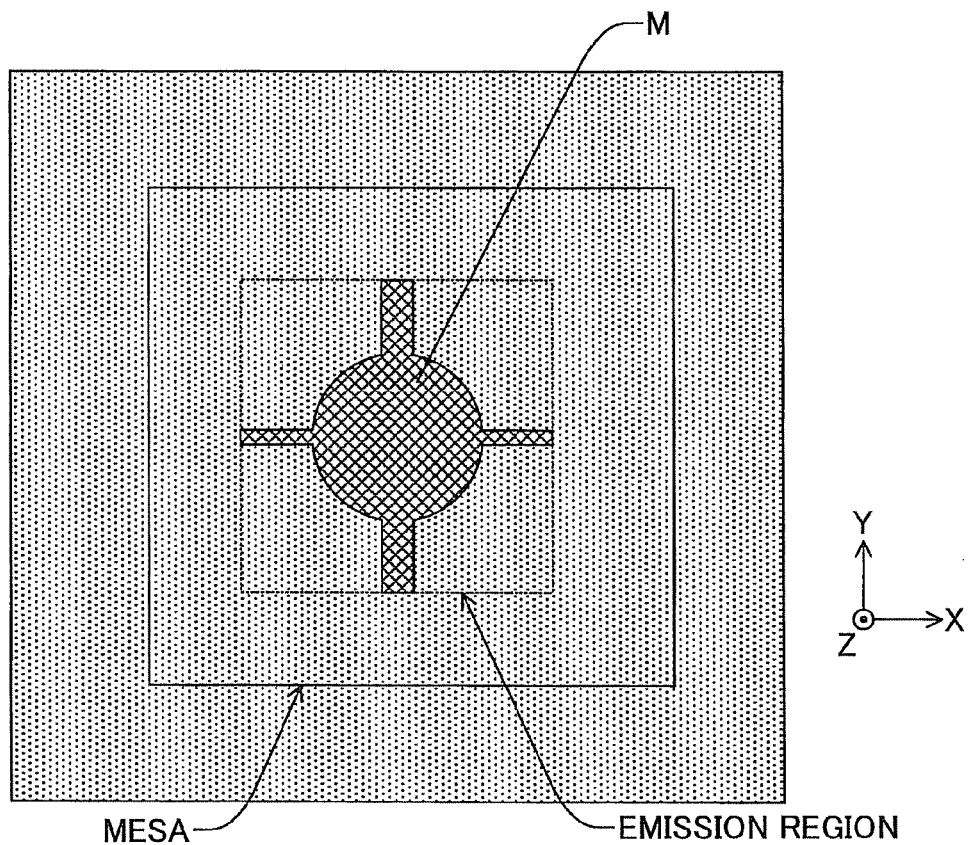
FIGS. 46A and 46B are diagrams illustrating a third modification of the shape of the high reflectance region.
Figure 46B:
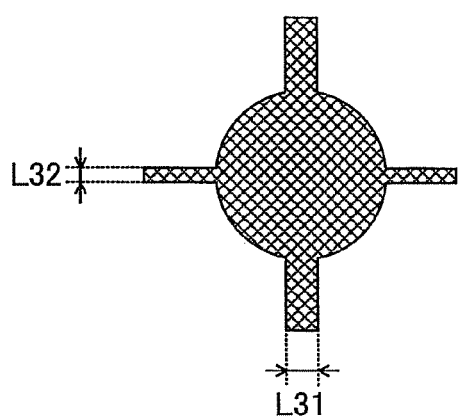

Further, the low reflectance region may be divided into four by the high reflectance region residing in the middle as illustrated in FIG. 46A. In this case, as illustrated in FIG. 46B, the sizes of L31 and L32 satisfy a condition represented by L31>L32. With this configuration, the optical confinement in the transverse direction in the Y-axis direction may be small, and the laser is oscillated by aligning the polarization in the X-axis direction. Note also that the low reflectance region may be divided into a number of regions more than four (plural sub-regions).

Further, in the above embodiment, the optical thickness of the dielectric layers is $\lambda/4$; however, the optical thickness of the dielectric layers is not limited to $\lambda/4$. The optical thickness of the dielectric layers may be any of odd multiples of $\lambda/4$.

Figure 47:
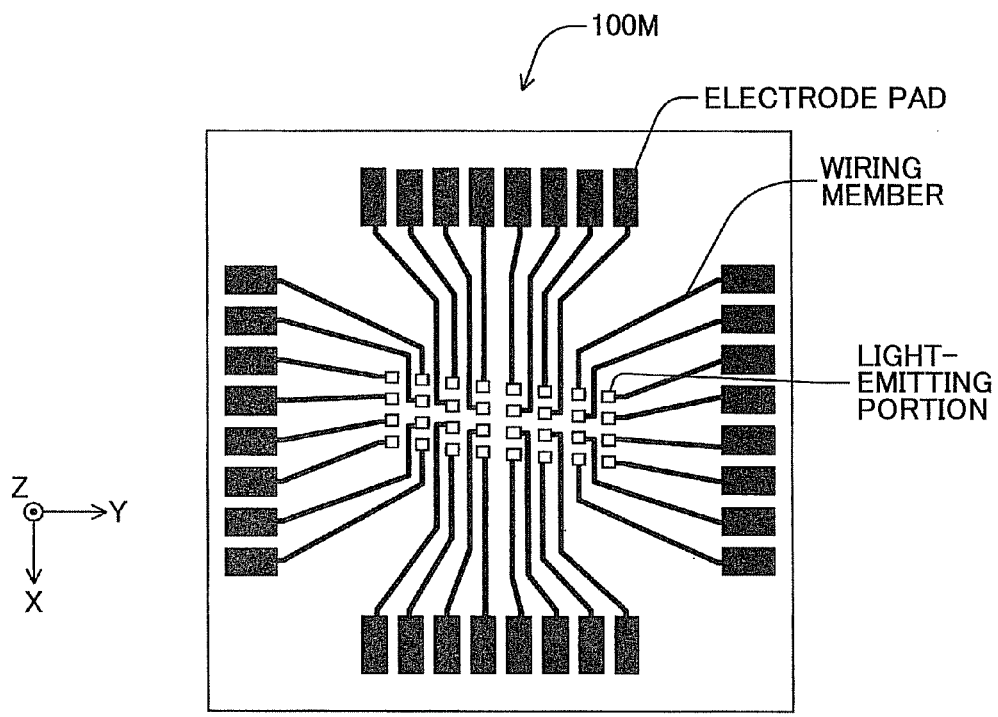
FIG. 47 is a diagram illustrating a surface-emitting laser array.

Further, the light source 14 may include a surface-emitting laser array 100M illustrated in FIG. 47 in place of the surface-emitting laser element 100A, 100B, or 100C according to the above embodiments.

The surface-emitting laser array 100M includes 32 emitting portions two-dimensionally arranged on a same substrate and 32 electrode pads corresponding to the 32 emitting portions. The 32 electrode pads are arranged in the periphery of a collection of the 32 emitting portions. Note that the number of emitting portions is not limited to 32.

Figure 48:
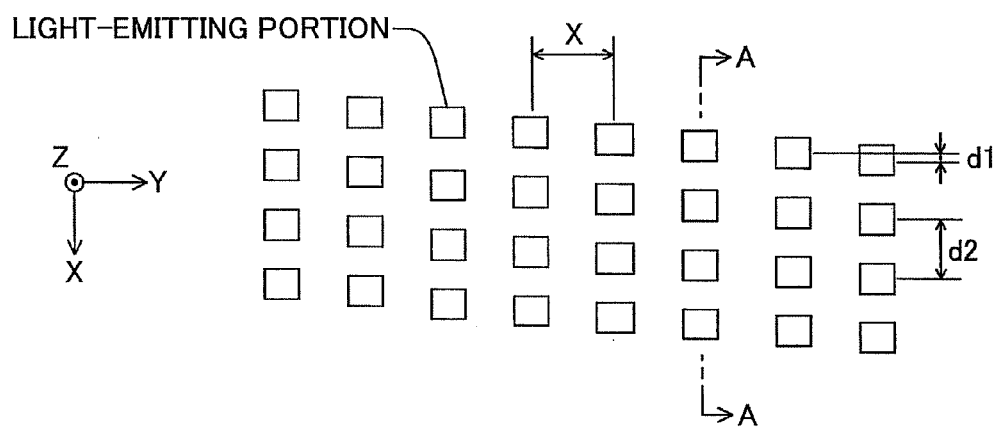
FIG. 48 is a diagram illustrating an array of emitting portions in the surface-emitting laser array.

As illustrated in FIG. 48, 32 emitting portions are arranged at equal intervals (indicated by d1 in FIG. 48) when all the emitting portions are orthogonally projected in a virtual line in the X-axis direction. Note that in this specification, a "light-emitting portion interval" is a center-to-center distance between the two light-emitting portions.

Figure 49:
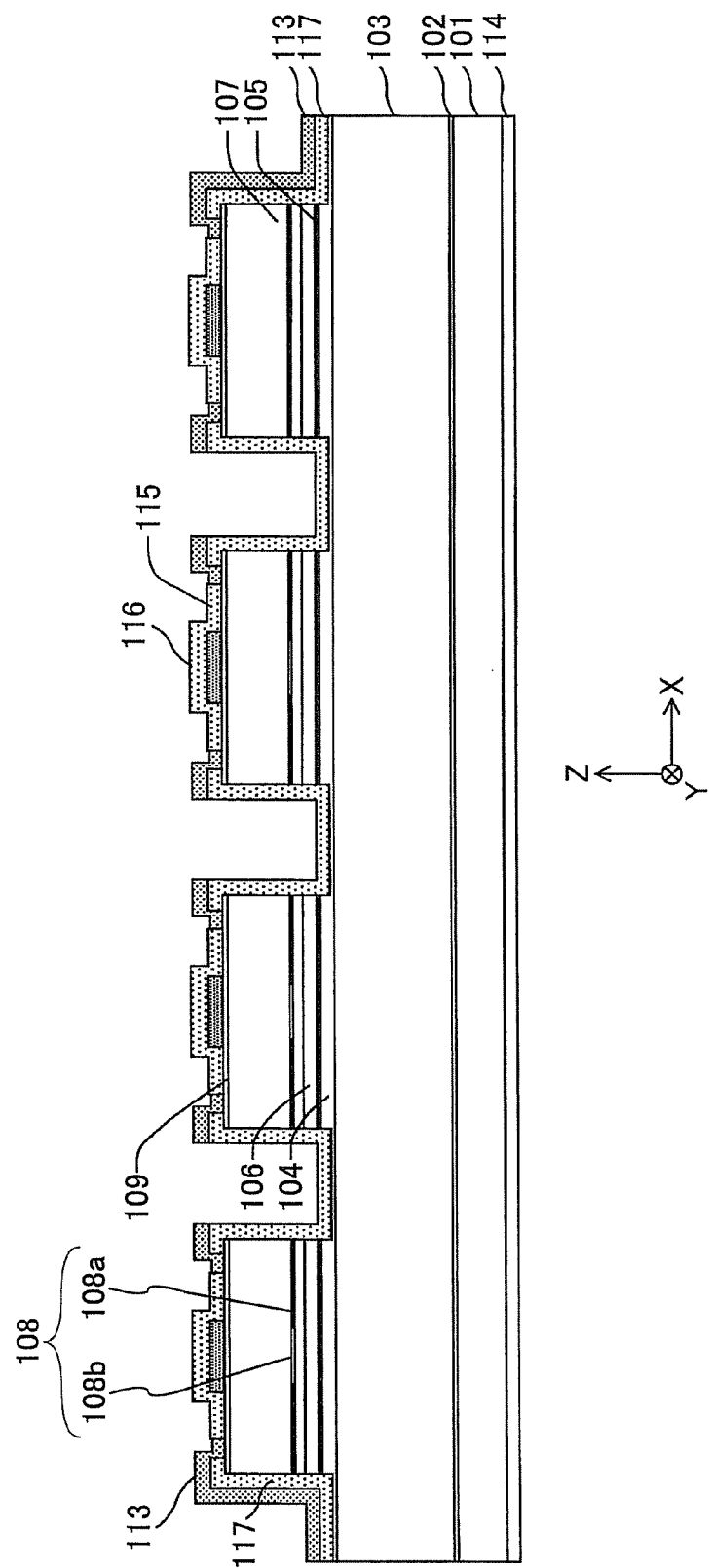
FIG. 49 is a cross-sectional diagram of the surface-emitting laser array illustrated in FIG. 48 cut along a line A-A.

As illustrated in FIG. 49 of an A-A cross-sectional diagram of FIG. 48, each emitting portion includes a structure similar to that of the surface-emitting laser element 100A. In addition, the surface-emitting laser array 100M may be fabricated in the same manner as the fabrication method of the surface-emitting laser element 100A. Thus, plural laser beams in the single basic transverse mode having uniform polarization directions between the light-emitting portions may be stably obtained. Accordingly, 32 densely arranged round minute optical spots may be simultaneously and stably formed on the photoreceptor drum 1030.

Further, in the surface-emitting laser array 100M, since the light-emitting portions are arranged at equal light-emitting portion intervals d1 when all the light-emitting portions are orthogonally projected in a virtual line extended in the sub-scanning direction (X-axis direction), the photoreceptor drum 1030 may be used as the photoreceptor drum having the light-emitting portions arranged at equal light-emitting portion intervals d1 on its surface in the sub-scanning direction by controlling emitting timing of laser beams.

If the above light-emitting portion interval d1 is 2.65 µm, and the magnification of the optical scanner device 1010 is doubled (2×), the optical scanner device 1010 may scan an image with high-density resolution of 4800 dpi (dots/inch). Further, if the number of the light-emitting portions is increased in the corresponding main scanning direction (Y-axis direction), the light-emitting portions are arranged in an array configuration where the light-emitting portion interval d1 is further reduced by narrowing a pitch d2 in the sub-scanning direction, or the magnification of the optical system is reduced, the optical scanner device 1010 may scan an image with even higher-density resolution, thereby printing the image with high quality. Note that the writing (scanning) intervals in the main-scanning direction may be easily controlled by adjusting illuminating timing of the light-emitting portions.

In this case, the laser printer 1000 may print the image without lowering printing speeds despite the fact that writing dot density is increased. Further, the laser printer 1000 may print the image with higher printing speeds when the writing dot density is constant.

Further, the polarization directions of the flux emitted from the light-emitting portions are stably aligned, so that the laser printer 1000 may stably form high quality images.

Further, the light source 14 may include a surface-emitting laser array having the one dimensionally arranged emitting portions similar to the surface-emitting laser elements 100A, 100B, and 100C in place of the surface-emitting laser elements 100A, 100B, and 100C according to the above embodiments.

In the second embodiment, the normal line direction of the main surface of the substrate 201 is slanted at 15 degrees toward the crystal orientation [1 1 1]A direction from the crystal orientation [1 0 0] direction; however, the slant of the normal line direction of the main surface of the substrate 201 is not limited to the above described slant. The normal direction of the main surface of the substrate 100 may be slanted toward one direction of the crystal orientation [1 1 1]A from one direction of the crystal orientation [1 0 0].

In the above embodiments, the oscillation wavelength of the light-emitting portion is 780 nm; however, the oscillation wavelength of the light-emitting portion is not limited to 780 nm. The oscillation wavelength of the light-emitting portion may be changed based on characteristics of the photoreceptor drum.

Further, the surface-emitting laser element may be used for apparatuses or devices other than the image forming apparatus in the above embodiments. In such cases, the oscillation wavelength may be 650 nm, 850 nm, 980 nm, 1.3 µm, or 1.5 µm based on application purposes. In this case, a mixed crystal semiconductor material is used for the active layer formed of the semiconductor material. For example, if the oscillation wavelength is 650 nm, AlGaInP series mixed crystal semiconductor material is used. If the oscillation wavelength is 980 nm, InGaAs series mixed crystal semiconductor material is used. If the oscillation wavelength is 1.3 µm or 1.5 µm, InNAs(Sb) series mixed crystal semiconductor material is used.

Further, the oscillation wavelength is selected based on a material of the reflecting mirror and a configuration of the reflecting mirror. Accordingly, an emission portion having a desired oscillation wavelength may be formed. For example, the emission portion may be formed of a mixed crystal semiconductor material, such as AlGaInP mixed crystal semiconductor material, other than AlGaAs mixed crystal semiconductor material. Note that a preferable combination of the low refractive index layer and the high refractive index layer may be a combination that may be transparent for the oscillation wavelength and may have the greatest difference in the refractive index between the low refractive index layer and the high refractive index layer.

Further, in the above embodiments, the laser printer 1000 is used as the image forming apparatus; however, the image forming apparatus is not limited to the laser printer 1000.

For example, an image forming apparatus may be configured to directly emit a laser beam toward a medium (e.g., paper).

For example, the medium may be a printing plate generally known as a CTP (Computer to Plate). That is, the optical scanner device 1010 is suitable in use for an image forming apparatus for forming a printing plate that directly forms an image on a printing material by carrying out laser abrasion.

Alternatively, the medium may be so-called rewritable paper. The rewritable paper is formed by applying a material described below as a recording layer on a substrate such as paper or a resin film. The recording layer applied on the substrate includes color reversibility controlled based on thermal energy by the application of a laser beam to reversibly display or erase an image recorded on the recording layer of the rewritable paper.

An image may be recorded on the rewritable paper by a transparency-opacity change type rewritable marking medium or a color developing-reducing type rewritable marking medium using leuco dye.

The transparency-opacity change type rewritable medium is formed by dispersing fatty acid particulates in a polymer thin film. In the transparency-opacity change type rewritable medium, when the resin is heated at 110° C. or more, fatty acid in the resin melts to expand the resin. When the expanded resin is cooled, the fatty acid in the expanded resin is supercooled and remains in a liquid state, and the expanded resin becomes solidified. Thereafter, the fatty acid solidifies and contracts to form polycrystal particulates, and voids are formed between the resin and the polycrystal particulates. Light is scattered by the voids in the resin so that white color is perceived with the naked eye. Next, when the resin is heated at a color erasure temperature range of 80 to 110° C., the fatty acid partially melts and the resin is thermally expanded to fill in the voids in the resin. When the resin in this state is cooled, the resin enters a transparent state, to erase the image.

The rewritable marking medium using the leuco dye utilizes reversible coloring/decoloring reactions between colorless leuco dye and a developer having a long chain alkyl group. The rewritable medium is heated by the laser beam, a color is developed by the reaction of the leuco dye and the developer, and the developed color is maintained by rapidly cooling the rewritable medium. When the medium is slowly cooled, phase separation occurs due to autoagglutination of the long-chain alkyl group of the developer. As a result, the leuco dye and the developer are physically separated to decolor the developed color.

Further, the rewritable medium may be a color rewritable paper. The color rewritable paper is formed by plural photochromic compounds provided on a substrate such as paper or a resin film. The plural photochromic compounds include a photochromic compound that develops cyan (C) color by the application of ultraviolet rays and erases the color by the application of red (R) visible light, a photochromic compound that develops magenta (M) color by the application of ultraviolet rays and erases the color by the application of green (G) visible light, and a photochromic compound that develops yellow (Y) color by the application of ultraviolet rays and erases the color by the application of blue (B) visible light.

That is, the color rewritable paper is once blackened by the application of the ultraviolet rays, and color densities of the above photochromic compounds that develop respective colors of the Y, M and C are controlled based on duration and intensity of the RGB visible light to express a full color. The developed three colors may become blank by applying strong RGB visible lights to decolor the corresponding three photochromic compounds.

Such reversibility of colors by optical energy control may be achieved by an image forming apparatus having an optical scanner device similar to the optical scanner device used in the above embodiments.

Further, an image forming apparatus may be configured to include a silver film as an image carrying member. In this case, a latent image is formed on the silver film by optical scanning, and the latent image is visualized by a process similar to a developing process of an ordinary silver halide photography process. Subsequently, the visualized image is transferred onto photographic printing paper by a printing process similar to that carried out in the ordinary silver halide photography process. Such an image forming apparatus may be implemented as an optical plate-making apparatus or an optical plotting apparatus plotting CT scanned images.

Figure 50:
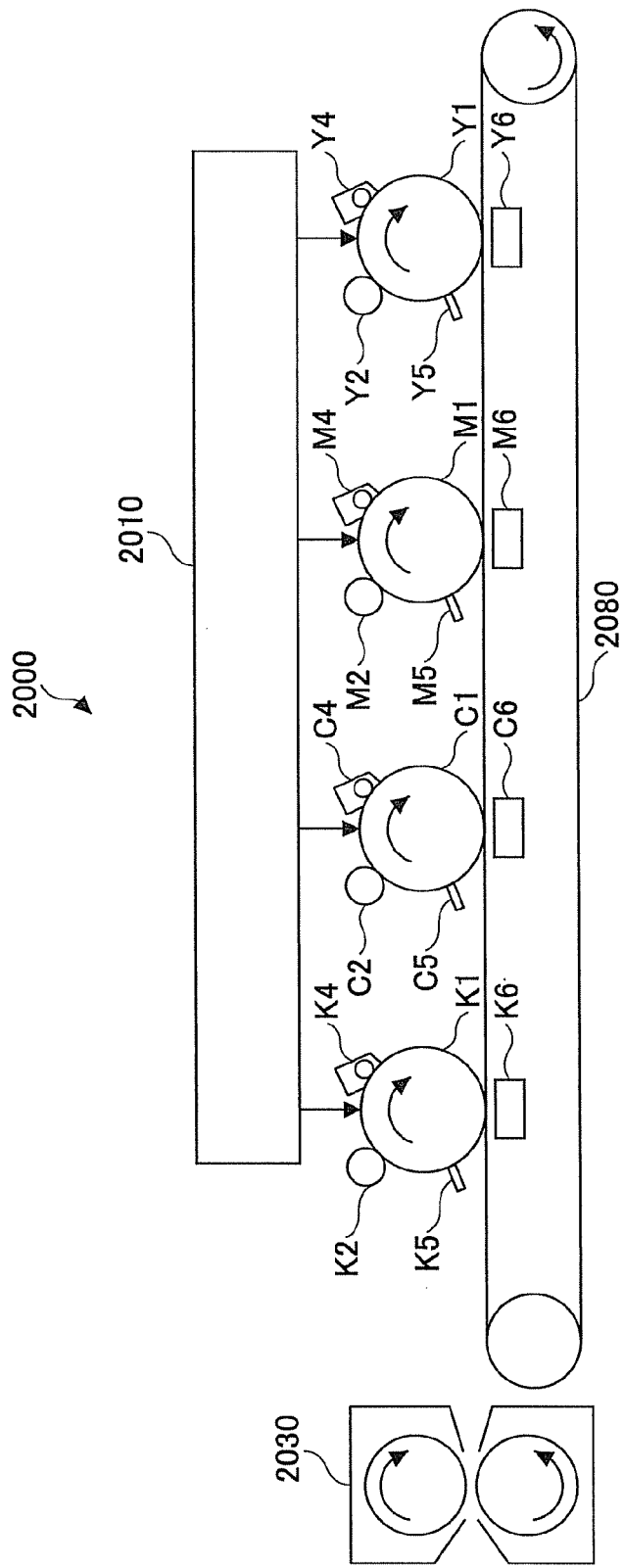
FIG. 50 is a schematic diagram illustrating a color printer.

In addition, the image forming apparatus described above may be a color printer 2000 having plural photoreceptor drums as illustrated in FIG. 50.

The color printer 2000 is a tandem type multi-color printer that forms a full-color image by superposing four colors (black, cyan, magenta, and yellow). The color printer 2000 includes a black set of "a photoreceptor drum K1, a charging device K2, a developing device K4, a cleaning unit K5, and a transfer device K6"; a cyan set of "a photoreceptor drum C1, a charging device C2, a developing device C4, a cleaning unit C5, and a transfer device C6"; a magenta set of "a photoreceptor drum M1, a charging device M2, a developing device M4, a cleaning unit M5, and a transfer device M6"; and a yellow set of "a photoreceptor drum Y1, a charging device Y2, a developing device Y4, a cleaning unit Y5, and a transfer device Y6"; an optical scanner device 2010; a transfer belt 2080; and a fixing unit 2030.

As illustrated in FIG. 50, the photoreceptor drums K1, C1, M1, and Y1 are rotated as indicated by respective arrows, and the charging devices K2, C2, M2, and Y2, the developing devices K4, C4, M4, and Y4, the cleaning devices K5, C5, M5, and Y5, and the transfer devices K6, C6, M6, and Y6 are arranged in the peripheries of the respective photoreceptor drums K1, C1, M1, and Y1 along respective rotational directions. The charging devices K2, C2, M2, and Y2 are configured to uniformly charge respective surfaces of the photoreceptor drums K1, C1, M1, and Y1. The respective surfaces of the photoreceptor drums K1, C1, M1, and Y1 are charged by the charging devices K2, C2, M2, and Y2, and the charged surfaces of the photoreceptor drums K1, C1, M1, and Y1 are irradiated with light emitted from the optical scanner device 2010, thereby respective latent images are formed on the photoreceptor drums K1, C1, M1, and Y1. Subsequently, toner images of respective colors are formed on the photoreceptor drums K1, C1, M1, and Y1 by the developing devices K4, C4, M4, and Y4. Thereafter, the toner images of respective colors on the photoreceptor drums K1, C1, M1, and Y1 are transferred by the transfer devices K6, C6, M6, and Y6 onto recording paper on the transfer belt 2080, and a full color image is finally fixed on the recording paper by the fixing unit 2030.

The optical scanner device 2010 includes a light source for each color. The light source for each color may include any surface-emitting laser element similar to the surface-emitting laser element 100A or 100B, or any surface-emitting laser array similar to the surface-emitting laser array 100M. With this configuration, the optical scanner device 2010 may exhibit effects similar to those obtained by the optical scanner device 1010. Further, since the color printer 2000 includes the optical scanner device 2010, the color printer 2000 may exhibit effects similar to those obtained by the laser printer 1000.

Note that in the color printer 2000, color misalignment may occur due to a fabrication error or locating error of components. However, if the optical scanner device 2010 includes the light sources for respective colors each having the surface-emitting laser array similar to the surface-emitting laser array 100M, the color misalignment may be controlled by selecting appropriate light-emitting portions to emit laser beams.

In one embodiment, there is provided a surface-emitting laser element that includes an emission region configured to emit a laser beam; and a high reflectance region including a first dielectric film having a first refractive index and a second dielectric film having a second refractive index differing from the first refractive index, the first dielectric film and the second dielectric film being stacked within the emission region to provide high reflectance. In the surface-emitting laser element, the high reflectance region is formed in a region including a central portion of the emission region and is configured to include shape anisotropy in two orthogonal directions in a plane in parallel with the emission region.

With this configuration, the polarization direction may be stabilized while carrying out operation in the high power single transverse mode.

In another embodiment, there is provided a surface-emitting laser array that includes a plurality of surface-emitting laser elements integrated therein.

With this configuration, since the surface-emitting laser array includes the integrated surface-emitting laser elements, the polarization direction may be stabilized while carrying out operation in the high power single transverse mode.

In another embodiment, there is provided an optical scanner device optically scanning a scanning surface with light. The optical scanner device includes a light source including a surface-emitting laser element; a deflector configured to deflect the light emitted from the light source; and a scanning optical system configured to converge the light deflected by the deflector onto the scanning surface.

With this configuration, since the optical scanner device includes the light source having the surface-emitting laser elements, optical scanning may be carried out with high accuracy.

In another embodiment, there is provided an optical scanner device optically scanning a scanning surface with light. The optical scanner device includes a light source including a surface-emitting laser array; a deflector configured to deflect the light emitted from the light source; and a scanning optical system configured to converge the light deflected by the deflector onto the scanning surface.

With this configuration, since the optical scanner device includes the light source having the surface-emitting laser arrays, optical scanning may be carried out with high accuracy.

In another embodiment, there is provided an image forming apparatus that includes at least one image carrying member; and an optical scanner device configured to scan light modulated based on image information on the image carrying member.

With this configuration, since the image forming apparatus includes the above optical scanner device, an image may be formed with high image quality.

As described above, the surface-emitting laser element and the surface-emitting laser array according to the above embodiments are suitable for stabilizing a polarization direction while operating in a high power single transverse mode. Further, the optical scanner device according to the embodiment is suitable for carrying out accurate optical scanning. Moreover, the image forming apparatus according to the embodiment is suitable for forming a high quality image.

The descriptions of exemplary embodiments for implementing the invention have been provided heretofore. The present invention is not limited to these embodiments, but various variations and modifications may be made without departing from the scope of the present invention.

The present application is based on Japanese Priority Application No. 2010-002541 filed on Jan. 8, 2010, and Japanese Priority Application No. 2010-129598 filed on Jun. 7, 2010, with the Japanese Patent Office, the entire contents of which are hereby incorporated by reference.

What is claimed is:

1. A surface-emitting laser element comprising:
an emission region configured to emit a laser beam to an outside of the surface-emitting laser element, the emission region having a shape which, in its entirety, corresponds to an inside of a p-side electrode; and
a high reflectance region including a first dielectric film having a first refractive index and a second dielectric film having a second refractive index differing from the first refractive index, the first dielectric film and the second dielectric film being stacked within the emission region to provide a high reflectance, wherein
the high reflectance region is formed in a region including a central portion of the emission region and is configured to include shape anisotropy in two orthogonal directions in a plane in parallel with the emission region, and
the dimensions of the emission region are greater than those of the high reflectance region.

2. The surface-emitting laser element as claimed in claim 1, wherein the first dielectric film having the first refractive index and the second dielectric film having the second refractive index differing from the first refractive index each have an optical thickness of an odd multiple of $\lambda/4$, where $\lambda$ is an oscillation wavelength.

3. The surface-emitting laser element as claimed in claim 2, wherein the first refractive index is higher than the second refractive index, and the first dielectric film having the first refractive index is stacked on the second dielectric film having the second refractive index in the high reflectance region.

4. The surface-emitting laser element as claimed in claim 1, further comprising:
at least one low reflectance region within the emission region,
wherein a reflectance of the at least one low reflectance region is lowered by forming the second dielectric film therein.

5. The surface-emitting laser element as claimed in claim 4, wherein the at least one low reflectance region is formed to enclose the high reflectance region.

6. The surface-emitting laser element as claimed in claim 4, wherein in a case where the at least one low reflectance region includes a first low reflectance region and a second low reflectance region, the first and second low reflectance regions are adjacently arranged and a portion of the high reflectance region resides between the first and second low reflectance regions.

7. The surface-emitting laser element as claimed in claim 6, wherein the high reflectance region is formed such that the high reflectance region is sandwiched between the first and second low reflectance regions.

8. The surface-emitting laser element as claimed in claim 4, wherein an optical thickness of the second dielectric film formed in the low reflectance region is an odd multiple of $\lambda/4$, where $\lambda$ is an oscillation wavelength.

9. The surface-emitting laser element as claimed in claim 1, further comprising:
an electrode configured to be at least partially brought into contact with a contact layer to form a current injection region, the current injection region being arranged to enclose the emission region and to be in contact, at least partially, to the contact layer,
wherein the current injection region in contact with the contact layer includes different widths in the two orthogonal directions in the plane in parallel with the emission region.

10. The surface-emitting laser element as claimed in claim 1, further comprising:
an electrode configured to be at least partially brought into contact with a contact layer to form a current injection region, the current injection region being arranged to enclose the emission region and to be in contact, at least partially, to the contact layer,
wherein the current injection region in contact with the contact layer includes a removal region in one of two orthogonal directions in the plane in parallel with the emission region.

11. The surface-emitting laser element as claimed in claim 7, further comprising:
an electrode configured to be at least partially brought into contact with a contact layer to form a current injection region, the current injection region being arranged to enclose the emission region and to be in contact, at least partially, to the contact layer,
wherein the current injection region in contact with the contact layer includes a removal region in one of the two orthogonal directions in the plane in parallel with the emission region, and
the one of two orthogonal directions in which the removal region is formed corresponds to a direction in which the high reflectance region divides the at least one low reflectance region into the first and second low reflectance regions.

12. The surface-emitting laser element as claimed in claim 9, wherein the contact layer formed in a region excluding the current injection region is removed.

13. The surface-emitting laser element as claimed in claim 1, wherein an entire surface of the emission region is coated with a dielectric film so that a semiconductor is not exposed in the emission region.

14. A surface-emitting laser array comprising a plurality of the surface-emitting laser elements as claimed in claim 1 integrated therein.

15. An optical scanner device optically scanning a scanning surface with light, the optical scanner device comprising:
 a light source including the surface-emitting laser element as claimed in claim 1;
 a deflector configured to deflect the light emitted from the light source; and
 a scanning optical system configured to converge the light deflected by the deflector onto the scanning surface.

16. An optical scanner device optically scanning a scanning surface with light, the optical scanner device comprising:
 a light source including the surface-emitting laser array as claimed in claim 14;
 a deflector configured to deflect the light emitted from the light source; and
 a scanning optical system configured to converge the light deflected by the deflector onto the scanning surface.

17. An image forming apparatus comprising:
 at least one image carrying member; and
 the optical scanner device as claimed in claim 15 configured to scan light modulated based on image information on the image carrying member.

18. The image forming apparatus as claimed in claim 17, wherein the image information is multicolored image information.

* * * * *